US012751170B2

(12) United States Patent
Kim et al.

(10) Patent No.: US 12,751,170 B2
(45) Date of Patent: Sep. 29, 2026

(54) DISPLAY DEVICE WITH ACTIVE LAYER OPENING PARTS AND METHOD OF MANUFACTURING THE SAME

(71) Applicant: Samsung Display Co., LTD., Yongin-si (KR)

(72) Inventors: Hyun Kim, Yongin-si (KR); Ye Eun Kang, Yongin-si (KR); Dong Hyun Won, Yongin-si (KR); Kwang Soo Lee, Yongin-si (KR); Seung Ha Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 669 days.

(21) Appl. No.: 18/118,886

(22) Filed: Mar. 8, 2023

(65) Prior Publication Data

US 2023/0413632 A1 Dec. 21, 2023

(30) Foreign Application Priority Data

Jun. 16, 2022 (KR) ........................ 10-2022-0073587

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ....................... H10K 59/1315; H10K 59/1201
USPC .................... 257/40, 59, 72, 88, 91, 99, 100
See application file for complete search history.

(56) References Cited

U.S. PATENT DOCUMENTS

| | | | | |
|---|---|---|---|---|
| 2011/0042674 | A1* | 2/2011 | Saito | H10D 86/0231 257/E21.414 |
| 2019/0164999 | A1* | 5/2019 | Choi | H10D 86/60 |
| 2022/0045180 | A1* | 2/2022 | Xiao | H10D 30/6729 |
| 2022/0069260 | A1* | 3/2022 | Han | H10K 59/8792 |
| 2023/0123185 | A1 | 4/2023 | Kim et al. | |
| 2023/0343837 | A1* | 10/2023 | Chen | H10D 30/6755 |

FOREIGN PATENT DOCUMENTS

| | | |
|---|---|---|
| CN | 115995479 | 4/2023 |
| KR | 10-2023-0056090 | 4/2023 |

* cited by examiner

*Primary Examiner* — Eric W Jones
(74) *Attorney, Agent, or Firm* — Innovation Counsel LLP

(57) ABSTRACT

A display device includes a first conducive layer including a first and second wiring, a semiconductor layer on the first conductive layer and including a first to third semiconductor part, a gate insulating layer on the semiconductor layer, and a second conductive layer on the gate insulating layer and including a gate electrode overlapping the first semiconductor part, a first connecting electrode overlapping the second semiconductor part, and a second connecting electrode overlapping the third semiconductor part. The first and second connecting electrodes are directly connected to the second and third semiconductor parts, respectively. The second and third semiconductor parts include semiconductor openings. The first connecting electrode includes a (1-1)-th and (1-2)-th connecting electrodes. A width of the (1-2)-th connecting electrodes is less than a width of the (1-1)-th connecting electrode, and the (1-2)-th connecting electrodes protrude from the (1-1)-th connecting electrode toward the semiconductor openings.

25 Claims, 54 Drawing Sheets

ACNE_1: ACNE1_1, ACNE2_1
ACT: ACT1, ACT2, ACT3

ACNE: ACNE1, ACNE2
ACT: ACT1, ACT2, ACT3

DISPLAY DEVICE WITH ACTIVE LAYER OPENING PARTS AND METHOD OF MANUFACTURING THE SAME

CROSS-REFERENCE TO RELATED APPLICATION(S)

This application claims priority to and benefits of Korean Patent Application No. 10-2022-0073587 under 35 U.S.C. 119, filed on Jun. 16, 2022, in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

Display devices have increasingly become of importance with the development of multimedia, and various types of display devices, such as a liquid crystal display (LCD) device, an organic light-emitting diode (OLED) display device, or the like, have been used.

A self-luminous display device, which is a type of display device, includes self-luminous elements such as OLEDs. Each of the self-luminous elements may include two electrodes facing each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device does not need a light source such as a backlight unit and can thus be implemented as a low-power consumption, thin, light-weight display device with high-quality characteristics such as wide viewing angles, high luminance and contrast, and a fast response speed, drawing attention as a next-generation display device.

SUMMARY

Aspects of the disclosure provide a display device capable of reducing the number of conductive layers and preventing any increases in resistance when different conductive layers are in contact with one another.

Aspects of the disclosure also provide a method of manufacturing a display device, which can reduce the number of masks and the number of conductive layers and can prevent any increases in resistance when different conductive layers are in contact with one another.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, a display device may include a first conducive layer disposed on a base part and including a first wiring and a second wiring spaced apart from each other, a semiconductor layer disposed on the first conductive layer and including a first semiconductor part, a second semiconductor part disposed on a first side of the first semiconductor part in a first direction, and a third semiconductor part disposed on a second side of the first semiconductor part in the first direction, a gate insulating layer disposed on the semiconductor layer, and a second conductive layer disposed on the gate insulating layer and including a gate electrode overlapping the first semiconductor part in a thickness direction of the base part, a first connecting electrode overlapping the second semiconductor part in the thickness direction, and a second connecting electrode overlapping the third semiconductor part in the thickness direction. The first connecting electrode may be directly connected to the second semiconductor part, the second connecting electrode may be directly connected to the third semiconductor part, the second semiconductor part may include a semiconductor opening penetrating the second semiconductor part in the thickness direction, the third semiconductor part may include a semiconductor opening penetrating the third semiconductor part in the thickness direction. The first connecting electrode may include a (1-1)-th connecting electrode and (1-2)-th connecting electrodes electrically connected to each other, a width of the (1-2)-th connecting electrodes in a second direction intersecting the first direction may be less than a width of the (1-1)-th connecting electrode in the second direction. The (1-2)-th connecting electrodes may protrude from a side of the (1-1)-th connecting electrode toward the semiconductor openings.

The second semiconductor part may include a (2-1)-th semiconductor part, which extends in the first direction. The (2-1)-th semiconductor part may include the semiconductor opening of the second semiconductor part, a first-side semiconductor part disposed on a first side of the semiconductor opening of the second semiconductor part in the first direction, and a (2-1-1)-th semiconductor part disposed on a second side of the semiconductor opening of the second semiconductor part in the first direction.

The (2-1-1)-th semiconductor part may be directly connected to the first semiconductor part.

The first-side semiconductor part may include a (2-1-2)-th semiconductor part, which overlaps the first connecting electrode in the thickness direction, and a (2-1-3)-th semiconductor part, which protrudes from the (2-1-2)-th semiconductor part toward the semiconductor opening of the second semiconductor part, beyond the first connecting electrode, in a plan view.

A conductivity of the (2-1-1)-th semiconductor part may be greater than a conductivity of the first semiconductor part.

A conductivity of the (2-1-3)-th semiconductor part may be greater than a conductivity of the (2-1-2)-th semiconductor part.

The second semiconductor part may further include a (2-2)-th semiconductor part disposed on a first side of the (2-1)-th semiconductor part in the second direction, and a (2-3)-th semiconductor part disposed on a second side of the (2-1)-th semiconductor part in the second direction. Each of the (2-2)-th and (2-3)-th semiconductor part may be directly connected to the (2-1-3)-th semiconductor part.

A conductivity of the (2-2)-th and (2-3)-th semiconductor parts may be greater than a conductivity of the (2-1-2)-th semiconductor part.

The (2-1-3)-th semiconductor part may protrude in a direction from the (1-2)-th connecting electrodes toward the semiconductor openings, in a plan view.

The (1-2)-th connecting electrodes may overlap the (2-2)-th semiconductor part in the thickness direction.

The gate insulating layer may overlap the gate electrode and the first connecting electrode in the thickness direction.

The gate insulating layer may include an insulating recess, which is recessed from a side of the gate insulating layer in the first direction in a plan view.

The side of the gate insulating layer overlapping the first connecting electrode may be positioned between the side of the (1-1)-th connecting electrode and a side of each of the (1-2)-th connecting electrodes in a plan view.

Sides of the gate insulating layer that extend in the first direction, defining the insulating recess, may be covered by the (1-2)-th connecting electrodes.

The (1-2)-th connecting electrodes may define the insulating recess and protrude, in the second direction, beyond the side of the gate insulating layer.

The first connecting electrode may be directly connected to the first wiring, and the second connecting electrode may be directly connected to the second wiring.

The (1-2)-th connecting electrodes may have a rectangular shape, a trapezoidal shape, or a triangular shape in a plan view.

The width of the (1-2)-th connecting electrodes in the second direction may decrease toward the semiconductor openings, along the first direction.

The side of the gate insulating layer may be positioned between the side of the (1-1)-th connecting electrode and a side of each of the (1-2)-th connecting electrodes in a plan view.

The side of the gate insulating layer may protrude in a direction from sides of the (1-2)-th connecting electrodes toward the gate electrode.

According to an aspect of the disclosure, a display device may include a first conducive layer disposed on a base part and including a first wiring and a second wiring spaced apart from each other, a semiconductor layer disposed on the first conductive layer and including a first semiconductor part and a second semiconductor part disposed on a first side of the first semiconductor part in a first direction, a gate insulating layer disposed on the semiconductor layer, and a gate conductive layer disposed on the gate insulating layer and including a gate electrode overlapping the first semiconductor part in a thickness direction of the base part, and a first connecting electrode overlapping the second semiconductor part in the thickness direction. The second semiconductor part may include a semiconductor opening, which penetrates the second semiconductor part, the first connecting electrode may be directly connected to the second semiconductor part, the first connecting electrode may include a (1-1)-th connecting electrode and a (1-2)-th connecting electrode electrically connected to each other, and the (1-2)-th connecting electrode may protrude from a side of the (1-1)-th connecting electrode toward the semiconductor opening.

A width of the (1-2)-th connecting electrode in a second direction intersecting the first direction may be less than a width of the (1-1)-th connecting electrode in the second direction.

The gate insulating layer may overlap the gate electrode and the first connecting electrode in the thickness direction.

The gate insulating layer may include an insulating recess, which is recessed from a side of the gate insulating layer in the first direction in a plan view.

The side of the gate insulating layer may be positioned between a side of the (1-2)-th connecting electrode and the side of the (1-1)-th connecting electrode in a plan view.

According to an aspect of the disclosure, a method of manufacturing a display device may include forming a semiconductor layer including a first semiconductor part and a second semiconductor part disposed on a first side of the first semiconductor part in a first direction, on a base part, forming a gate insulating layer including an insulating recess, which overlaps the second semiconductor part in a thickness direction of the base part, on the semiconductor layer, disposing a gate conductive layer on the gate insulating layer, disposing a photoresist on the gate conductive layer, and forming a gate electrode and a first connecting electrode including a (1-1)-th connecting electrode and a (1-2)-th connecting electrode, which protrudes from the (1-1)-th connecting electrode in the first direction, in a plan view, by etching the gate conductive layer using the photoresist.

The method of manufacturing a display device may further include forming a semiconductor opening, which penetrates the second semiconductor part in the thickness direction, by etching a portion of the semiconductor layer exposed by the gate insulating layer, after the etching of the gate conductive layer using the photoresist.

The method of manufacturing a display device may further include etching the gate insulating layer using the photoresist, after the forming of the semiconductor opening, and making the portion of the semiconductor layer exposed by the gate electrode and the first connecting electrode conductive during the etching of the gate insulating layer using the photoresist.

According to the aforementioned and other embodiments of the disclosure, the number of conductive layers may be reduced, and increases in resistance may be prevented in case that different conductive layers are in contact with one another.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
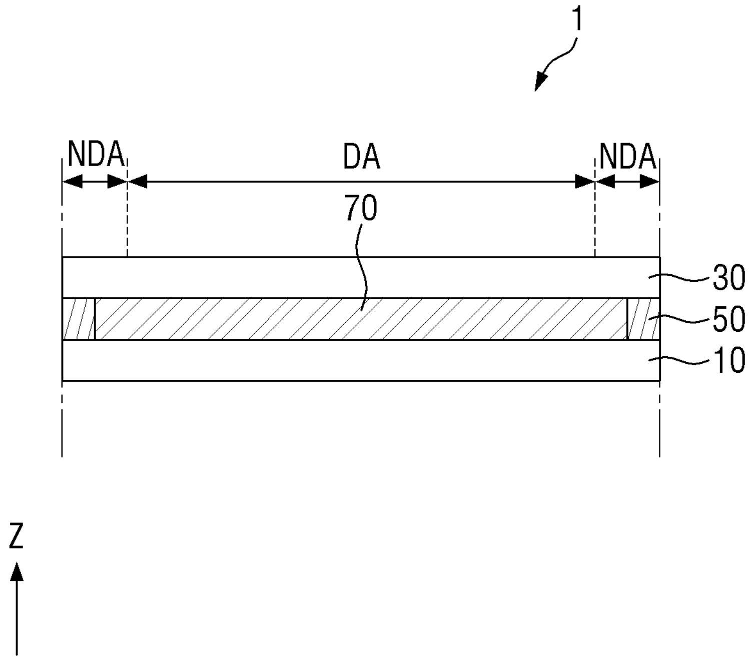
FIG. 1 is a schematic cross-sectional view of a display device according to an embodiment of the disclosure.

The embodiments will now be described hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be more thorough and complete, and will fully convey the scope of the disclosure to those skilled in the art. The same reference numbers indicate the same components throughout the specification. In the attached figures, the thickness of layers and regions is exaggerated for clarity.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Although the terms "first", "second", etc. may be used herein to describe various types of elements, these elements should not be limited by these terms. These terms are used to distinguish one element from another element. Thus, a first element discussed below could be termed a second element without departing from the teachings of the disclosure.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The disclosure will be described with reference to perspective views, cross-sectional views, and/or plan views, in which embodiments of the disclosure are shown. Thus, the profile of a view may be modified according to manufacturing techniques and/or allowances. The embodiments of the disclosure are not intended to limit the scope of the disclosure but cover all changes and modifications that can be caused due to a change in manufacturing process. Thus, regions shown in the drawings are illustrated in schematic form and the shapes of the regions are presented simply by way of illustration and not as a limitation.

Hereinafter, embodiments of the disclosure will be described with reference to the accompanying drawings.

FIG. 1 is a schematic cross-sectional view of a display device according to an embodiment of the disclosure.

Referring to FIG. 1, a display device 1 may be a small- to mid-size electronic device such as a tablet personal computer (PC), a smartphone, a car navigation unit, a camera, a center information display (CID) of a car, a wristwatch-type electronic device, a personal digital assistant (PDA), a portable multimedia player (PMP), or a gaming console or a mid- to large-size electronic device such as a television (TV), an electronic billboard, a monitor, a PC, or a notebook computer, but the disclosure is not limited thereto. The display device 1 may be employed in other electronic devices without departing from the concept of the disclosure.

The display device 1 may include a display area DA, which displays an image, and a non-display area NDA, which does not display an image. The non-display area NDA may be disposed adjacent to the display area DA and may surround the display area DA. An image displayed in the display area DA may be visible from above in a third direction Z.

The display device 1 may include a display substrate 10 and a color conversion substrate 30, which faces the display substrate 10, and may further include a sealing member 50, which couples the display substrate 10 and the color conversion substrate 30, and a filler 70, which is disposed between the display substrate 10 and the color conversion substrate 30.

The display substrate 10 may include elements and circuits for displaying an image (e.g., pixel circuits such as switching elements), a pixel-defining film, which defines light-emitting areas and a non-light-emitting area in the display area DA, and self-light-emitting elements. The self-light-emitting elements may include organic light-emitting diodes (OLEDs), quantum-dot light-emitting diodes (LEDs), micro-LEDs including an inorganic material, and/or nano-LEDs including an inorganic material. For convenience, the self-light-emitting elements will hereinafter be described as being OLEDs.

The color conversion substrate 30 may be positioned on the display substrate 10 and may face the display substrate 10. In some embodiments, the color conversion substrate 30 may include color conversion patterns capable of converting the color of incident light. In some embodiments, the color conversion substrate 30 may include color filters and/or wavelength shifting patterns. In some embodiments, the color conversion substrate 30 may include both the color filters and the wavelength shifting patterns.

The sealing member 50 may be positioned between the display substrate 10 and the color conversion substrate 30, in the non-display area NDA. In a plan view, the sealing member 50 may be disposed along the edges of each of the display substrate 10 and the color conversion substrate 30, in the non-display area NDA, to surround the display area DA. The display substrate 10 and the color conversion substrate 30 may be coupled together by the sealing member 50.

In some embodiments, the sealing member 50 may be formed of an organic material. For example, the sealing member 50 may be formed of an epoxy resin, but the disclosure is not limited thereto. In some embodiments, the sealing member 50 may be provided as frit including glass.

The filler 70 may be positioned in the space between the display substrate 10 and the color conversion substrate 30, surrounded by the sealing member 50. The filler 70 may fill the gap between the display substrate 10 and the color conversion substrate 30.

In some embodiments, the filler 70 may be formed of a material capable of transmitting light therethrough. In some embodiments, the filler 70 may be formed of an organic material. For example, the filler 70 may be formed of a silicone-based organic material, an epoxy-based organic material, or the mixture thereof.

In some embodiments, the filler 70 may be formed of a material having an extinction coefficient of substantially zero. There is a correlation between refractive index and extinction coefficient, and the less the refractive index, the less the extinction coefficient. In case that the refractive index is 1.7 or less, the extinction coefficient substantially converges on zero. In some embodiments, the filler 70 may be formed of a material having a refractive index of equal to or less than about 1.7, and the absorption of light provided by the self-light-emitting elements by the filler 70 may be prevented or minimized. In some embodiments, the filler 70 may be formed of an organic material having a refractive index in a range of about 1.4 to about 1.6.

FIG. 1 illustrates that the display device 1 includes the display substrate 10, the color conversion substrate 30, the sealing member 50, and the filler 70, but the disclosure is not limited thereto. In another embodiment, the sealing member 50 and the filler 70 may omitted, and the entire color conversion substrate 30 except for a second base part 310 (refer to FIG. 10) may be disposed on the display substrate 10.

Figure 2:
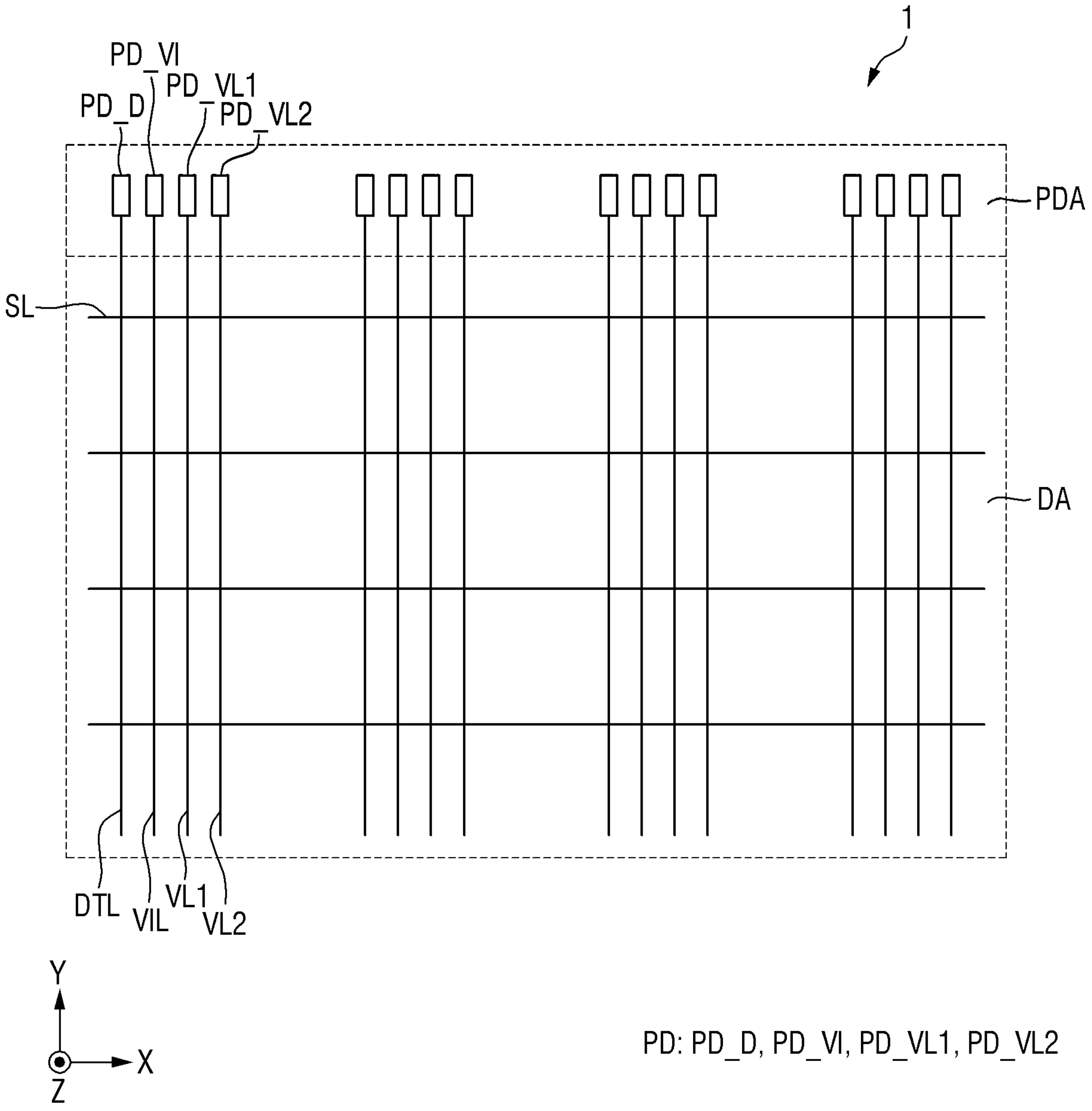
FIG. 2 is a plan view illustrating a layout of lines of the display device of FIG. 1.

FIG. 2 is a plan view illustrating a layout of lines of the display device of FIG. 1.

Referring to FIG. 2, the display device 1 may include multiple lines. The display device 1 may include multiple scan lines SL, multiple data lines DTL, initialization voltage lines VIL, and multiple voltage lines (VL1 and VL2). Although not specifically illustrated, the display device 1 may include other lines.

The data lines DTL, the initialization voltage lines VIL, and the voltage lines (VL1 and VL2) may extend in a second direction Y (or a Y-axis direction), and the scan lines SL may extend in a first direction X (or an X-axis direction). The data lines DTL, the initialization voltage lines VIL, and the voltage lines (VL1 and VL2) may be connected to connecting pads PD, which are disposed in a pad area PDA of the non-display area NDA. The connecting pads PD may include data pads PD_D, which are connected to the data lines DTL, initialization voltage pads PD_VI, which are connected to the initialization voltage lines VIL, and voltage pads (PD_VL1 and PD_VL2), which are connected to the voltage lines (VL1 and VL2).

The term "connect" or "connection", as used herein, not only means that one element is coupled to another element through physical contact, but also means that one element is coupled to another element via yet another element. One integral member may be understood as having parts connected to one another. Also, the connection between two elements may encompass not only a direct connection between the two elements, but also an electrical connection between the two elements.

The connecting pads PD are illustrated as being disposed in the pad area PDA, on the upper side of the display area DA in FIG. 2, but the disclosure is not limited thereto. In another embodiment, some of the connecting pads PD may be disposed on the lower side of the display area DA or on the left or right side of the display area DA.

A pixel PX or a subpixel SPXn (where n is an integer of 1 to 3) of the display device 1 may include a pixel driving circuit. The above-described lines of the display device 1 may apply driving signals to the pixel driving circuit, passing by the pixel or the subpixel SPXn. The pixel driving circuit may include transistors and capacitors. The numbers of transistors and capacitors included in the pixel driving circuit may vary. For example, the pixel driving circuit may have a "3T1C" structure including three transistors and one capacitor. The pixel driving circuit will hereinafter be described as having the "3T1C" structure, but the disclosure is not limited thereto. In another embodiment, various other structures such as a "2T1C", "7T1C", or "6T1C" structure may be applicable to the pixel driving circuit.

Figure 3:
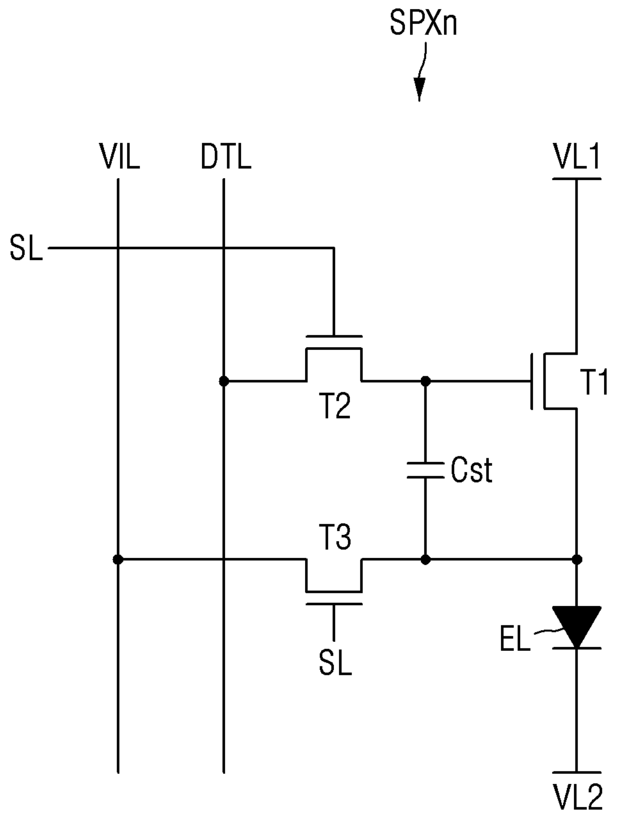
FIG. 3 is a schematic diagram of an equivalent circuit of a pixel of the display device of FIG. 1.

FIG. 3 is a schematic diagram of an equivalent circuit of a subpixel of the display device of FIG. 1.

Referring to FIG. 3, a subpixel SPXn of the display device 1 may include an LED EL, three transistors, i.e., first, second, and third transistors T1, T2, and T3, and one storage capacitor Cst.

The LED EL may emit light in accordance with a current applied thereto via the first transistor T1. The LED EL may include a first electrode, a second electrode, and at least one light-emitting element disposed between the first and second electrodes. The light-emitting element may emit light of a particular wavelength range in accordance with electric signals transmitted thereto from the first and second electrodes.

A first end of the LED EL may be connected to the source electrode of the first transistor T1, and a second end of the LED EL may be connected to a second voltage line VL2, to which a low-potential voltage (hereinafter, a second power supply voltage) is supplied. The second power supply voltage may be lower than a high-potential voltage (hereinafter, a first power supply voltage), which is supplied to a first voltage line VL1.

The first transistor T1 may control a current flowing from the first voltage line VL1, to which the first power supply voltage is supplied, to the LED EL in accordance with the difference in voltage between the gate electrode and the source electrode of the first transistor T1. For example, the first transistor T1 may be a transistor for driving the LED EL. The gate electrode of the first transistor T1 may be connected to the source electrode of the second transistor T2, the source electrode of the first transistor T1 may be connected to the first electrode of the LED EL, and the drain electrode of the first transistor T1 may be connected to the first voltage line VL1, to which the first power supply voltage is supplied.

The second transistor T2 may be turned on by a scan signal from a scan line SL to connect a data line DTL to the gate electrode of the first transistor T1. The gate electrode of the second transistor T2 may be connected to the scan line SL, the source electrode of the second transistor T2 may be connected to the gate electrode of the first transistor T1, and the drain electrode of the second transistor T2 may be connected to the data line DTL.

The third transistor T3 may be turned on by the scan signal from the scan line SL to connect an initialization voltage line VIL to the first electrode of the LED EL. The gate electrode of the third transistor T3 may be connected to the scan line SL, the drain electrode of the third transistor T3 may be connected to the initialization voltage line VIL, and the source electrode of the third transistor T3 may be connected to the first electrode of the LED EL or the source electrode of the first transistor T1.

The source electrodes and the drain electrodes of the first, second, and third transistors T1, T2, and T3 are not limited to the above descriptions. The first, second, and third transistors T1, T2, and T3 may be formed as thin-film transistors (TFTs). FIG. 3 illustrates that the first, second, and third transistors T1, T2, and T3 are formed as N-type metal-oxide semiconductor field-effect transistors (MOSFETs), but the disclosure is not limited thereto. In another embodiment, the first, second, and third transistors T1, T2, and T3 may all be formed as P-type MOSFETs. In another embodiment, some of the first, second, and third transistors T1, T2, and T3 may be formed as N-type MOSFETS, and other transistor(s) may be formed as P-type MOSFETs.

The storage capacitor Cst may be formed between the gate electrode and the source electrode of the first transistor T1. The storage capacitor Cst may store a voltage corresponding to the difference in voltage between the gate electrode and the source electrode of the first transistor T1.

FIG. 3 illustrates that the gate electrodes of the second and third transistors T2 and T3 are connected to the same scan line SL and are thus turned on at the same time by the scan signal from the same scan line SL, but the disclosure is not limited thereto. In another embodiment, the gate electrodes of the second and third transistors T2 and T3 may be connected to different scan lines SL.

Figure 4:
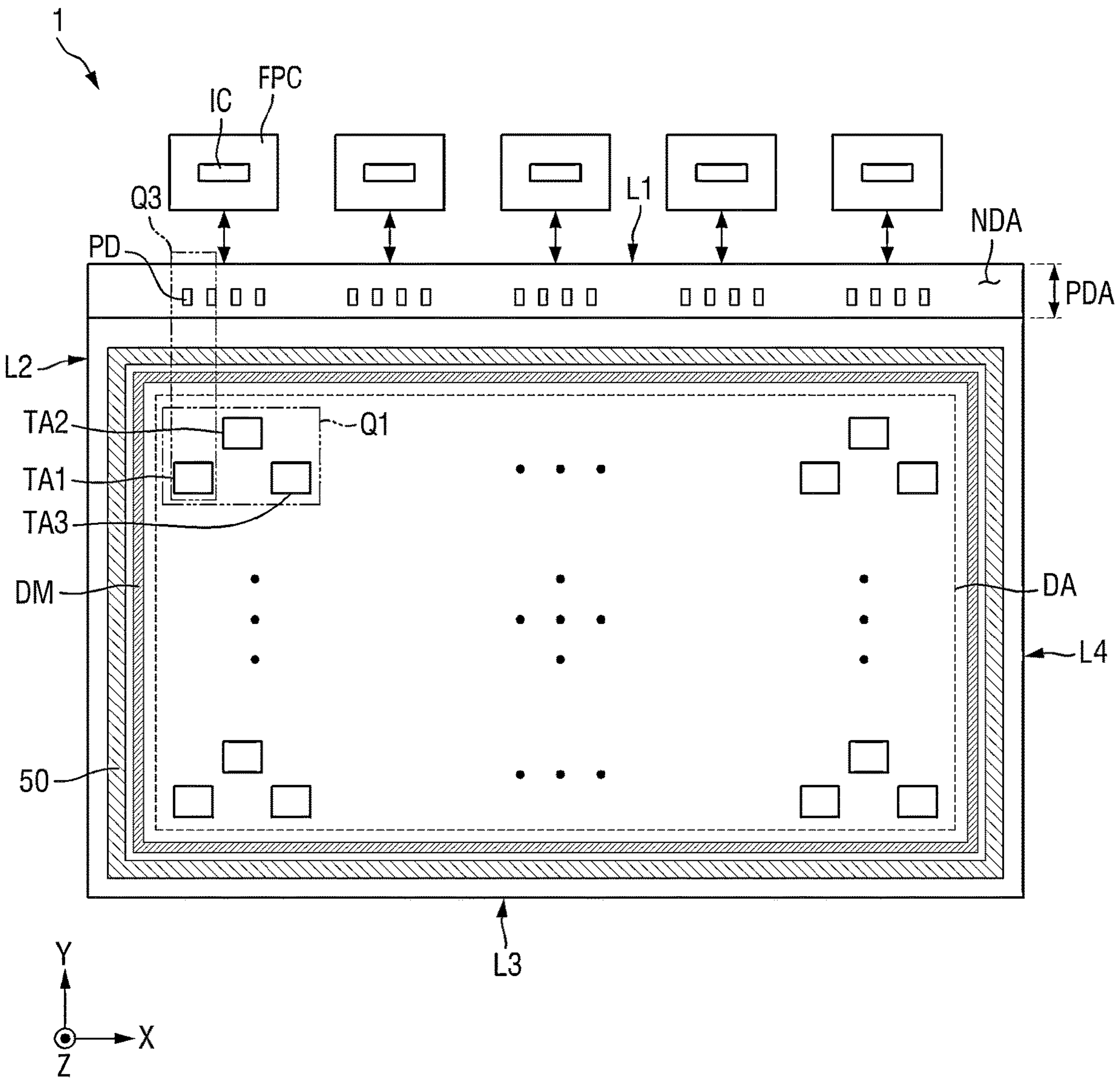
FIG. 4 is a plan view of the display device of FIG. 1.
Figure 5:
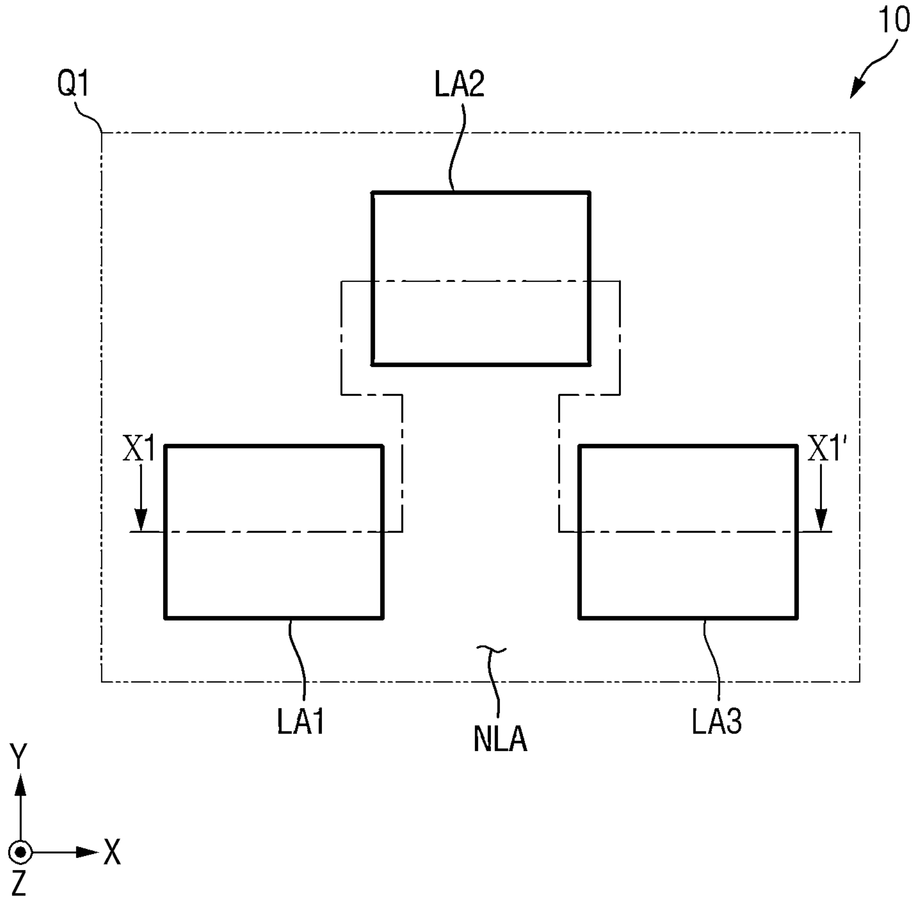
FIG. 5 is an enlarged plan view of part Q1 of FIG. 4 and illustrates a display substrate of the display device of FIG. 1.
Figure 6:
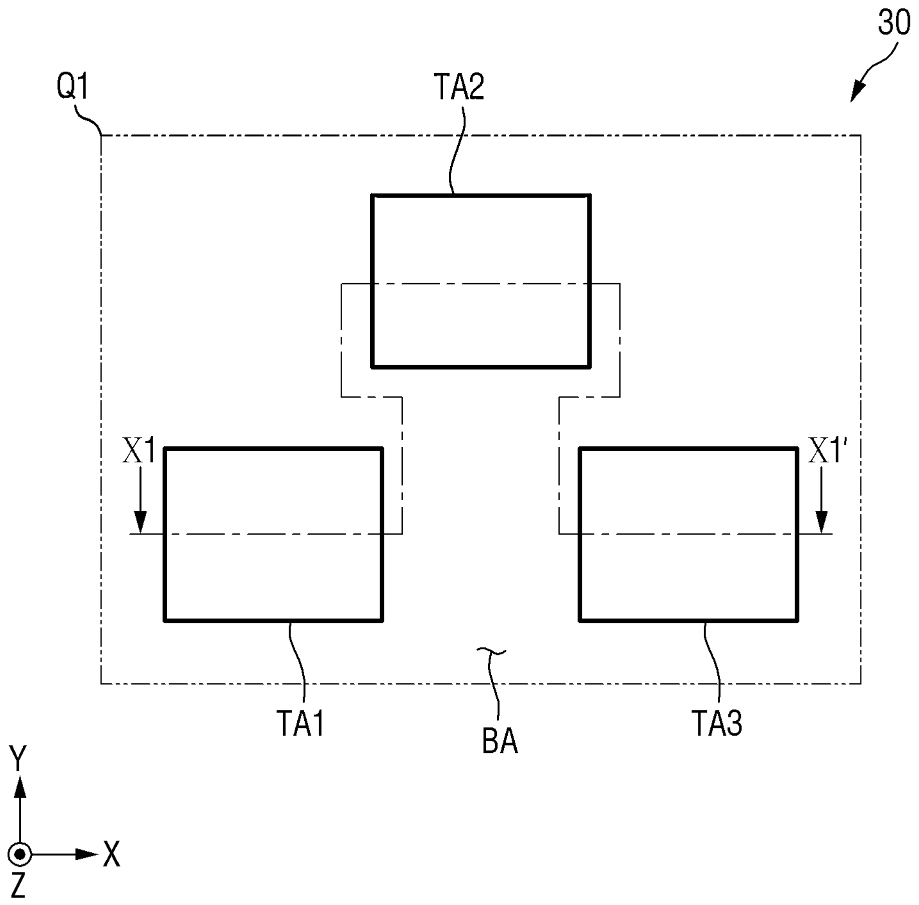
FIG. 6 is an enlarged plan view of part Q1 of FIG. 4 and illustrates a color conversion substrate of the display device of FIG. 1.
Figure 7:
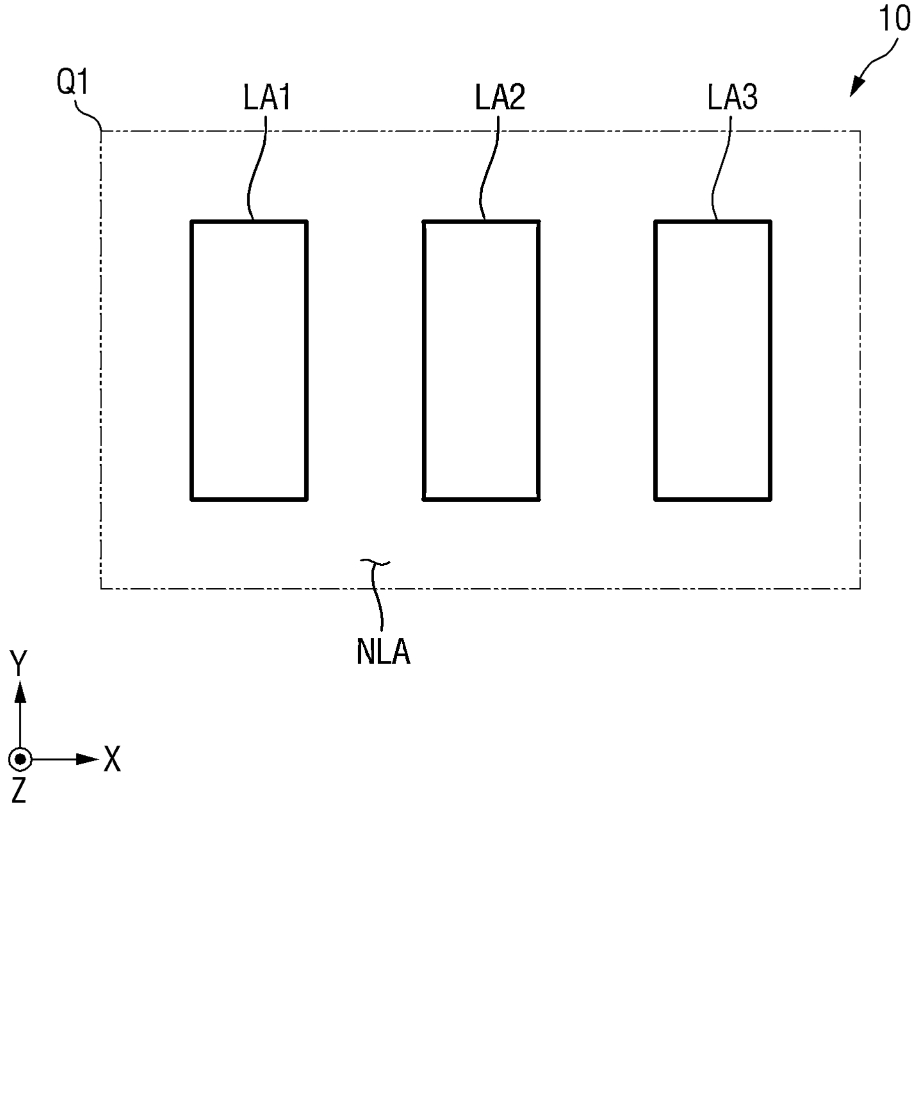
FIG. 7 is a plan view of the display substrate of FIG. 1 according to another embodiment.
Figure 8:
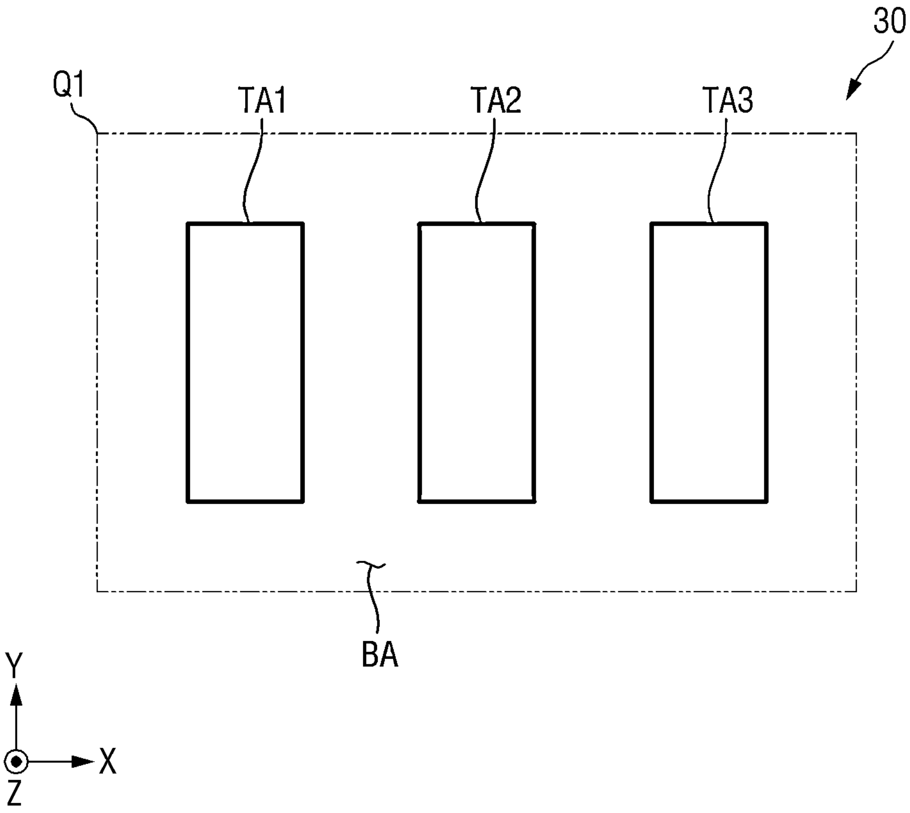
FIG. 8 is a plan view of the color conversion substrate of FIG. 1 according to another embodiment.
Figure 9:
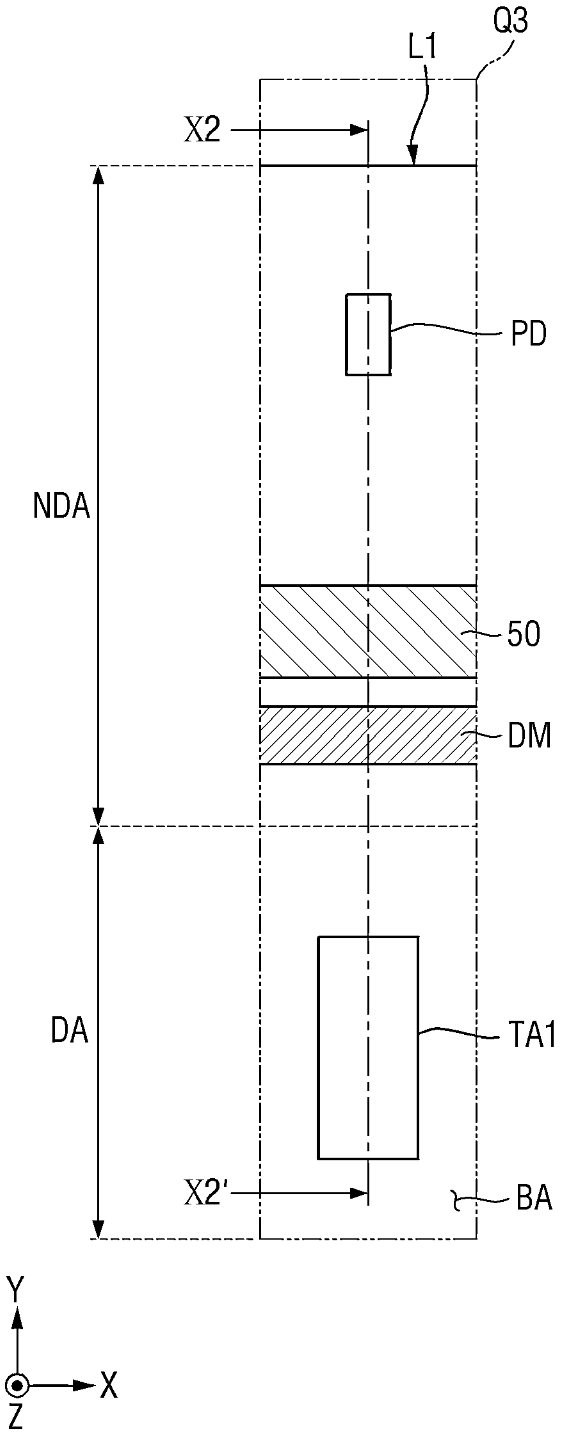
FIG. 9 is an enlarged plan view of part Q3 of FIG. 4.

FIG. 4 is a plan view of the display device of FIG. 1. FIG. 5 is an enlarged plan view of part Q1 of FIG. 4 and illustrates a display substrate of the display device of FIG. 1. FIG. 6 is an enlarged plan view of part Q1 of FIG. 4 and illustrates a color conversion substrate of the display device of FIG. 1. FIG. 7 is a plan view of the display substrate of FIG. 1 according to another embodiment. FIG. 8 is a plan view of the color conversion substrate of FIG. 1 according to another embodiment. FIG. 9 is an enlarged plan view of part Q3 of FIG. 4.

Referring to FIGS. 4 through 9 and further to FIG. 1, the display device 1 may have a rectangular shape in a plan view. The display device 1 may include first and third sides L1 and L3, which extend in the first direction X, and second and fourth sides L2 and L4, which extend in the second direction Y that intersects the first direction X. The corners where the sides of the display device 1 meet may be right-angled, but the disclosure is not limited thereto. In some embodiments, the length of the first and third sides L1 and L3 may differ from the length of the second and fourth sides L2 and L4. For example, the first and third sides L1 and L3 may be longer than the second and fourth sides L2 and L4. The shape of the display device 1 is not particularly limited, and the display device 1 may have a shape other than a rectangular shape, such as a circular shape.

The display device 1 may include flexible circuit boards FPC and driving chips IC.

Multiple light-emitting areas (LA1, LA2, and LA3) and a non-light-emitting area NLA may be defined on the display substrate 10, in the display area DA.

In the display area DA of the display substrate 10, first, second, and third light-emitting areas LA1, LA2, and LA3 may be defined. The first, second, and third light-emitting areas LA1, LA2, and LA3 may be areas that output light generated by the light-emitting elements of the display substrate 10 to the outside of the display substrate 10, and the non-light-emitting area NLA may be an area that does not output light to the outside of the display substrate 10. In some embodiments, the non-light-emitting area NLA may surround the first, second, and third light-emitting areas LA1, LA2, and LA3, in the display area DA.

In some embodiments, the first, second, and third light-emitting areas LA1, LA2, and LA3 may output light of a third color. In some embodiments, light of the third color may be blue light and may have a peak wavelength in a range of about 440 nm to about 480 nm. Here, the term "peak wavelength" refers to the wavelength at which the intensity of light reaches its maximum.

In some embodiments, the first, second, and third light-emitting areas LA1, LA2, and LA3 may form a group, and multiple groups may be defined in the display area DA.

Referring to FIG. 5, the first and third light-emitting areas LA1 and LA3 may be positioned adjacent to each other in the first direction X, and the second light-emitting area LA2 may be positioned on sides, in the second direction Y, of the first and third light-emitting areas LA1 and LA3. However, the disclosure is not limited to this, and the layout of the first, second, and third light-emitting areas LA1, LA2, and LA3 may vary. For example, the first, second, and third light-emitting areas LA1, LA2, and LA3 may be sequentially arranged along the first direction X. In some embodiments, the first, second, and third light-emitting areas LA1, LA2, and LA3 may form a group, and such groups may be repeatedly arranged along the first and second directions X and Y.

The first, second, and third light-emitting areas LA1, LA2, and LA3 will hereinafter be described as being arranged as illustrated in FIG. 5.

Referring to FIG. 6, multiple light-transmitting areas (TA1, TA2, and TA3) and a light-blocking area BA may be defined on the color conversion substrate 30, in the display area DA. The light-transmitting areas (TA1, TA2, and TA3) may be areas that output light emitted from the display substrate 10 to the outside of the display device 1 through the color conversion substrate 30. The light-blocking area BA may be an area that does not transmit light emitted from the display substrate 10 therethrough.

In some embodiments, first, second, and third light-transmitting areas TA1, TA2, and TA3 may be defined on the color conversion substrate 30.

The first light-transmitting area TA1 may correspond to, or overlap, the first light-emitting area LA1 in the third direction Z. Similarly, the second and third light-transmitting areas TA2 and TA3 may correspond to, or overlap, the second and third light-emitting areas LA2 and LA3 in the third direction Z, respectively.

In a case where the first and third light-emitting areas LA1 and LA3 are adjacent to each other in the first direction X and the second light-emitting area LA2 is disposed on sides, in the second direction Y, of the first and third light-emitting areas LA1 and LA3, as illustrated in FIG. 5, the first and third light-transmitting areas TA1 and TA3 may be adjacent to each other in the first direction X, and the second light-transmitting area TA2 may be disposed on sides, in the second direction Y, of the first and third light-transmitting areas TA1 and TA3, as illustrated in FIG. 4.

In some embodiments, in a case where the first, second, and third light-emitting areas LA1, LA2, and LA3 are sequentially arranged along the first direction X, as illustrated in FIG. 7, the first, second, and third light-transmitting areas TA1, TA2, and TA3 may be sequentially arranged along the first direction X, as illustrated in FIG. 8.

In some embodiments, the first, second, and third light-transmitting areas TA1, TA2, and TA3 may have a quadrilateral shape in a plan view, but the disclosure is not limited thereto. The quadrilateral shape may be a rectangular or square shape. In another embodiment, the first, second, and third light-transmitting areas TA1, TA2, and TA3 may have a circular shape, an elliptical shape, or another polygonal shape in a plan view.

In some embodiments, light of the third color from the display substrate 10 may be provided to the outside of the display device 1 through the first, second, and third light-transmitting areas TA1, TA2, and TA3. Light output from the first light-transmitting area TA1 to the outside of the display device 1, light output from the second light-transmitting area TA2 to the outside of the display device 1, and light output from the third light-transmitting area TA3 to the outside of the display device 1 may be referred to as first emission light, second emission light, and third emission light, respectively. The first emission light may be light of a first color, the second emission light may be light of a second color, which is different from the first color, and the third emission light may be light of the third color, which is different from the first color and the second color. In some embodiments, light of the third color may be blue light having a wavelength in a range of about 380 nm to about 500 nm and a peak wavelength in a range of about 440 nm to about 480 nm, light of the first color may be red light having a wavelength in a range of about 600 nm to about 780 nm and a peak wavelength in a range of about 610 nm to about 650 nm, and light of the second color may be green light having a wavelength in a range of about 500 nm to about 600 nm and a peak wavelength in a range of about 510 nm to about 550 nm.

The light-blocking area BA may be positioned around the first, second, and third light-transmitting areas TA1, TA2, and TA3 of the color conversion substrate 30, in the display area DA. In some embodiments, the light-blocking area BA may surround the first, second, and third light-transmitting areas TA1, TA2, and TA3. The light-blocking area BA may also be positioned in the non-display area NDA of the display device 1.

The first, second, and third light-transmitting areas TA1, TA2, and TA3 and the light-blocking area BA may be defined on the color conversion substrate 30, in the display area DA, as illustrated in FIG. 6. The first, second, and third light-transmitting areas TA1, TA2, and TA3 may be areas that provide light emitted from the display substrate 10 to the outside of the display device 1 through the color conversion substrate 30. The light-blocking area BA may be an area that does not transmit light emitted from the display substrate 10 therethrough.

Referring to FIG. 4 and FIG. 9, a dam member DM and the sealing member 50 may be disposed in the non-display area NDA of the display device 1.

The dam member DM may prevent the spill of an organic material (or monomer) from an encapsulation layer during the formation of the encapsulation layer in the display area DA and may thus prevent the organic material from the encapsulation layer from extending to the edges of the display device 1.

In some embodiments, the dam member DM may be disposed to completely surround the display area DA, in a plan view.

The sealing member 50 may couple the display substrate 10 and the color conversion substrate 30.

The sealing member 50 may be disposed on the outside of the dam member DM, in the non-display area NDA, and may be disposed to surround the dam member DM and the display area DA, in a plan view.

The non-display area NDA of the display device 1 may include the pad area PDA, and the connecting pads PD may be positioned in the pad area PDA.

The display substrate 10 of the display device 1 may include the dam member DM and the connecting pads PD.

The flexible circuit boards FPC may be connected to the connecting pads PD. The flexible circuit board FPC may electrically connect circuit boards for providing signals or power for driving the display device 1 to the display substrate 10 of FIG. 1.

The driving chips IC may be electrically connected to the circuit boards and may thus be provided with data and signals. In some embodiments, the driving chips IC may be data driving chips IC and may receive data control signals and image data from the circuit boards and generate and output data voltages corresponding to the image data.

In some embodiments, the driving chips IC may be mounted on the flexible circuit boards FPC. For example, the driving chips IC may be mounted on the flexible circuit boards FPC in a chip-on-film (COF) manner.

As will be described later, data voltages from the driving chips IC and power from the circuit boards may be transmitted to the pixel circuits of the display substrate 10 of FIG. 1 via the flexible circuit boards FPC and the connecting pads PD.

The structure of the display device 1 will hereinafter be described in further detail.

Figure 10:
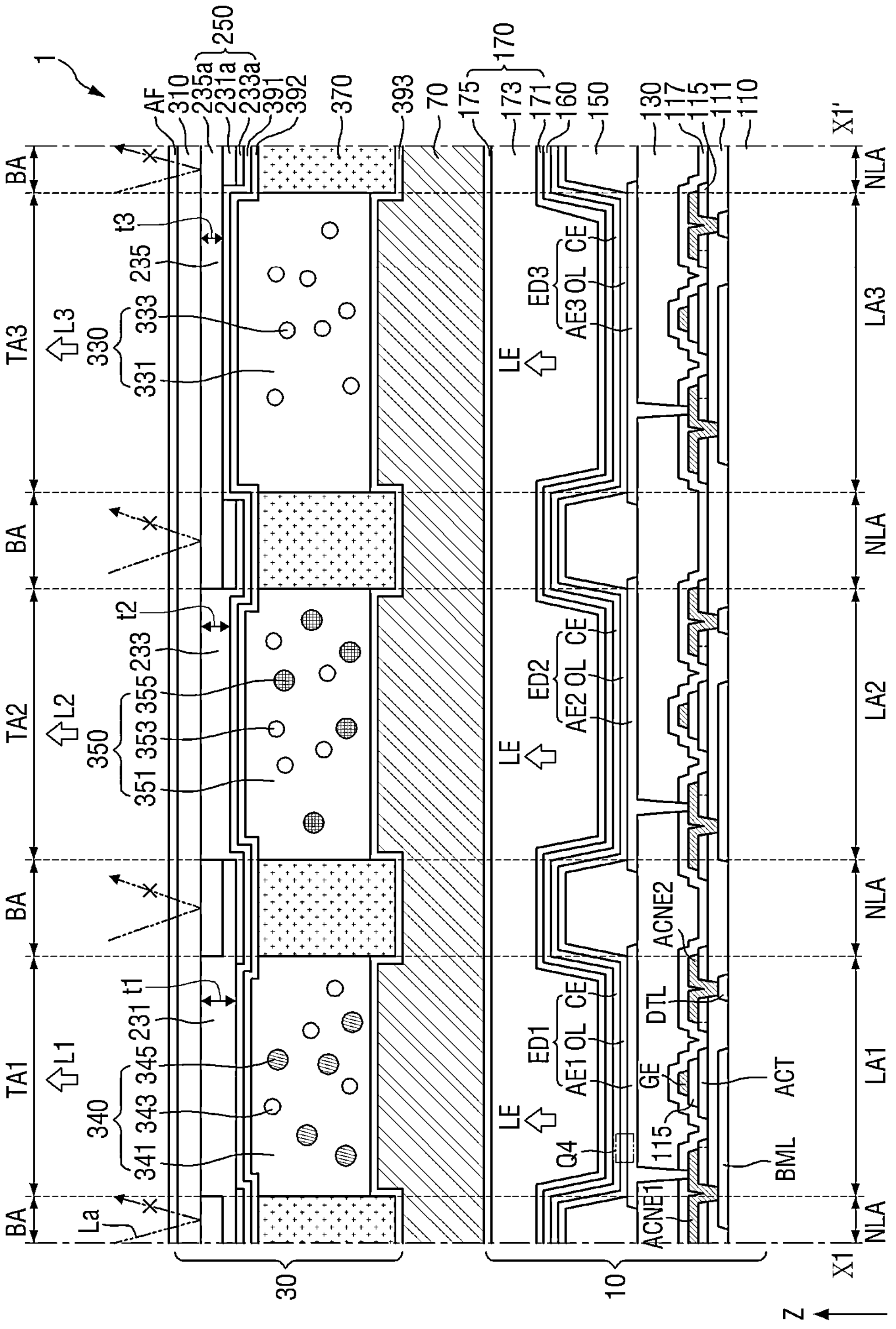
FIG. 10 is a schematic cross-sectional view taken along line X1-X1' of FIGS. 5 and 6.
Figure 11:
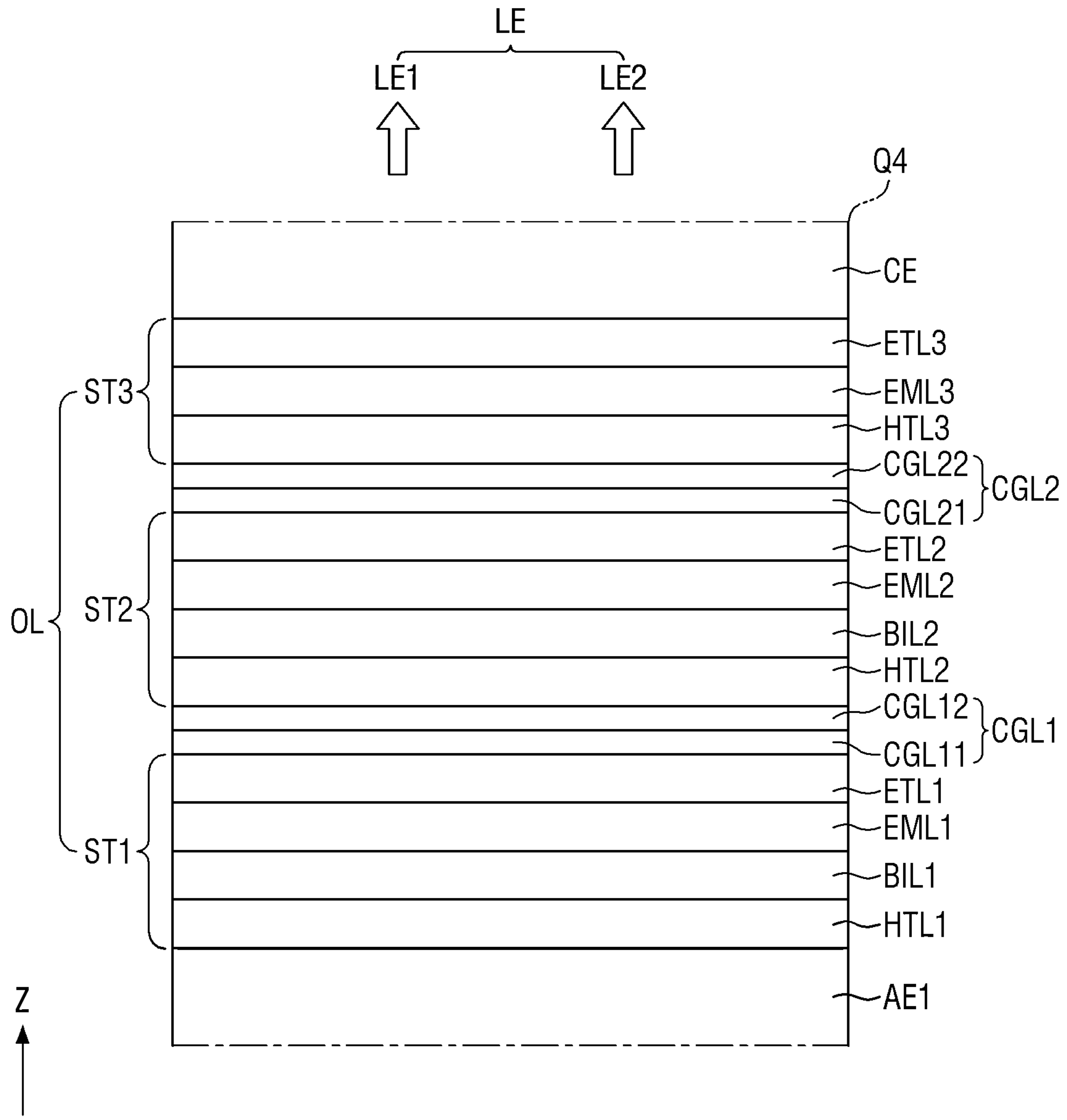
FIG. 11 is an enlarged schematic cross-sectional view of part Q4 of FIG. 10.
Figure 12:
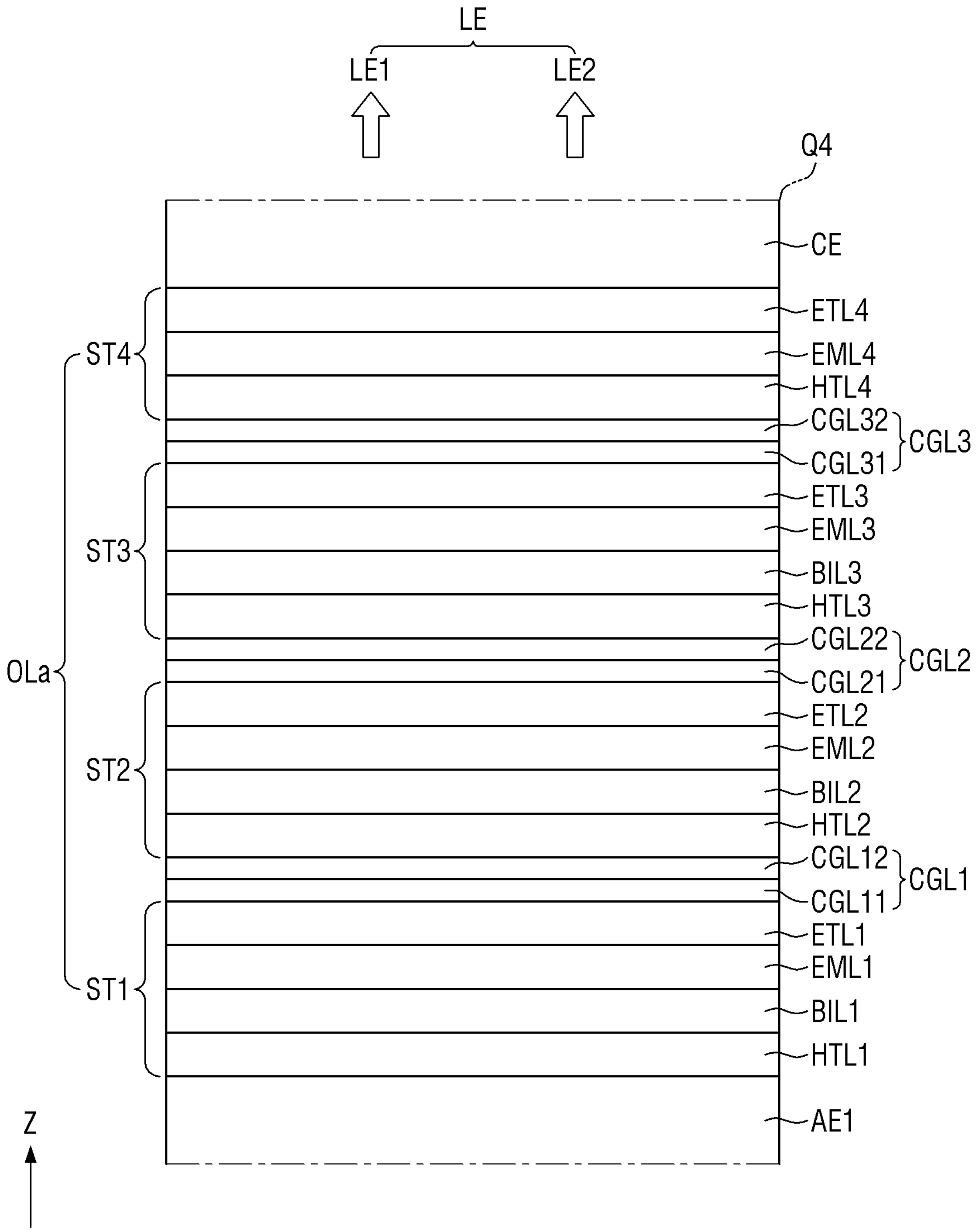
FIG. 12 is a schematic cross-sectional view of part Q4 of FIG. 10 according to another embodiment.
Figure 13:
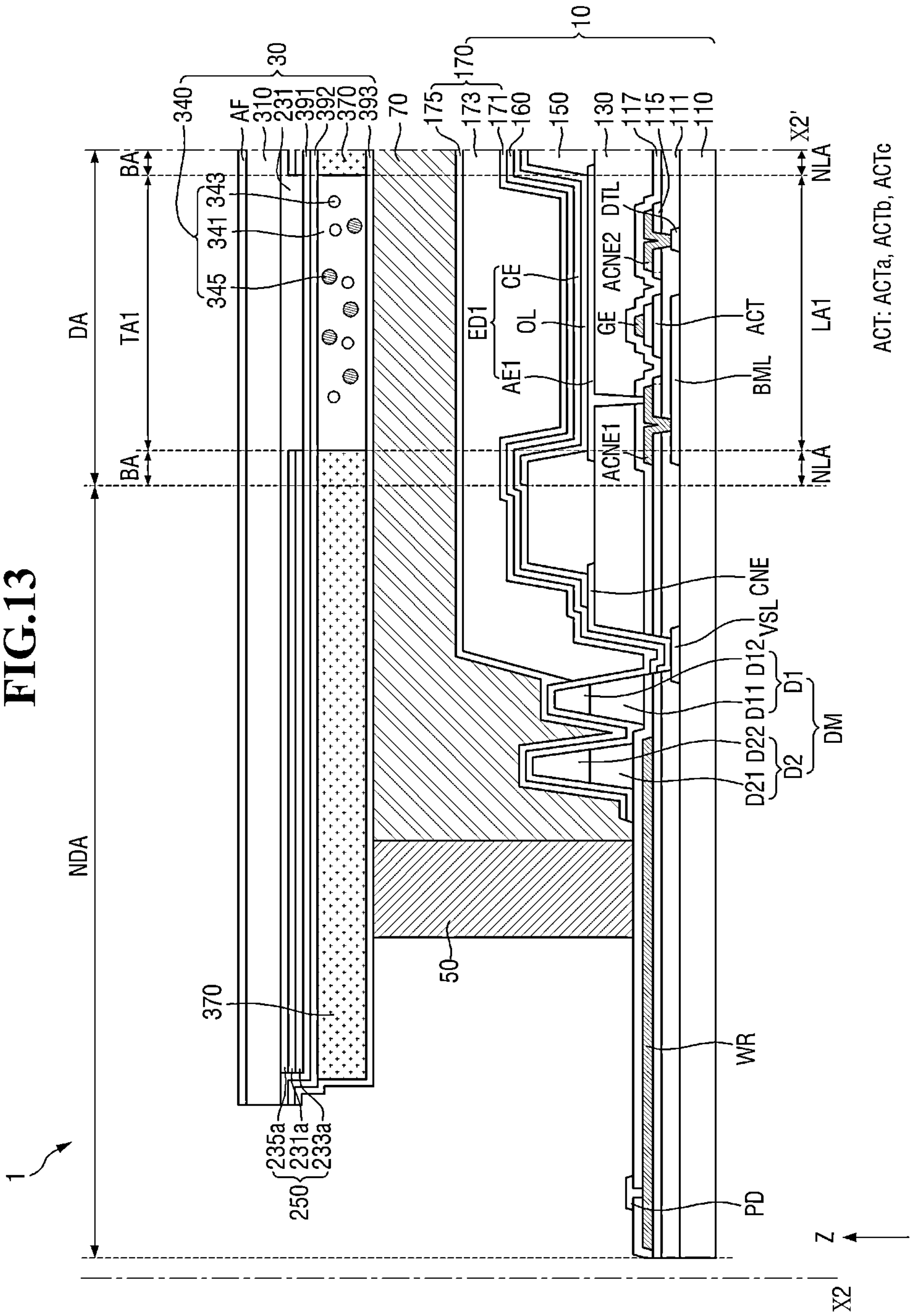
FIG. 13 is a schematic cross-sectional view taken along line X2-X2' of FIG. 9.

FIG. 10 is a schematic cross-sectional view taken along line X1-X1' of FIGS. 5 and 6. FIG. 11 is an enlarged schematic cross-sectional view of part Q4 of FIG. 10. FIG. 12 is a schematic cross-sectional view of part Q4 of FIG. 10 according to another embodiment. FIG. 13 is a schematic cross-sectional view taken along line X2-X2' of FIG. 9.

Referring to FIGS. 10 through 13 and further to FIGS. 1 through 9, the display device 1 may include the display substrate 10 and the color conversion substrate 30 and may also include the filler 70, which is positioned between the display substrate 10 and the color conversion substrate 30.

The display substrate 10 will hereinafter be described.

A first base part 110 may be formed of a material having light transmittance. The first base part 110 may be a glass substrate or a plastic substrate. In a case where the first base part 110 is a plastic substrate, the first base part 110 may have flexibility.

In some embodiments, multiple light-emitting areas, i.e., first, second, and third light-emitting areas LA1, LA2, and LA3, and a non-light-emitting area NLA may be defined on the first base part 110, in the display area DA.

The four sides of the display device 1, i.e., the first, second, third, and fourth sides L1, L2, L3, and L4, may coincide with the four sides of the first base part 110. For example, the first, second, third, and fourth sides L1, L2, L3, and L4 of the display device 1 may also be referred to as the first, second, third, and fourth sides L1, L2, L3, and L4 of the first base part 110.

A first conductive layer may be positioned on the first base part. The first conductive layer may include a lower light-blocking layer BML and data lines DTL. The lower light-blocking layer BML may overlap second semiconductor parts of a semiconductor layer ACT in a thickness direction, and the data lines DTL may overlap third semiconductor parts of the semiconductor layer ACT in the thickness direction.

The lower light-blocking layer BML may prevent external light or light emitted by the light-emitting elements from entering the semiconductor layer ACT. Accordingly, the occurrence of leakage currents in thin-film transistors (TFTs) may be prevented.

The lower light-blocking layer BML may be formed of a conductive material capable of blocking light. For example, the lower light-blocking layer BML may include silver (Ag), nickel (Ni), gold (Au), platinum (Pt), aluminum (Al), copper (Cu), molybdenum (Mo), titanium (Ti), neodymium (Nd), or an alloy thereof. In some embodiments, the lower light-blocking layer BML may have a single- or multilayer structure. For example, in a case where the lower light-blocking layer BML has a multilayer structure, the lower light-blocking layer BML may include a stack of Ti/Cu/indium tin oxide (ITO) or Ti/Cu/aluminum oxide ($Al_2O_3$), but the disclosure is not limited thereto.

In some embodiments, multiple lower light-blocking layers BML may be provided to correspond to, and overlap, the semiconductor layer ACT. In some embodiments, the width of the lower light-blocking layer BML may be greater than the width of the semiconductor layer ACT.

The buffer layer 111 may be disposed on the lower light-blocking layer BML. The buffer layer 111 may be positioned on the first base part 110 and may be disposed in the display area DA and the non-display area NDA. The buffer layer 111 may block any foreign material or moisture that may penetrate into the display device 1 through the first base part 110. For example, the buffer layer 111 may include an inorganic material such as silicon oxide ($SiO_2$), silicon nitride ($SiN_x$), or silicon oxynitride (SiON) and may be formed as a single- or multilayer film.

The semiconductor layer ACT may be positioned on the buffer layer 111. The semiconductor layer ACT may be disposed in the display area DA and the non-display area NDA. The semiconductor layer ACT may be disposed in the display area DA to correspond to the first, second, and third light-emitting areas LA1, LA2, and LA3 and form the semiconductor layer of each TFT (e.g., the first, second, and third transistors T1, T2, and T3 of FIG. 3). The semiconductor layer ACT will hereinafter be described as the semiconductor layer of each TFT. The semiconductor layer ACT may include first semiconductor parts overlapping gate electrodes GE, second semiconductor parts on sides of the first semiconductor parts, and third semiconductor parts on another sides of the first semiconductor parts. The structure and the functions of the semiconductor layer ACT will be described later.

The semiconductor layer ACT may include an oxide semiconductor. For example, the semiconductor layer ACT may be formed of a ZnO-based material such as zinc oxide (ZnO), indium zinc oxide (IZO), or indium gallium zinc oxide (IGZO), or may be an IGZO semiconductor, which is ZnO containing metals such as indium (In) and gallium (Ga), but the disclosure is not limited thereto. In another example, the semiconductor layer ACT may include amorphous silicon or polysilicon.

A gate insulating layer 115 may be positioned on the semiconductor layer ACT. In some embodiments, the gate insulating layer 115 may be positioned in the display area DA and the non-display area NDA. In some embodiments, the gate insulating layer 115 may include an inorganic material such as $SiO_2$, $SiN_x$, SiON, aluminum oxide ($Al_2O_3$), titanium oxide ($TiO_2$), tantalum oxide ($Ta_2O$), hafnium oxide ($HfO_2$), or zirconium oxide ($ZrO_2$). The gate insulating layer 115 may be disposed to overlap connecting electrodes (ACNE1 and ACNE2) and the gate electrodes GE.

A second conductive layer (or a gate conductive layer) may be positioned on the gate insulating layer 115 and may include the gate electrodes GE, gate metals WR, first connecting electrodes ACNE1, and second connecting electrodes ACNE2. The gate electrodes GE, the first connecting electrodes ACNE1, and the second connecting electrodes ACNE2 may be positioned in the display area DA and may be disposed to overlap the semiconductor parts of the semiconductor layer ACT. Referring to FIGS. 2 and 13, the gate metals WR may include parts of lines electrically connecting the connecting pads PD and the elements disposed in the display area DA, such as, for example, TFTs (e.g., the first, second, and third transistors T1, T2, and T3)

and light-emitting elements. For example, the gate metals WR may electrically connect the connecting pads PD to the data lines DTL. For example, data signals applied through the connecting pads PD may be provided to the data lines DTL through the gate metals WR.

The gate electrodes GE may overlap the first semiconductor parts of the semiconductor layer ACT. The first semiconductor parts may be spaced apart from the gate electrodes GE by the gate insulating layer 115.

The connecting electrodes (ACNE1 and ACNE2) may overlap, and be electrically connected to, the second semiconductor parts and the third semiconductor parts of the semiconductor layer ACT. The connecting electrodes (ACNE1 and ACNE2) may be connected to the lower light-blocking layer BML and the data lines DTL of the first conductive layer. The first connecting electrodes ACNE1 may be the drain electrodes of TFTs, and the second connecting electrodes ACNE2 may be the source electrodes of the TFTs. For example, the second semiconductor parts of the semiconductor layer ACT that are connected to the first connecting electrodes ACNE1 may be drain regions, and the third semiconductor parts of the semiconductor layer ACT that are connected to the second connecting electrodes ACNE2 may be source regions.

For adhesion to neighboring layers, surface flatness, and processability, the second conductive layer, i.e., the gate electrodes GE, the gate metals WR, the first connecting electrodes ACNE1, and the second connecting electrodes ACNE2, may include at least one of Al, Pt, palladium (Pd), Ag, Mg, Au, Ni, Nd, iridium (Ir), chromium (Cr), lithium (Li), calcium (Ca), Mo, Ti, tungsten (W), and Cu and may be formed as single- or multilayer films, but the disclosure is not limited thereto. In some embodiments, the second conductive layer may include a transparent conductive oxide (TCO). For example, the second conductive layer may include tungsten oxide ($W_xO_x$), $TiO_2$, ITO, IZO, ZnO, indium tin zinc oxide (ITZO), or magnesium oxide (MgO).

For example, the second conductive layer may have a structure in which Ti, Cu, and ITO are stacked each other, but the disclosure is not limited thereto.

A passivation layer 117 may be disposed on the second conductive layer. In some embodiments, the passivation layer 117 may be positioned in the display area DA and the non-display area NDA. In some embodiments, the passivation layer 117 may include an inorganic material such as $SiO_2$, $SiN_x$, SiON, $Al_2O_3$, $TiO_2$, $Ta_2O$, $HfO_2$, or $ZrO_2$.

A via layer 130 may be positioned on the passivation layer 117. The via layer 130 may cover the TFTs, in the display area DA, and may expose part of a power supply line VSL, in the non-display area NDA.

In some embodiments, the via layer 130 may be a planarization film. In some embodiments, the via layer 130 may be formed of an organic material. For example, the via layer 130 may include an acrylic resin, an epoxy resin, an imide resin, or an ester resin. In some embodiments, the via layer 130 may include a photosensitive organic material.

In the display area DA, first, second, and third anode electrodes AE1, AE2, and AE3 may be positioned on the via layer 130. The connecting electrodes (ACNE1 and ACNE2) and the connecting pads PD may be positioned on the via layer 130, in the non-display area NDA.

The first anode electrode AE1 may be positioned in the first light-emitting area LA1, and at least part of the first anode electrode AE1 may extend to the non-light-emitting area NLA. The second anode electrode AE2 may be disposed in the second light-emitting area LA2, and at least part of the second anode electrode AE2 may extend to the non-light-emitting area NLA. The third anode electrode AE3 may be disposed in the third light-emitting area LA3, and at least part of the third anode electrode AE3 may extend to the non-light-emitting area NLA.

The first anode electrode AE1 may be connected to the drain region of the TFT corresponding to the first anode electrode AE1 through the via layer 130, the second anode electrode AE2 may be connected to the drain region of the TFT corresponding to the second anode electrode AE2 through the via layer 130, and the third anode electrode AE3 may be connected to the drain region of the TFT corresponding to the third anode electrode AE3 through the via layer 130. The first, second, and third anode electrodes AE1, AE2, and AE3 may be connected to the drain regions of the TFTs (or the second semiconductor parts) through the first connecting electrodes ACNE1 (or the drain electrodes).

In some embodiments, the first, second, and third anode electrodes AE1, AE2, and AE3 may be reflective electrodes, in which case, the first, second, and third anode electrodes AE1, AE2, and AE3 may be metal layers including a metal such as Ag, Mg, Al, Pt, Pd, Au, Ni, Nd, Ir, or Cr. In some embodiments, the first, second, and third anode electrodes AE1, AE2, and AE3 may further include metal oxide layers deposited on the metal layers. The first, second, and third anode electrodes AE1, AE2, and AE3 may have a multilayer stack structure, for example, a double-layer structure such as ITO/Ag, Ag/ITO, ITO/Mg, or ITO/MgF or a triple-layer structure such as ITO/Ag/ITO.

The connecting electrodes (ACNE1 and ACNE2) may be electrically connected to, and/or in direct contact with, the power supply line VSL, in the non-display area NDA. Although not specifically illustrated, in some embodiments, the connecting electrodes (ACNE1 and ACNE2) may be disposed in the display area DA and may be electrically connected to the power supply line VSL, in the display area DA.

The connecting pads PD may be disposed in the non-display area NDA and may be electrically connected to the gate metals WR of the second conductive layer.

The pixel-defining film 150 may be positioned on the first, second, and third anode electrodes AE1, AE2, and AE3. The pixel-defining film 150 may include openings, which expose the first, second, and third anode electrodes AE1, AE2, and AE3, and may define the first, second, and third light-emitting areas LA1, LA2, and LA3. For example, part of the first anode electrode AE1 that is not covered, but exposed by the pixel-defining film 150 may be the first light-emitting area LA1, part of the second anode electrode AE2 that is not covered, but exposed by the pixel-defining film 150 may be the second light-emitting area LA2, and part of the third anode electrode AE3 that is not covered, but exposed by the pixel-defining film 150 may be the third light-emitting area LA3. An area where the pixel-defining film 150 is disposed may be the non-light-emitting area NLA.

In some embodiments, the pixel-defining film 150 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or benzocyclobutene (BCB).

The pixel-defining film 150 may overlap a light-blocking pattern 250 that will be described. In some embodiments, the pixel-defining film 150 may also overlap a bank pattern 370 that will be described.

Referring to FIGS. 10 and 13, a light-emitting layer OL may be disposed on the first, second, and third anode electrodes AE1, AE2, and AE3.

In some embodiments, the light-emitting layer OL may be in the form of a film formed continuously over the first, second, and third light-emitting areas LA1, LA2, and LA3 and the non-light-emitting area NLA. In some embodiments, the light-emitting layer OL may be positioned only in the display area DA, but the disclosure is not limited thereto. In some embodiments, part of the light-emitting layer OL may be further disposed in the non-display area NDA. The light-emitting layer OL will be described later in detail.

The cathode electrode CE may be positioned on the light-emitting layer OL. Part of the cathode electrode CE may be further disposed in the non-display area NDA. The cathode electrode CE may be electrically connected to, and in contact with, the connecting electrodes (ACNE1 and ACNE2), in the non-display area NDA. A driving voltage (power supply voltage of FIG. 3) provided to the power supply line VSL may be transmitted to the cathode electrode CE through the connecting electrodes (ACNE1 and ACNE2).

In some embodiments, the cathode electrode CE may be semitransparent or transparent. In a case where the cathode electrode CE is semitransparent, the cathode electrode CE may include Ag, Mg, Cu, Al, Pt, Pd, Au, Ni, Nd, Ir, Cr, Li, Ca, LiF/Ca, LiF/Al, Mo, Ti, or a compound or mixture thereof, for example, the mixture of Ag and Mg. In a case where the cathode electrode CE has a thickness of tens to hundreds of angstroms, the cathode electrode CE may be semitransparent.

In a case where the cathode electrode CE is transparent, the cathode electrode CE may include TCO. For example, the cathode electrode CE may include $W_xO_x$, $TiO_2$, ITO, IZO, ZnO, ITZO, or MgO.

In some embodiments, the cathode electrode CE may completely cover the light-emitting layer OL. In some embodiments, as illustrated in FIG. 13, the end of the cathode electrode CE may be positioned on the outside of the end of the light-emitting layer OL, and the end of the light-emitting layer OL may be completely covered by the cathode electrode CE.

The first anode electrode AE1, the light-emitting layer OL, and the cathode electrode CE may form a first light-emitting element ED1, the second anode electrode AE2, the light-emitting layer OL, and the cathode electrode CE may form a second light-emitting element ED2, and the third anode electrode AE3, the light-emitting layer OL, and the cathode electrode CE may form a third light-emitting element ED3. The first, second, and third light-emitting elements ED1, ED2, and ED3 may emit emission light LE.

As illustrated in FIG. 11, the emission light LE, which is emitted from the light-emitting layer OL, may be mixed light having first and second components LE1 and LE2 mixed therein. The first and second components LE1 and LE2 may have a peak wavelength in a range of about 440 nm to about 480 nm. For example, the emission light LE may be blue light.

As illustrated in FIG. 11, in some embodiments, the light-emitting layer OL may have, for example, a tandem structure in which multiple light emission layers are stacked each other, as illustrated in FIG. 7. For example, the light-emitting layer OL may include a first stack ST1, which includes a first light emission layer EML1, a second stack ST2, which is positioned on the first stack ST1 and includes a second light emission layer EML2, a third stack ST3, which is positioned on the second stack ST2 and includes a third light emission layer EML3, a first charge generation layer CGL1, which is positioned between the first and second stacks ST1 and ST2, and a second charge generation layer CGL2, which is positioned between the second and third stacks ST2 and ST3. The first, second, and third stacks ST1, ST2, and ST3 may be disposed to overlap one another.

The first, second, and third light emission layers EML1, EML2, and EML3 may be disposed to overlap each other.

In some embodiments, the first, second, and third light emission layers EML1, EML2, and EML3 may all emit light of blue wavelength light. For example, the first, second, and third light emission layers EML1, EML2, and EML3 may all be blue-light emission layers and may include an organic material.

In some embodiments, at least one of the first, second, and third light emission layers EML1, EML2, and EML3 may emit first blue light having a first peak wavelength, and at least another one of the first, second, and third light emission layers EML1, EML2, and EML3 may emit second blue light having a second peak wavelength, which is different from the first peak wavelength. For example, one of the first, second, and third light emission layers EML1, EML2, and EML3 may emit the first blue light having the first peak wavelength, and the other two light emission layers may emit the second blue light having the second peak wavelength. For example, the emission light LE, which is emitted from the light-emitting layer OL, may be mixed light having the first and second components LE1 and LE2 mixed therein, the first component LE1 may be the first blue light having the first peak wavelength, and the second component LE2 may be the second blue light having the second peak wavelength.

In some embodiments, one of the first and second peak wavelengths may range between about 440 nm and about 460 nm, and another peak wavelength may range between about 460 nm and about 480 nm. However, the disclosure is not limited to this. In some embodiments, the first and second peak wavelengths may both include 460 nm. In some embodiments, one of the first blue light and the second blue light may be deep-blue light, and another blue light may be sky-blue light.

In some embodiments, the emission light LE may be blue light and may include long- and short-wavelength components. Thus, the light-emitting layer OL may emit blue light with a broad emission peak as the emission light LE. Accordingly, color visibility at side viewing angles may be improved, as compared to conventional light-emitting elements emitting blue light with a sharp emission peak.

In some embodiments, each of the first, second, and third light emission layers EML1, EML2, and EML3 may include a host and a dopant. The material of the host is not particularly limited. For example, tris(8-hydroxyquinolino) aluminum ($Alq_3$), 4,4'-bis(N-carbazolyl)-1,1'-biphenyl (CBP), poly(n-vinylcarbazole) (PVK), 9,10-di(naphthalene-2-yl)anthracene (ADN), 4,4',4''-Tris(carbazol-9-yl)-triphenylamine (TCTA), 1,3,5-tris(N-phenylbenzimidazole-2-yl) benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN) may be used as a host.

For example, the first, second, and third light emission layers EML1, EML2, and EML3, which emit blue light, may include a fluorescent material selected from the group consisting of spiro-DPVBi, spiro-6P, distyryl benzene (DSB), distyryl arylene (DSA), a polyfluorene (PFO)-based polymer, and poly(p-phenylene vinylene (PPV). In another example, the first, second, and third light emission layers EML1, EML2, and EML3 may include a phosphorescent material including an organometallic complex such as (4,6-F2ppy)$_2$Irpic.

As already mentioned above, at least one of the first, second, and third light emission layers EML1, EML2, and EML3 may emit blue light having a different wavelength range from at least another one of the first, second, and third light emission layers EML1, EML2, and EML3. To emit blue light of different wavelength ranges, the first, second, and third light emission layers EML1, EML2, and EML3 may include a same material, and a method of controlling a resonance distance may be used. In another embodiment, to emit blue light of different wavelength ranges, at least two of the first, second, and third light emission layers EML1, EML2, and EML3 may include different materials.

However, the disclosure is not limited to this. In another embodiment, the first, second, and third light emission layers EML1, EML2, and EML3 may all emit blue light having a peak wavelength in a range of about 440 nm to about 480 nm and may be formed of a same material.

In another embodiment, one of the first, second, and third light emission layers EML1, EML2, and EML3 may emit the first blue light having the first peak wavelength, another one of the first, second, and third light emission layers EML1, EML2, and EML3 may emit the second blue light having the second peak wavelength, which is different from the first peak wavelength, and the other light emission layer may emit third blue light having a third peak wavelength, which is different from the first and second peak wavelengths. In some embodiments, one of the first, second, and third peak wavelengths may range between about 440 nm and about 460 nm, and another one of the first, second, and third peak wavelengths may range between about 460 nm and about 470 nm, and the other peak wavelength may range between about 470 nm and about 480 nm.

In some embodiments, the emission light LE, which is emitted from the light-emitting layer OL, may be blue light and may include long-, intermediate-, and short-wavelength components. Thus, the light-emitting layer OL may emit blue light having abroad emission peak as the emission light LE and may improve color visibility at side viewing angles.

The light-emitting elements of the display device 1 may improve an optical efficiency as compared to conventional light-emitting elements not employing a tandem structure in which multiple light emission layers are stacked each other, and may lengthen the life of the display device 1.

In another embodiment, at least one of the first, second, and third light emission layers EML1, EML2, and EML3 may emit light of the third color, for example, blue light, at least another one of the first, second, and third light emission layers EML1, EML2, and EML3 may emit light of the second color, for example, green light. The peak wavelength of blue light emitted by at least one of the first, second, and third light emission layers EML1, EML2, and EML3 may range between about 440 nm and about 480 nm or between about 460 nm and about 480 nm, and the peak wavelength of green light emitted by at least another one of the first, second, and third light emission layers EML1, EML2, and EML3 may range between about 510 nm and about 550 nm.

For example, one of the first, second, and third light emission layers EML1, EML2, and EML3 may be a green-light emission layer emitting green light, and other two light emission layers may be blue-light emission layers emitting blue light. The peak wavelength range of blue light emitted by one of the two blue-light emission layers may coincide with, or differ from, the peak wavelength range of blue light emitted by the other blue-light emission layer.

In another embodiment, the emission light LE, which is emitted from the light-emitting layer OL, may be mixed light having the first and second components LE1 and LE2 mixed therein, and the first and second components LE1 and LE2 may be blue light and green light, respectively. For example, in a case where the first and second components LE1 and LE2 are deep-blue light and green light, respectively, the emission light LE may be sky-blue light. The emission light LE, which is emitted from the light-emitting layer OL, may be a mixture of blue light and green light and may include long- and short-wavelength components. Thus, the light-emitting layer OL may emit blue light with a broad emission peak as the emission light LE and may improve color visibility at side viewing angles. Also, as the second component LE2 of the emission light LE is green light, the green-light component of light to be emitted to the outside of the display device 1 may be compensated for, and as a result, the color reproducibility of the display device 1 may be improved.

In some embodiments, a green-light emission layer among the first, second, and third light emission layers EML1, EML2, and EML3 may include a host and a dopant. The material of the host of the green-light emission layer is not particularly limited. The host of the green-light emission layer may include, for example, $Alq_3$, 4,4'-bis(N-carbazolyl)-1,1'-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

The dopant of the green-light emission layer may include, for example, a fluorescent material containing $Alq_3$ or a phosphorescent material such as fac-tris(2-phenylpyridine) iridium ($Ir(ppy)_3$), bis(2-phenylpyridine)(acetylacetonate) iridium(III) ($Ir(ppy)_2(acac)$), or 2-phenyl-4-methyl-pyridine iridium ($Ir(mpyp)_3$).

The first charge generation layer CGL1 may be located between the first and second stacks ST1 and ST2. The first charge generation layer CGL1 may inject electric charge into the light-emitting layer OL. The first charge generation layer CGL1 may balance electric charge between the first and second stacks ST1 and ST2. The first charge generation layer CGL1 may include an n-type charge generation layer CGL11 and a p-type charge generation layer CGL12. The p-type charge generation layer CGL12 may be disposed on the n-type charge generation layer CGL11 and may be located between the n-type charge generation layer CGL11 and the second stack ST2.

The first charge generation layer CGL1 may have a structure in which the n-type charge generation layer CGL11 and the p-type charge generation layer CGL12 are bonded together. The n-type charge generation layer CGL11 may be disposed closer to the first anode electrode AE1 than the p-type charge generation layer CGL12. The p-type charge generation layer CGL12 may be disposed closer to the cathode electrode CE than the n-type charge generation layer CGL11. The n-type charge generation layer CGL11 may provide electrons to the first light emission layer EML1, which is adjacent to the first anode electrode AE1, and the p-type charge generation layer CGL12 may provide holes to the second light emission layer EML2, which is included in the second stack ST2. As the first charge generation layer CGL1 is disposed between the first and second stacks ST1 and ST2 and provides charge to the light-emitting layer OL, an emission efficiency may be improved, and a driving voltage may be lowered.

The first stack ST1 may be positioned on the first, second, and third anode electrodes AE1, AE2, and AE3 (shown in FIG. 10) and may further include a first hole transport layer HTL1, a first electron blocking layer BIL1, and a first electron transport layer ETL1.

The first hole transport layer HTL1 may be positioned on the first, second, and third anode electrodes AE1, AE2, and AE3. The first hole transport layer HTL1 may facilitate the transport of holes and may include a hole transport material. The hole transport material may include a carbazole derivative such as N-phenylcarbazole or polyvinylcarbazole, a fluorene derivative, a triphenylamine derivative such as N,N'-bis(3-methylphenyl)-N,N'-diphenyl-[1,1-biphenyl]-4,4'-diamine (TPD) or TCTA, N,N'-di(1-naphthyl)-N,N'-diphenylbenzidine (NPB), or 4,4'-Cyclohexylidene bis[N,N-bis(4-methylphenyl)benzenamine] (TAPC), but the disclosure is not limited thereto.

The first electron blocking layer BIL1 may be positioned on the first hole transport layer HTL1, between the first hole transport layer HTL1 and the first light emission layer EML1. The first electron blocking layer BIL1 may include a hole transport material and a metal (or a metal compound) to prevent electrons generated in the first light emission layer EML1 from spilling over to the first hole transport layer HTL1. In some embodiments, the first hole transport layer HTL1 and the first electron blocking layer BIL1 may be incorporated into a single layer.

The first electron transport layer ETL1 may be positioned on the first light emission layer EML1, between the first charge generation layer CGL1 and the first light emission layer EML1. In some embodiments, the first electron transport layer ETL1 may include an electron transport material such as $Alq_3$, TPBi, 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), (2-(4-Biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum) (BAlq), berylliumbis(benzoquinolin-10-olate) (Bebg2), AND, or a mixture thereof, but the disclosure is not limited thereto. The second stack ST2 may be positioned on the first charge generation layer CGL1 and may further include a second hole transport layer HTL2, a second electron blocking layer BIL2, and a second electron transport layer ETL2.

The second hole transport layer HTL2 may be positioned on the first charge generation layer CGL1. The second hole transport layer HTL2 may be formed of the same material, and have the same structure, as the first hole transport layer HTL1 and may include at least one selected from the above-described materials that may be included in the first hole transport layer HTL1. The second hole transport layer HTL2 may be formed as a single-layer film or a multilayer film.

The second electron blocking layer BIL2 may be positioned on the second hole transport layer HTL2, between the second hole transport layer HTL2 and the first light emission layer EML1. The second electron blocking layer BIL2 may be formed of the same material, and have the same structure, as the first electron blocking layer BIL1 and may include at least one selected from the above-described materials that may be included in the first electron blocking layer BILL.

The second electron transport layer ETL2 may be positioned on the second light emission layer EML2, between the second charge generation layer CGL2 and the second light emission layer EML2. The second electron transport layer ETL2 may be formed of the same material, and have the same structure, as the first electron transport layer ETL1 and may include at least one selected from the above-described materials that may be included in the first electron transport layer ETL1. The second electron transport layer ETL2 may be formed as a single-layer film or a multilayer film.

The second charge generation layer CGL2 may be positioned on the second stack ST2, between the second and third stacks ST2 and ST3.

The second charge generation layer CGL2 may have the same structure as the first charge generation layer CGL1. For example, the second charge generation layer CGL2 may include an n-type charge generation layer CGL21, which is adjacent to the second stack ST2, and a p-type charge generation layer CGL22, which is adjacent to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are bonded together. The first and second charge generation layers CGL1 and CGL2 may be formed of different materials or of a same material.

The second stack ST2 may be positioned on the second charge generation layer CGL2 and may further include a third hole transport layer HTL3 and a third electron transport layer ETL3.

The third hole transport layer HTL3 may be positioned on the second charge generation layer CGL2. The third hole transport layer HTL3 may be formed of the same material, and have the same structure, as the first hole transport layer HTL1 or may include at least one selected from the above-described materials that may be included in the first hole transport layer HTL1. The third hole transport layer HTL3 may be formed as a single-layer film or a multilayer film. In a case where the third hole transport layer HTL3 consists of multiple layers, the multiple layers may include different materials.

The third electron transport layer ETL3 may be positioned on the third light emission layer EML3, between the cathode electrode CE and the third light emission layer EML3. The third electron transport layer ETL3 may be formed of the same material, and have the same structure, as the first electron transport layer ETL1 and may include at least one selected from the above-described materials that may be included in the first electron transport layer ETL1. The third electron transport layer ETL3 may be formed as a single-layer film or a multilayer film. In a case where the third electron transport layer ETL3 consists of multiple layers, the multiple layers may include different materials.

Although not specifically illustrated, a hole injection layer may be further positioned between the first stack ST1 and the first, second, or third anode electrode AE1, AE2, and AE3, between the second stack ST2 and the first charge generation layer CGL1, and/or between the third stack ST3 and the second charge generation layer CGL2. The hole injection layer may facilitate injection of holes into the first, second, and third light emission layers EML1, EML2, and EML3. In some embodiments, the hole injection layer may be formed of at least one selected from the group consisting of copper phthalocyanine (CuPc), poly(3,4)-ethylenedioxythiophene (PEDOT), polyaniline (PANI), and N,N-dinaphthyl-N,N'-diphenyl benzidine (NPD), but the disclosure is not limited thereto. In some embodiments, multiple hole injection layers may be positioned between the first stack ST1 and the first, second, or third anode electrode AE1, AE2, and AE3, between the second stack ST2 and the first charge generation layer CGL1, and/or between the third stack ST3 and the second charge generation layer CGL2.

Although not specifically illustrated, an electron injection layer may be further positioned between the third electron transport layer ETL3 and the cathode electrode CE, between the second charge generation layer CGL2 and the second stack ST2, and/or between the first charge generation layer CGL1 and the first stack ST1. The electron injection layer may facilitate injection of electrons and may be formed of $Alq_3$, PBD, TAZ, spiro-PBD, BAlq, or SAlq, but the disclosure is not limited thereto. The electron injection layer may include a metal halide compound, for example, at least one selected from the group consisting of $MgF_2$, LiF, NaF, KF, RbF, CsF, FrF, LiI, NaI, KI, RbI, CsI, FrI, and $CaF_2$, but the disclosure is not limited thereto. The electron injection layer may include a lanthanum (La)-based material such as Yb, Sm, or Eu or may include both a metal halide material such as RbI:Yb or KI:Yb and the La-based material. In a case where the electron injection layer includes both the metal halide material and the La-based material, the electron injection layer may be formed by co-depositing the metal halide material and the La-based material. In some embodiments, multiple electron injection layers may be positioned between the third electron transport layer ETL3 and the cathode electrode CE, between the second charge generation layer CGL2 and the second stack ST2, and/or between the first charge generation layer CGL1 and the first stack ST1.

The structure of the light-emitting layer OL may vary. For example, the light-emitting layer OL may be modified into a light-emitting layer OLa of FIG. 12. Referring to FIG. 12, the light-emitting layer OLa, unlike its counterpart of FIG. 11, may further include a fourth stack ST4 on a third stack ST3 and a third charge generation layer CGL3 between the third and fourth stacks ST3 and ST4.

The fourth stack ST4 may include a fourth light emission layer EML4 and may further include a fourth hole transport layer HTL4 and a fourth electron transport layer ETL4.

A first light emission layer EML1, a second light emission layer EML2, a third light emission layer EML3, and the fourth light emission layer EML4 may emit light of the first color, for example, blue light. At least two of the first, second, third, and fourth light emission layers EML1, EML2, EML3, and EML4 may emit blue light of different peak wavelengths.

In another embodiment, at least one of the first, second, third, and fourth light emission layers EML1, EML2, EML3, and EML4 may emit green light, and at least another one of the first, second, third, and fourth light emission layers EML1, EML2, EML3, and EML4 may emit blue light. For example, one of the first, second, third, and fourth light emission layers EML1, EML2, EML3, and EML4 may be a green-light emission layer, and other light emission layers may be blue-light emission layers.

In another embodiment, the fourth light emission layer EML4 may be a green-light emission layer, and the first, second, and third light emission layers EML1, EML2, and EML3 may be blue-light emission layers.

The fourth hole transport layer HTL4 may be positioned on a third charge generation layer CGL3. The fourth hole transport layer HTL4 may be formed of the same material, and have the same structure, as a first hole transport layer HTL1 or may include at least one selected from the above-mentioned materials that may be included in the first hole transport layer HTL1. The fourth hole transport layer HTL4 may be formed as a single-layer film or a multilayer film. In a case where the fourth hole transport layer HTL4 consists of multiple layers, the multiple layers may include different materials.

In the embodiment of FIG. 12, the third stack ST3 may further include a third electron blocking layer BIL3. The third electron blocking layer BIL3 may be positioned on the third hole transport layer HTL3, between the third hole transport layer HTL3 and the third light emission layer EML3. The third electron blocking layer BIL3 may be formed of the same material, and have the same structure, as the first electron blocking layer BIL1 or may include at least one selected from the above-mentioned materials that may be included in the first electron blocking layer BILL. In some embodiments, the third electron blocking layer BIL3 may be omitted. Although not illustrated, the fourth stack ST4 may include a fourth electron blocking layer BIL4 on the fourth hold transport layer HTL4, between the fourth hole transport layer HTL4 and the fourth light emission layer EML4. The fourth electron blocking layer BIL4 may be formed of the same material, and have the same structure, as the first electron blocking layer BIL1 or may include at least one selected from the above-mentioned materials that may be included in the first electron blocking layer BILL.

The fourth electron transport layer ETL4 may be positioned on the fourth light emission layer EML4, between the cathode electrode CE and the fourth light emission layer EML4. The fourth electron transport layer ETL4 may be formed of the same material, and have the same structure, as the first electron transport layer ETL1 or may include at least one selected from the above-mentioned materials that may be included in the first electron transport layer ETL1. The fourth electron transport layer ETL4 may be formed as a single-layer film or a multilayer film. In a case where the fourth electron transport layer ETL4 consists of multiple layers, the multiple layers may include different materials.

The third charge generation layer CGL3 may have the same structure as a first charge generation layer CGL1. For example, the third charge generation layer CGL3 may include an n-type charge generation layer CGL31, which is disposed adjacent to the third stack ST3, and a p-type charge generation layer CGL32, which is disposed adjacent to the cathode electrode CE. The p-type charge generation layer CGL32 may be disposed on the n-type charge generation layer CGL31.

Although not specifically illustrated, an electron injection layer may be further positioned between the fourth stack ST4 and the cathode electrode CE, and a hole injection layer may be further positioned between the fourth stack ST4 and the third charge generation layer CGL3.

In some embodiments, both the light-emitting layer OL of FIG. 9 and the light-emitting layer Ola of FIG. 10 may not include red-light emission layers and may not emit light of the first color, for example, red light. For example, the emission light LE may not include components having a peak wavelength in a range of about 610 nm to about 650 nm, and may include only components having a peak wavelength in a range of about 440 nm to about 550 nm.

Referring to FIG. 13, the dam member DM may be positioned on the passivation layer 117, in the non-display area NDA.

The dam member DM may be positioned on the outside of the power supply line VSL. In other words, as illustrated in FIG. 13, the power supply line VSL may be positioned between the dam member DM and the display area DA. The power supply line VSL may be disposed in the first conductive layer.

In some embodiments, the dam member DM may include multiple dams. For example, the dam member DM may include first and second dams D1 and D2.

The first dam D1 may partially overlap the power supply line VSL in the third direction Z and may be spaced apart from the via layer 130 with the power supply line VSL interposed therebetween. In some embodiments, the first dam 1 may include a first lower dam pattern D11, which is positioned on the second insulating layer 117, and a first upper dam pattern D12, which is positioned on the first lower dam pattern D11.

The second dam D2 may be positioned on the outside of the first dam D1 and may be spaced apart from the first dam D1. In some embodiments, the second dam D2 may include a second lower dam pattern D21, which is positioned on the second insulating layer 117, and a second upper dam pattern D22, which is positioned on the second lower dam pattern D21.

In some embodiments, the first and second lower dam patterns D11 and D21 and the via layer 130 may be formed of a same material and may be formed at the same time.

In some embodiments, the first and second upper dam patterns D12 and D22 and the pixel-defining film 150 may be formed of a same material and may be formed at the same time.

In some embodiments, the first and second dams D1 and D2 may have different heights. For example, the second dam D2 may be higher than the first dam D1. For example, the height of the dam member DM may gradually increase as spacing away from the display area DA. Accordingly, the dam member DM may effectively prevent the spill of an organic material during the formation of an organic layer 173 of the encapsulation layer 170.

Referring to FIGS. 10 and 13, a first capping layer 160 may be positioned on the cathode electrode CE. The first capping layer 160 may be disposed in common in the first, second, and third light-emitting areas LA1, LA2, and LA3 and the non-light-emitting area NLA. The first capping layer 160 may improve viewing angle characteristics and may increase external luminous efficiency.

The first capping layer 160 may include at least one of inorganic and organic materials having light transmittance. For example, the first capping layer 160 may be formed as an inorganic layer, an organic layer, or an organic layer including inorganic particles. For example, the first capping layer 160 may include a triamine derivative, a carbazole biphenyl derivative, an arylenediamine derivative, or an aluminum quinoline complex (e.g., $Alq_3$).

The first capping layer 160 may be formed of a mixture of a high refractive material and a low refractive material. In another embodiment, the first capping layer 160 may include two layers having different refractive indexes, for example, a high refractive index layer and a low refractive index layer.

In some embodiments, the first capping layer 160 may completely cover the cathode electrode CE. In some embodiments, as illustrated in FIG. 13, the end of the first capping layer 160 may be positioned on the outside of the end of the cathode electrode CE, and the end of the cathode electrode CE may be completely covered by the first capping layer 160.

The encapsulation layer 170 may be disposed on the first capping layer 160. The encapsulation layer 170 may protect the elements disposed therebelow, for example, the first, second, and third light-emitting elements ED1, ED2, and ED3, from a foreign material such as moisture. The encapsulation layer 170 may be disposed in common in the first, second, and third light-emitting areas LA1, LA2, and LA3 and the non-light-emitting area NLA. In some embodiments, the encapsulation layer 170 may directly cover the cathode electrode CE. The encapsulation layer 170 may be a thin-film encapsulation (TFE) layer.

In some embodiments, the encapsulation layer 170 may include a lower inorganic layer 171, the organic layer 173, and an upper inorganic layer 175, which are sequentially stacked.

In some embodiments, the lower inorganic layer 171 may cover the first, second, and third light-emitting elements ED1, ED2, and ED3, in the display area DA. The lower inorganic layer 171 may cover the dam member DM and extend to the outside of the dam member DM, in the non-display area NDA.

In some embodiments, the lower inorganic layer 171 may completely cover the first capping layer 160. In some embodiments, the end of the lower inorganic layer 171 may be positioned on the outside of the end of the first capping layer 160, and the end of the first capping layer 160 may be completely covered by the lower inorganic layer 171.

The lower inorganic layer 171 may include a stack of multiple films. The organic layer 173 may be positioned on the lower inorganic layer 171. The organic layer 173 may cover the first, second, and third light-emitting elements ED1, ED2, and ED3, in the display are DA. In some embodiments, part of the organic layer 173 may be positioned in the non-display area NDA, but may not extend over the dam member DM. Part of the organic layer 173 is illustrated as being disposed on the inside of the first dam D1, but the disclosure is not limited thereto. In some embodiments, part of the organic layer 173 may be disposed in the space between the first and second dams D1 and D2, and the end of the organic layer 173 may be positioned between the first and second dams D1 and D2.

The upper inorganic layer 175 may be positioned on the organic layer 173. The upper inorganic layer 175 may cover the organic layer 173. In some embodiments, in the non-display area NDA, the upper inorganic layer 175 may be in direct contact with the lower inorganic layer 171 to form inorganic-inorganic bonds. In some embodiments, the ends of the upper and lower inorganic layers 175 and 171 may be substantially aligned with each other. The upper inorganic layer 175 may include a stack of multiple films.

In some embodiments, the lower inorganic layer 171 and the upper inorganic layer 175 may be formed of silicon nitride, aluminum nitride, zirconium nitride, titanium nitride, hafnium nitride, tantalum nitride, silicon oxide, aluminum oxide, titanium oxide, tin oxide, cerium oxide, SiON, or lithium fluoride, but the disclosure is not limited thereto.

In some embodiments, the organic layer 173 may be formed of an acrylic resin, a methacrylic resin, polyisoprene, a vinyl resin, an epoxy resin, a urethane resin, a cellulose resin, or a perylene resin, but the disclosure is not limited thereto.

The color conversion substrate 30 will hereinafter be described with reference to FIGS. 14 through 16 and further to FIGS. 1 through 13.

Figure 14:
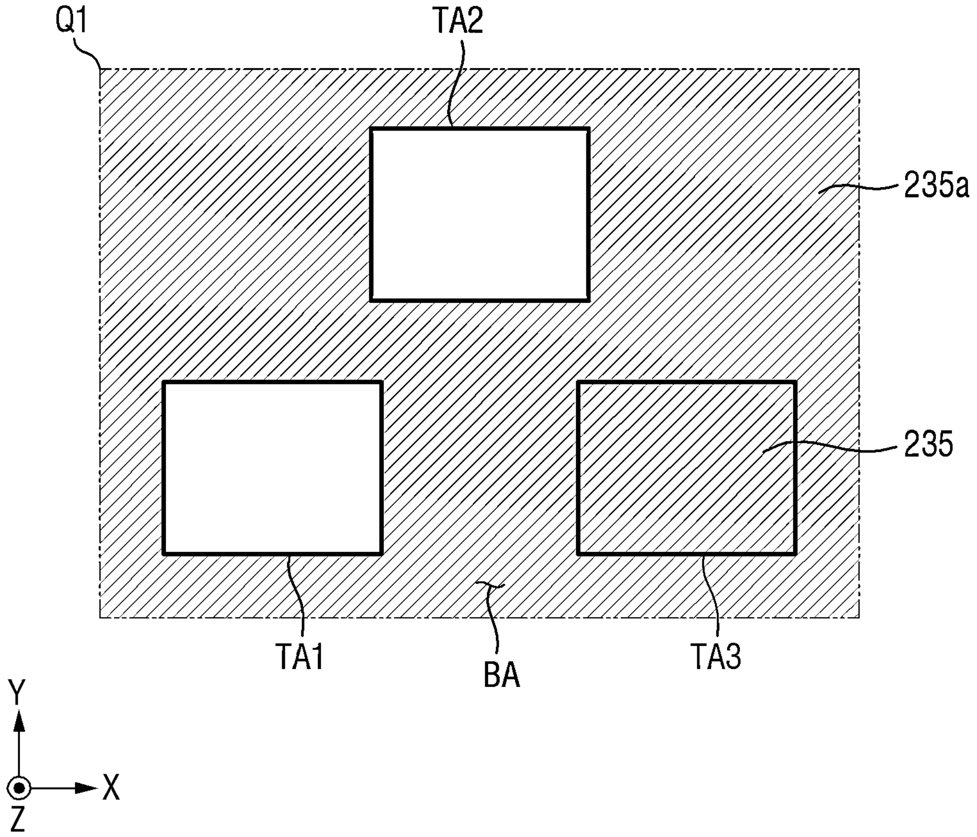
FIG. 14 is a plan view illustrating a layout of third color filters in the color conversion substrate of the display device of FIG. 1.

FIG. 14 is a plan view illustrating a layout of third color filters in the color conversion substrate of the display device of FIG. 1. FIG. 15 is a plan view illustrating a layout of first color filters in the color conversion substrate of the display device of FIG. 1. FIG. 16 is a plan view illustrating a layout of second color filters in the color conversion substrate of the display device of FIG. 1.

Referring to FIGS. 10 and 13, the second base part 310 may be formed of a material having light transmittance.

In some embodiments, the second base part 310 may include a glass substrate or a plastic substrate. In some embodiments, the second base part 310 may further include an additional layer on the glass substrate or the plastic substrate, such as an insulating layer (e.g., an inorganic film).

In some embodiments, the light-transmitting areas (TA1, TA2, and TA3) and the light-blocking area BA may be defined on the second base part 310. In a case where the second base part 310 includes a glass substrate, the refractive index of the second base part 310 may be about 1.5.

Referring to FIGS. 10 and 13, a color filter layer may be disposed on a surface of the second base part 310 that faces the display substrate 10. The color filter layer may include color filters (231, 233, and 235) and the light-blocking pattern 250.

Referring to FIGS. 10, 13, and 14 through 16, the color filters (231, 233, and 235) may be disposed to overlap the light-transmitting areas (TA1, TA2, and TA3). The light-blocking pattern 250 may be disposed to overlap the light-blocking area BA in the third direction Z. A first color filter 231 may overlap the first light-transmitting area TA1, a second color filter 233 may overlap the second light-transmitting area TA2, and a third color filter 235 may overlap the third light-transmitting area TA3. The light-blocking pattern 250 may be disposed to overlap the light-blocking area BA and may block the transmission of light. In some embodiments, the light-blocking pattern 250 may be arranged substantially in a lattice shape in a plan view. The light-blocking pattern 250 may include a first light-blocking pattern part 235*a* on the surface of the second base part 310, a second light-blocking pattern part 231*a* on the first light-blocking pattern part 235*a*, and a third light-blocking pattern part 233*a* on the second light-blocking pattern part 231*a*. The first light-blocking pattern part 235*a* may include the same material as the third color filter 235, the second light-blocking pattern part 231*a* may include the same material as the first color filter 231, and the third light-blocking pattern part 233*a* may include the same material as the second color filter 233. For example, in the light-blocking area BA, the light-blocking pattern 250 may have a structure in which the first, second, and third light-blocking pattern parts 235*a*, 231*a*, and 233*a* are sequentially stacked. As external light La is incident upon the light-blocking area BA, as illustrated in FIG. 10, all the external light La except for light of the third color, i.e., light of the first and second colors, may be absorbed by the first light-blocking pattern part 235*a*, and light of the third color may be absorbed by the second and third light-blocking pattern parts 231*a* and 233*a*. Although not specifically illustrated, some of the external light La, i.e., light of the third color, may not pass through the first light-blocking pattern part 235*a*, but may be reflected from the interface between the first light-blocking pattern part 235*a* and the second base part 310.

In some embodiments, the light-blocking pattern 250 may include an organic light-blocking material and may be formed by coating and exposing the organic light-blocking material. For example, the organic light-blocking material may include a black matrix.

The first color filter 231 may function as a blocking filter for blocking blue light and green light. In some embodiments, the first color filter 231 may selectively transmit light of the first color (e.g., red light) therethrough and may block or absorb light of the second color (e.g., green light) and light of the third color (e.g., blue light). For example, the first color filter 231 may be a red color filter and may include a red colorant. The first color filter 231 may include a base resin and a red colorant dispersed in the base resin.

The second color filter 233 may function as a blocking filter for blocking blue light and red light. In some embodiments, the second color filter 233 may selectively transmit light of the second color (e.g., green light) therethrough and may block or absorb light of the first color (e.g., red light) and light of the third color (e.g., blue light). For example, the second color filter 233 may be a green color filter and may include a green colorant. The second color filter 233 may include a base resin and a green colorant dispersed in the base resin.

The third color filter 235 may selectively transmit light of the third color (e.g., blue light) therethrough and may block or absorb light of the first color (e.g., red light) and light of the second color (e.g., green light). For example, the third color filter 235 may be a blue color filter and may include a blue colorant such as a blue dye or a blue pigment. The term "colorant", as used herein, encompasses both a dye and a pigment.

Referring to FIGS. 10 and 13, a low refractive index layer 391, which covers the light-blocking pattern 250 and the first, second, and third color filters 231, 233, and 235, may be positioned on the second base part 310. In some embodiments, the low refractive index layer 391 may be in direct contact with the first, second, and third color filters 231, 233, and 235. In some embodiments, the low refractive index layer 391 may be in direct contact with the light-blocking pattern 250.

The low refractive index layer 391 may have a refractive index lower than first and second wavelength shifting patterns 340 and 350 and a light-transmitting pattern 330. For example, the low refractive index layer 391 may be formed of an inorganic material. For example, the low refractive index layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. In some embodiments, multiple hollow particles may be formed in the low refractive index layer 391 to lower the refractive index of the low refractive index layer 391.

A low refractive index capping layer 392 may be further disposed between the low refractive index layer 391 and the first and second wavelength shifting patterns 340 and 350 and the light-transmitting pattern 330. In some embodiments, the low refractive index capping layer 392 may be in direct contact with the first wavelength shifting pattern 340, the second wavelength shifting pattern 350, and the light-transmitting pattern 330. In some embodiments, the low refractive index capping layer 392 may be in direct contact with the bank pattern 370.

The low refractive index capping layer 392 may have a refractive index lower than the first wavelength shifting pattern 340, the second wavelength shifting pattern 350, and the light-transmitting pattern 330. For example, the low refractive index capping layer 392 may be formed of an inorganic material. For example, the low refractive index capping layer 392 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. In some embodiments, multiple hollow particles may be formed in the low refractive index capping layer 392 to lower the refractive index of the low refractive index capping layer 392.

The low refractive index capping layer 392 may prevent the first, second, and third color filters 231, 233, and 235 from being damaged by, or contaminated with, impurities from the outside, such as moisture or the air. The low refractive index capping layer 392 may prevent the colorants of the first, second, and third color filters 231, 233, and 235 from diffusing into other elements such as, for example, the first and second wavelength shifting patterns 340 and 350.

In some embodiments, the low refractive index layer 391 and the low refractive index capping layer 392 may surround sides of the light-blocking pattern 250, in the non-display area NDA. In some embodiments, the low refractive index layer 391 may be in direct contact with the second base part 310, in the non-display area NDA.

The bank pattern 370 may be positioned on a surface of the low refractive index capping layer 392 that faces the display substrate 10. In some embodiments, the bank pattern 370 may be positioned directly on the surface of the low refractive index capping layer 392 and may be in direct contact with the low refractive index capping layer 392.

In some embodiments, the bank pattern 370 may be disposed to overlap the non-light-emitting area NLA or the light-blocking area BA. In some embodiments, as illustrated in FIG. 15, the bank pattern 370 may surround the first, second, and third light-transmitting areas TA1, TA2, and TA3, in a plan view. The bank pattern 370 may define spaces in which the first wavelength shifting pattern 340, the second wavelength shifting pattern 350, and the light-transmitting pattern 330 are arranged.

In some embodiments, the bank pattern 370 may be formed as a single integral pattern, but the disclosure is not limited thereto. In another embodiment, part of the bank pattern 370 surrounding the first light-transmitting area TA1, part of the bank pattern 370 surrounding the second light-transmitting area TA2, and part of the bank pattern 370 surrounding the third light-transmitting area TA3 may be configured as separate individual patterns.

In a case where the first wavelength shifting pattern 340, the second wavelength shifting pattern 350, and the light-transmitting pattern 330 are formed by ejecting an ink composition through nozzles, i.e., by inkjet printing, the bank pattern 370 may function as a guide for placing the ink composition at each desired location. For example, the bank pattern 370 may function as a partition wall.

In some embodiments, the bank pattern 370 may overlap the pixel-defining film 150 in the third direction Z.

In some embodiments, as illustrated in FIG. 13, the bank pattern 370 may be further positioned in the non-display area NDA. The bank pattern 370 may overlap the light-blocking pattern 250, in the non-display area NDA.

In some embodiments, the bank pattern 370 may include a photo-curable organic material having photo-curability. In some embodiments, the bank pattern 370 may include a photo-curable organic material containing a light-blocking material. In a case where the bank pattern 370 is capable of blocking the transmission of light, the bank pattern 370 may prevent light from infiltrating between adjacent light-emitting areas in the display area DA. For example, the bank pattern 370 may prevent emission light LE from the second light-emitting element ED2 from being incident on the first wavelength shifting pattern 340, which overlaps the first light-emitting area LA1. The bank pattern 370 may block or prevent external light from infiltrating into the elements disposed therebelow, in the non-light-emitting area NLA and the non-display area NDA.

As illustrated in FIGS. 10 and 13, the first wavelength shifting pattern 340, the second wavelength shifting pattern 350, and the light-transmitting pattern 330 may be positioned below the low refractive index layer 391. In some embodiments, the first wavelength shifting pattern 340, the second wavelength shifting pattern 350, and the light-transmitting pattern 330 may be positioned in the display area DA.

The light-transmitting pattern 330 may overlap the third light-emitting area LA3 or the third light-emitting element ED3. The light-transmitting pattern 330 may be positioned in the space defined in the third light-transmitting area TA3 by the bank pattern 370.

In some embodiments, the light-transmitting pattern 330 may be formed as an island pattern. The light-transmitting pattern 330 is illustrated as not overlapping the light-blocking area BA, but the disclosure is not limited thereto. In another embodiment, part of the light-transmitting pattern 330 may overlap the light-blocking area BA.

The light-transmitting pattern 330 may transmit incident light therethrough. As already mentioned above, emission light LE from the third light-emitting element ED3 may be blue light. Blue emission light LE may be emitted to the outside of the display device 1 through the light-transmitting pattern 330 and the third color filter 235. For example, third light L3 (FIG. 10) emitted to the outside of the display device 1 through the third light-emitting area LA3 may be blue light.

In some embodiments, the light-transmitting pattern 330 may include a third base resin 331 and a third scatterer 333, which is dispersed in the third base resin 331. Although the terms “first,” “second,” and “third” are used herein to describe the base resins, the scatterers and/or the wavelength shifters of the light-transmitting pattern 330, the first wavelength shifting pattern 340, and the second wavelength shifting pattern 350, the base resins, the scatterers and/or the wavelength shifters of the light-transmitting pattern 330, the first wavelength shifting pattern 340, and the second wavelength shifting pattern 350 should not be limited by those terms. Those terms are simply for distinguishing one element from another element. For example, a first base resin, scatterer, or wavelength shifter could be termed a second or third base resin, scatterer, or wavelength shifter, or vice versa.

The third base resin 331 may be formed of a material having a high light transmittance. In some embodiments, the third base resin 331 may be formed of an organic material. For example, the third base resin 331 may include an organic material such as an epoxy resin, an acrylic resin, a cardo resin, or an imide resin.

The third scatterer 333 may have a refractive index different from the third base resin 331 and may form an optical interface with the third base resin 331. For example, the third scatterer 333 may be light-scattering particles. The material of the third scatterer 333 is not particularly limited as long as it can scatter at least some of the emission light LE. For example, the third scatterer 333 may be particles of a metal oxide or an organic material. The metal oxide may be $TiO_2$, $ZrO_2$, $Al_2O_3$, indium oxide ($In_2O_3$), ZnO, or tin oxide ($SnO_2$), and the organic material may be an acrylic resin or a urethane resin. For example, the third scatterer 333 may include $TiO_2$.

The third scatterer 333 may scatter incident light to random directions without substantially changing the wavelength of emission light LE passing through the light-transmitting pattern 330, regardless of the incidence direction of the incident light. In some embodiments, the light-transmitting pattern 330 may be in direct contact with the bank pattern 370.

The first wavelength shifting pattern 340 may overlap the first light-emitting area LA1 or the first light-emitting element ED1 or with the first light-transmitting area TA1.

In some embodiments, the first wavelength shifting pattern 340 may be positioned in the space defined in the first light-transmitting area TA1 by the bank pattern 370.

Figure 15:
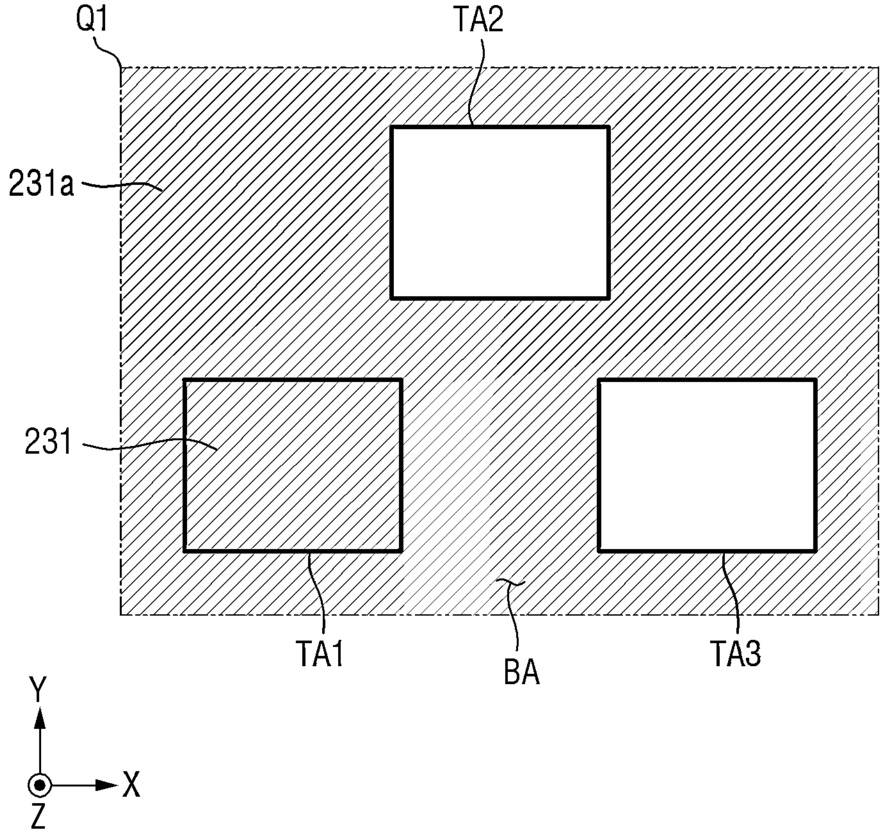
FIG. 15 is a plan view illustrating a layout of first color filters in the color conversion substrate of the display device of FIG. 1.
Figure 16:
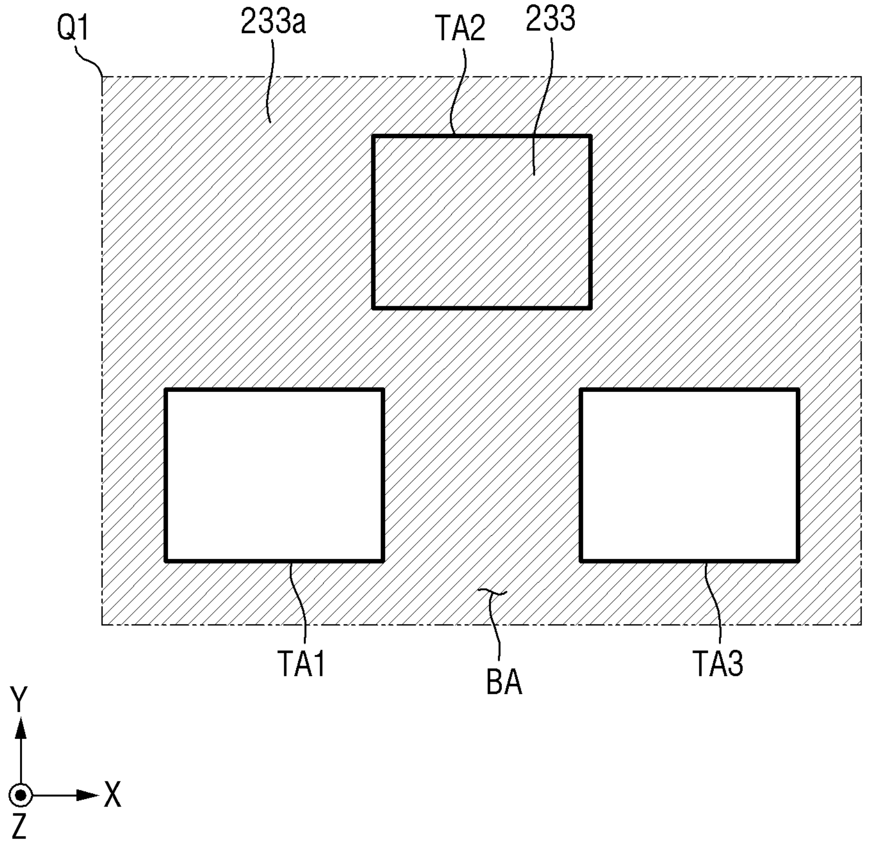
FIG. 16 is a plan view illustrating a layout of second color filters in the color conversion substrate of the display device of FIG. 1.

In some embodiments, as illustrated in FIG. 15, the first wavelength shifting pattern 340 may be formed as an island pattern. The first wavelength shifting pattern 340 is illustrated as not overlapping the light-blocking area BA, but the disclosure is not limited thereto. In another embodiment, part of the first wavelength shifting pattern 340 may overlap the light-blocking area BA. In some embodiments, the first wavelength shifting pattern 340 may be in direct contact with the bank pattern 370.

The first wavelength shifting pattern 340 may convert (or shift) the peak wavelength of incident light through a first wavelength shifter 345 and may emit the wavelength-shifted light. In some embodiments, the first wavelength shifting pattern 340 may convert emission light LE from the first light-emitting element ED1 into red light having a peak wavelength in a range of about 610 nm to about 650 nm and may emit the red light.

In some embodiments, the first wavelength shifting pattern 340 may include a first base resin 341 and the first wavelength shifter 345, which is dispersed in the first base resin 341, and may further include a first scatterer 343.

The first base resin 341 may be formed of a material having a high light transmittance. In some embodiments, the first base resin 341 may be formed of an organic material. In some embodiments, the first base resin 341 may be formed of the same material as the third base rein 331 or may include at least one selected from the above-mentioned materials that may be included in the third base resin 331.

Examples of the first wavelength shifter 345 may include quantum dots, quantum rods, or a phosphor. For example, the quantum dots may be a particulate material that emits light of a particular color in response to the electrons transitioning from the conduction band to the valance band.

The quantum dots may be a semiconductor nanocrystal material. Since the quantum dots have a band gap depending on their composition and size, the quantum dots may absorb light and emit light of a predetermined (or selectable) wavelength. The semiconductor nanocrystal material may include a group IV element, a group II-VI compound, a group III-V compound, a group IV-VI compound, or a combination thereof.

The group II-VI compound may be selected from the group consisting of: a binary compound such as CdSe, CdTe, ZnS, ZnSe, ZnTe, ZnO, HgS, HgSe, HgTe, MgSe, MgS, and a mixture thereof; a ternary compound such as InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound such as GaN, GaP, GaAs, GaSb, AlN, AlP, AlAs, AlSb, InN, InP, InAs, InSb, and a mixture thereof; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and a mixture thereof; and a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound such as SnS, SnSe, SnTe, PbS, PbSe, PbTe, and a mixture thereof; a ternary compound such as SnSeS, SnSeTe, SnSTe, PbSeS, PbSeTe, PbSTe, SnPbS, SnPbSe, SnPbTe, and a mixture thereof; and a quaternary compound such as SnPbSSe, SnPbSeTe, SnPbSTe, and a mixture thereof. The group IV element may be selected from the group consisting of Si, Ge, and a mixture thereof. The group IV compound may be a binary compound such as SiC, SiGe, and a mixture thereof.

The binary, ternary, or quaternary compounds may exist in a uniform concentration or in a partially different concentration in particles. The quantum dots may have a core-shell structure in which one quantum dot surrounds another quantum dot. The interfaces between the cores and the shells of the quantum dots may have a concentration gradient in which the concentration of the element(s) in the shells of the quantum dots gradually decreases toward the centers of the shells of the quantum dots.

In some embodiments, the quantum dots may have a core-shell structure consisting of a core including the above-described semiconductor nanocrystal material and a shell surrounding the core. The shells of the quantum dots may serve as protective layers for maintaining the semiconductor characteristics of the quantum dots by preventing chemical denaturation of the cores of the quantum dots and/or as charging layers for imparting electrophoretic characteristics to the quantum dots. The shells of the quantum dots may have a single-layer structure or a multilayer structure. The interfaces between the cores and the shells of the quantum dots may have a concentration gradient in which the concentration of the element(s) at the shells of the quantum dots gradually decreases toward the centers of the shells of the quantum dots. The shells of the quantum dots may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO or a ternary compound such as $MgAl_2O_4$, $CoFe_2O_4$, $NiFe_2O_4$, or $CoMn_2O_4$, but the disclosure is not limited thereto.

For example, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the disclosure is not limited thereto.

Light emitted by the first wavelength shifter 345 may have a full width at half maximum (FMHM) of less than or equal to about 45 nm or less. For example, light emitted by the first wavelength shifter 345 may have a full width at half maximum (FMHM) of less than or equal to about 40 nm. For example, light emitted by the first wavelength shifter 345 may have a full width at half maximum (FMHM) of less than or equal to about 30 nm. Thus, the purity of colors displayed by the display device 1 and the color reproducibility of the display device 1 may be further improved. The first wavelength shifter 345 may emit light in various directions regardless of the incidence direction of the light. Accordingly, the side visibility of the first color displayed in the first second-transmitting area TA1 may be improved.

Some of the emission light LE from the first light-emitting element ED1 may not be converted into red light by the first wavelength shifter 345, but may be emitted through the first wavelength shifting pattern 340. A portion of the emission light LE that are not wavelength-shifted by the first wavelength shifting pattern 340, but are incident upon the first color filter 231, may be blocked by the first color filter 231. On the contrary, red light obtained from the emission light LE by the first wavelength shifting pattern 340 may be emitted to the outside of the display device 1 through the first color filter 231. For example, first light L1 (FIG. 10) emitted to the outside of the display device 1 through the first light-transmitting area TA1 may be red light.

The first scatterer 343 may have a refractive index different from the first base resin 341 and may form an optical interface with the first base resin 341. For example, the first scatterer 343 may be light-scattering particles. The first scatterer 343 may be substantially the same as the third scatterer 333, and thus, a detailed description thereof will be omitted.

The second wavelength shifting pattern 350 may be positioned in space defined by the bank pattern 370, in the second light-transmitting area TA2.

In some embodiments, as illustrated in FIG. 10, the second wavelength shifting pattern 350 may be formed as an island pattern. In some embodiments, part of the second wavelength shifting pattern 350 may overlap the light-blocking area BA. In some embodiments, the second wavelength shifting pattern 350 may be in direct contact with the bank pattern 370.

The second wavelength shifting pattern 350 may convert (or shift) the peak wavelength of incident light through a second wavelength shifter 355 and may emit the wavelength-shifted light. In some embodiments, the second wavelength shifting pattern 350 may convert the emission light LE from the second light-emitting element ED2 into green light having a peak wavelength in a range of about 510 nm to about 550 nm and may emit the green light.

In some embodiments, the second wavelength shifting pattern 350 may include a second base resin 351 and the second wavelength shifter 355, which is dispersed in the second base resin 351, and may further include a second scatterer 353, which is dispersed in the second base resin 351.

The second base resin 351 may be formed of a material having a high light transmittance. In some embodiments, the second base resin 351 may be formed of an organic material. In some embodiments, the second base resin 351 may be formed of the same material as the third base rein 331 or may include at least one selected from the above-mentioned materials that may be included in the third base resin 331.

Examples of the second wavelength shifter 355 may include quantum dots, quantum rods, or a phosphor. The second wavelength shifter 355 may be substantially the same as the first wavelength shifter 345, and thus, a detailed description thereof will be omitted.

In some embodiments, the first and second wavelength shifters 345 and 355 may both be quantum dots. The particle size of the second wavelength shifter 355 may be less than the particle size of the first wavelength shifter 345.

The second scatterer 353 may have a refractive index different from the second base resin 351 and may form an optical interface with the second base resin 341. For example, the second scatterer 353 may be light-scattering particles. The second scatterer 353 may be substantially the same as the first scatterer 343, and thus, a detailed description thereof will be omitted.

The emission light LE from the second light-emitting element ED2 may be provided to the second wavelength shifting pattern 350, and the second wavelength shifter 355 may convert the emission light LE into green light having a peak wavelength in a range of about 510 nm to about 550 nm and may emit the green light.

Some of the emission light LE, which is blue light, may be transmitted through the second wavelength shifting pattern 350, without being converted into green light by the second wavelength shifter 355, and may be blocked by the second color filter 233. On the contrary, green light obtained from the emission light LE by the second wavelength shifting pattern 350 may be emitted to the outside of the display device 1 through the second color filter 233. Accordingly, second light L2 (FIG. 10) emitted to the outside of the display device 1 through the second light-transmitting area TA2 may be green light.

In some embodiments, a capping layer 393 may surround outer sides of the bank pattern 370, in the non-display area NDA. The capping layer 393 may be in direct contact with the low refractive index capping layer 392, in the non-display area NDA.

In some embodiments, the capping layer 393 may be formed of an inorganic material. In some embodiments, the capping layer 393 may be formed of the same material as the low refractive index layer 391 or may include at least one selected from the above-described materials that may be included in the low refractive index layer 391. In a case where the low refractive index layer 391 and the capping layer 393 are both formed of an inorganic material, the low refractive index layer 391 and the capping layer 393 may be in direct contact with each other in the non-display area NDA to form inorganic-inorganic bonds.

As already mentioned above, the sealing member 50 may be positioned between the color conversion substrate 30 and the display substrate 10, in the non-display area NDA.

The sealing member 50 may overlap the encapsulation layer 170. For example, the sealing member 50 may overlap the lower and upper inorganic layers 171 and 175, but not with the organic layer 173. In some embodiments, the sealing member 50 may be in direct contact with the encapsulation layer 170. For example, the sealing member 50 may be positioned directly on the upper inorganic layer 175 and may be in direct contact with the upper inorganic layer 175.

In some embodiments, the upper and lower inorganic layers 175 and 171 below the sealing member 50 may extend to the outside of the sealing member 50.

The sealing member 50 may overlap the light-blocking pattern 250, the first color filter 231, and the bank pattern 370, in the non-display area NDA. In some embodiments, the sealing member 50 may be in direct contact with the capping layer 393, which covers the bank pattern 370.

The sealing member 50 may overlap the gate metals WR, which include lines connected to the connecting pads PD. As the sealing member 50 is disposed to overlap the gate metals WR, the width of the non-display area NDA may be reduced.

The filler 70 may be positioned in the space between the color conversion substrate 30, the display substrate 10, and the sealing member 50. In some embodiments, as illustrated in FIGS. 10 and 13, the filler 70 may be in direct contact with the capping layer 393 and the upper inorganic layer 175 of the encapsulation layer 170.

An antireflection film AF may be disposed on another surface of the second base part 310 that is opposite to the surface of the second base part 310 where the color filters (231, 233, and 235) are disposed. The antireflection film AF may be disposed on the opposite side of the color filters (231, 233, and 235) and may minimize external light from being incident into the display device 1. The antireflection film AF may have a first surface, which is on a display surface side of the display device 1, and a second surface, which is opposite to the first surface and is in contact with the second base part 310, and may minimize the incidence of external light by making external light reflected from the first surface and external light reflected from the second surface interfere with each other. Although not specifically illustrated, the antireflection film AF may consist of multiple layers whose refractive indexes are controlled, but the disclosure is not limited thereto.

Figure 17:
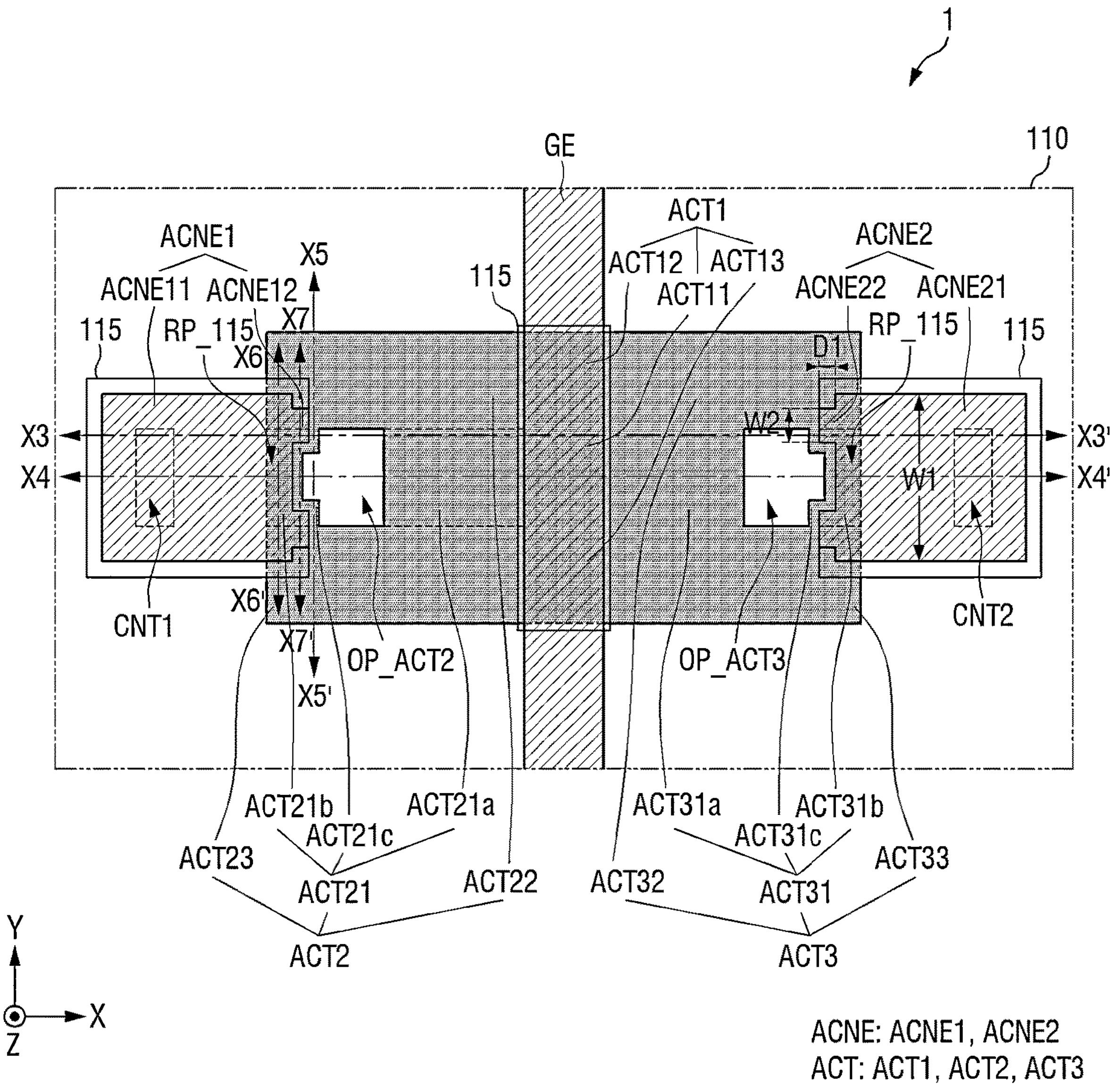
FIG. 17 is a plan view of a transistor of a pixel of the display device of FIG. 1.
Figure 18:
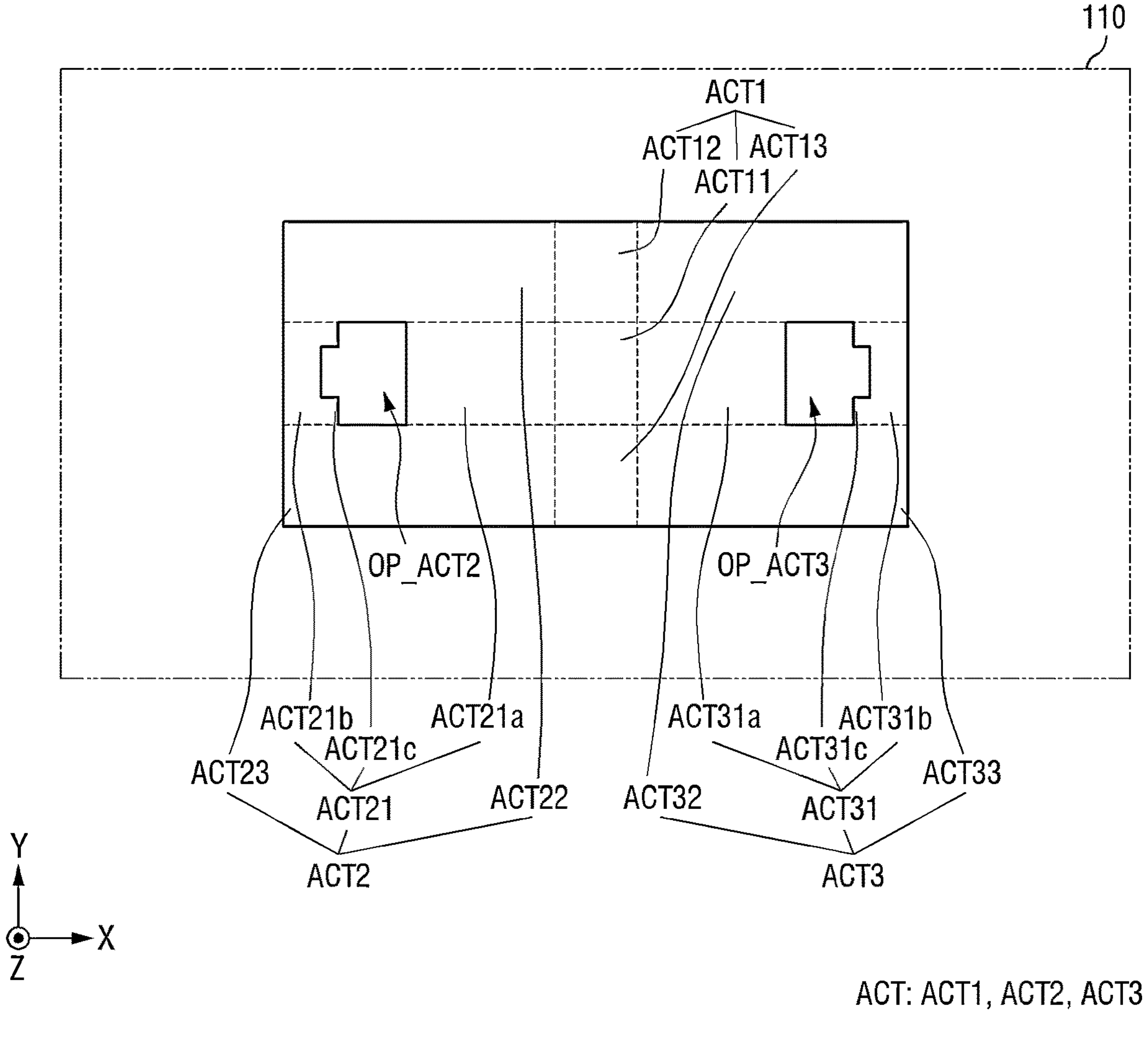
FIG. 18 is a plan view of a semiconductor layer of FIG. 17.
Figure 19:
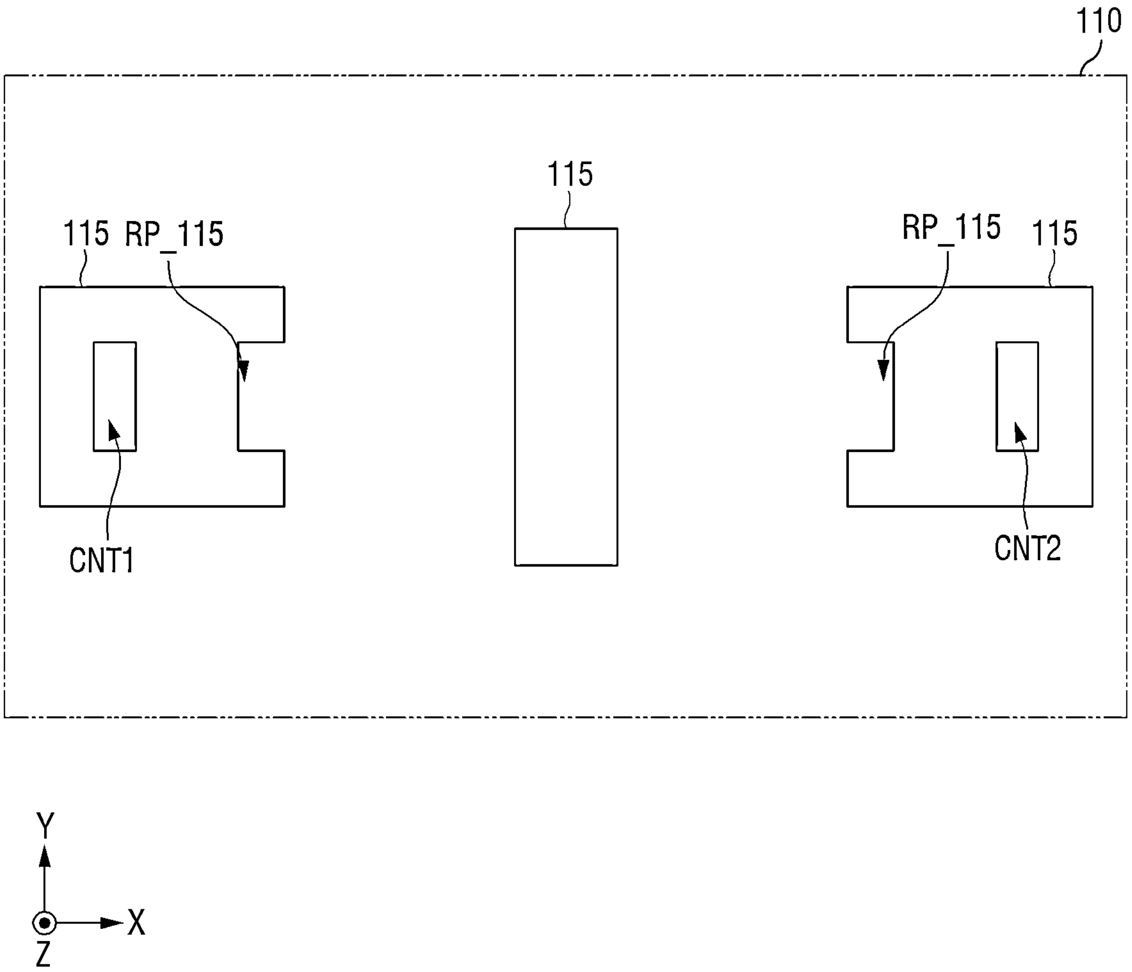
FIG. 19 is a plan view of a gate insulating layer of FIG. 17.
Figure 20:
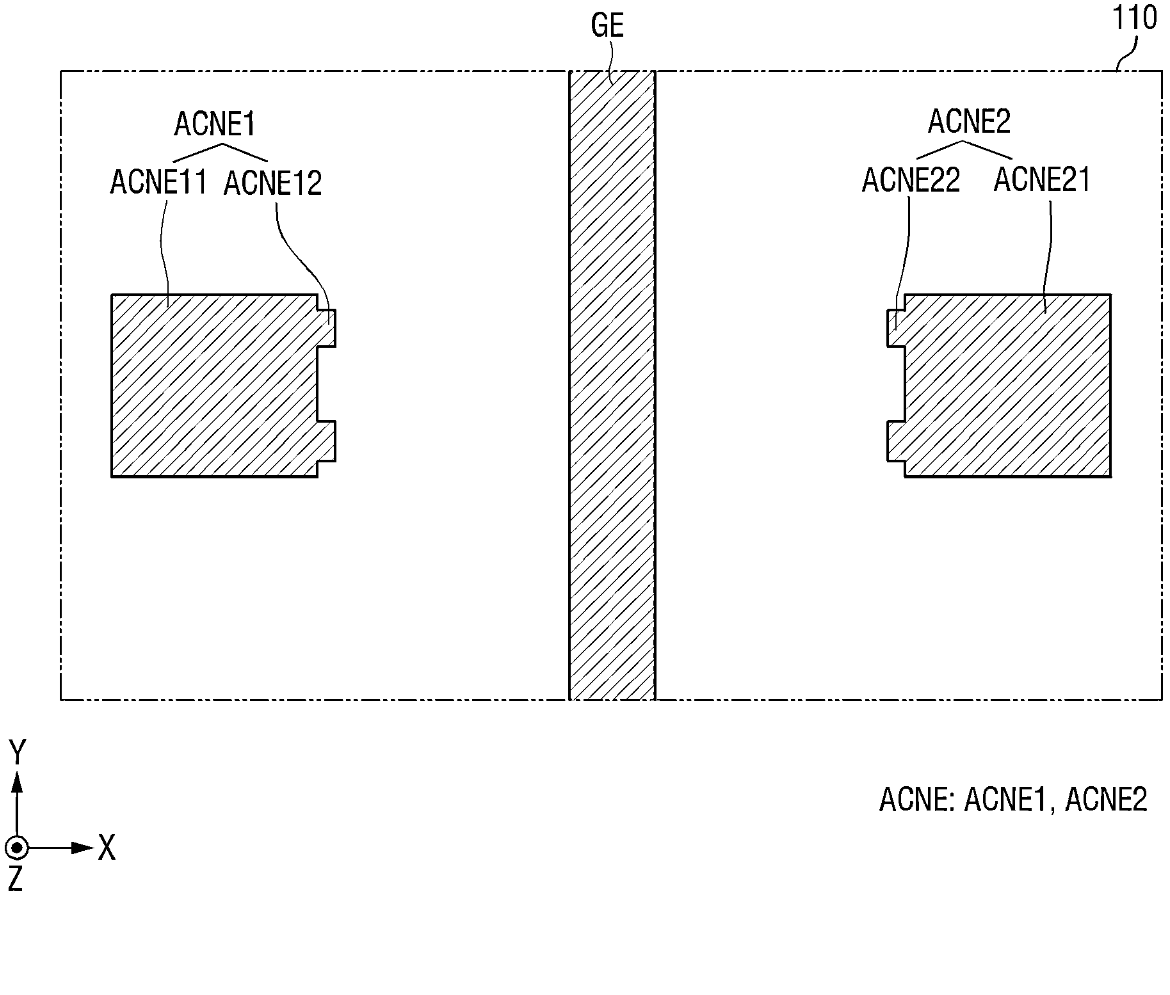
FIG. 20 is a plan view of a second conductive layer of FIG. 17.
Figure 21:
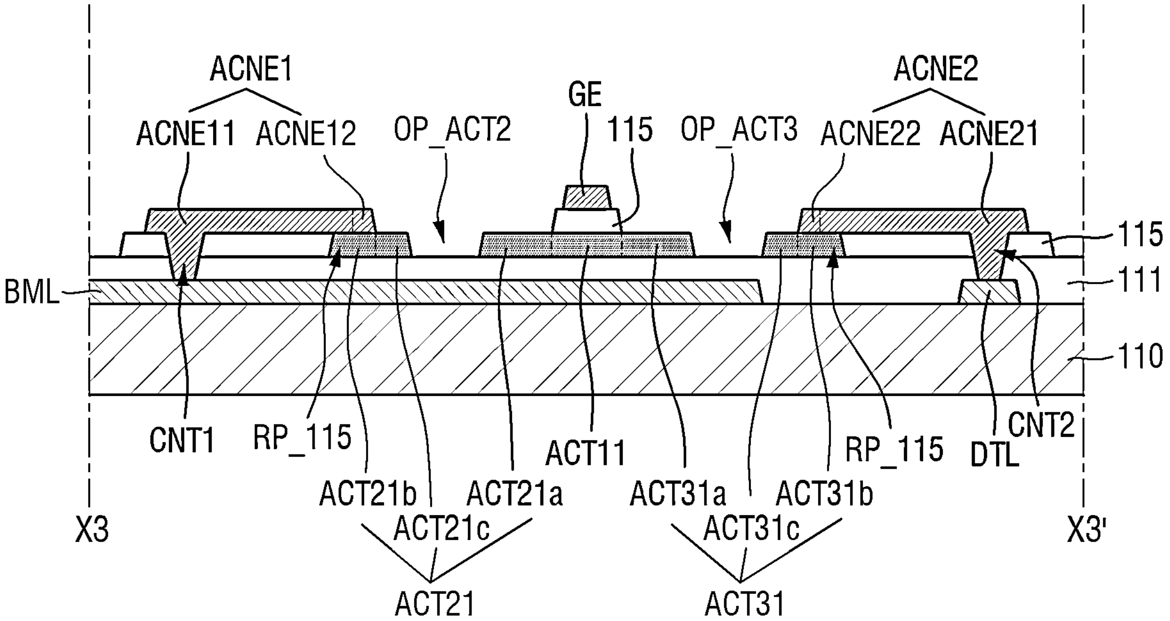
FIG. 21 is a schematic cross-sectional view taken along line X3-X3' of FIG. 17.
Figure 22:
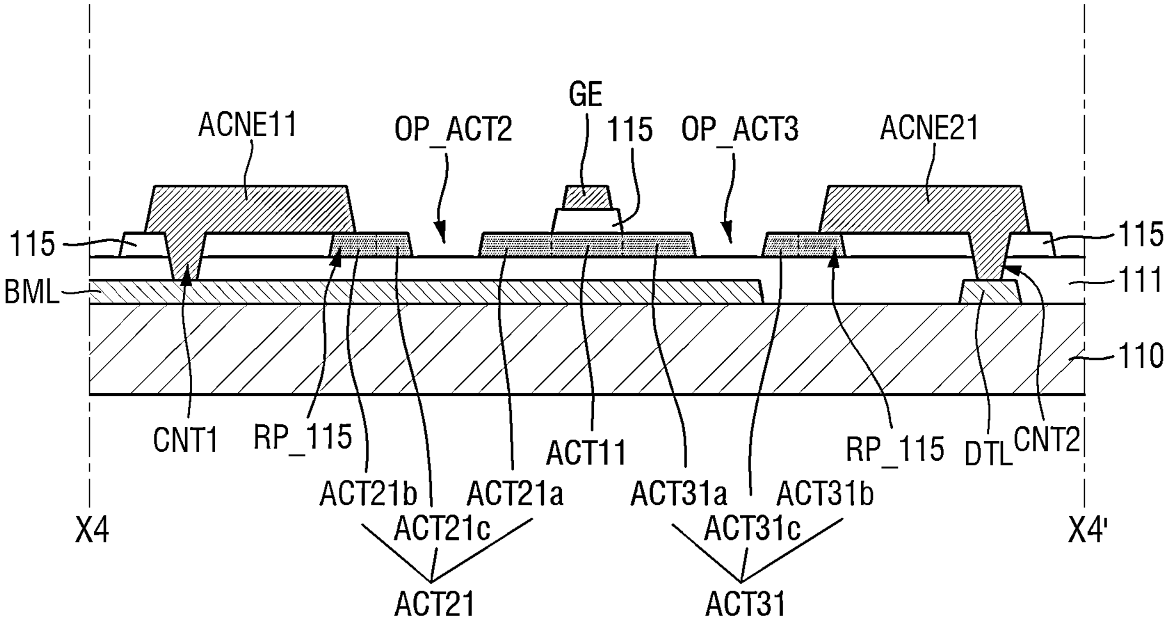
FIG. 22 is a schematic cross-sectional view taken along line X4-X4' of FIG. 17.
Figure 23:
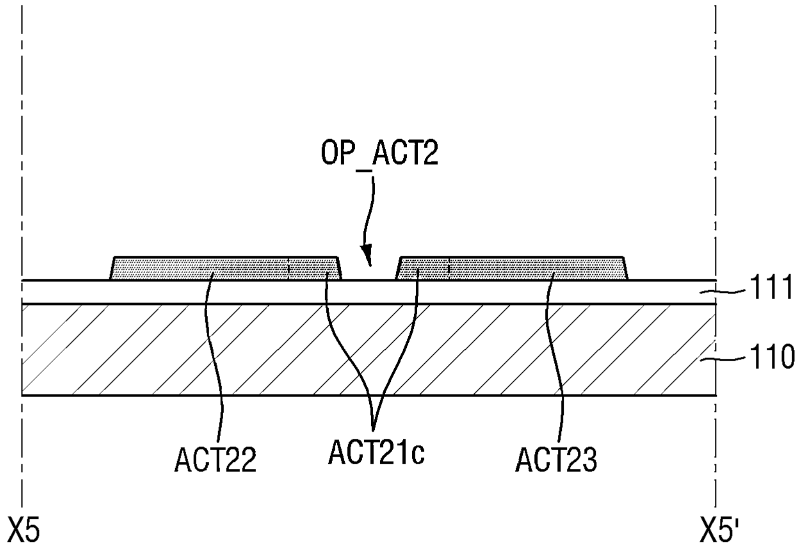
FIG. 23 is a schematic cross-sectional view taken along line X5-X5' of FIG. 17.
Figure 24:
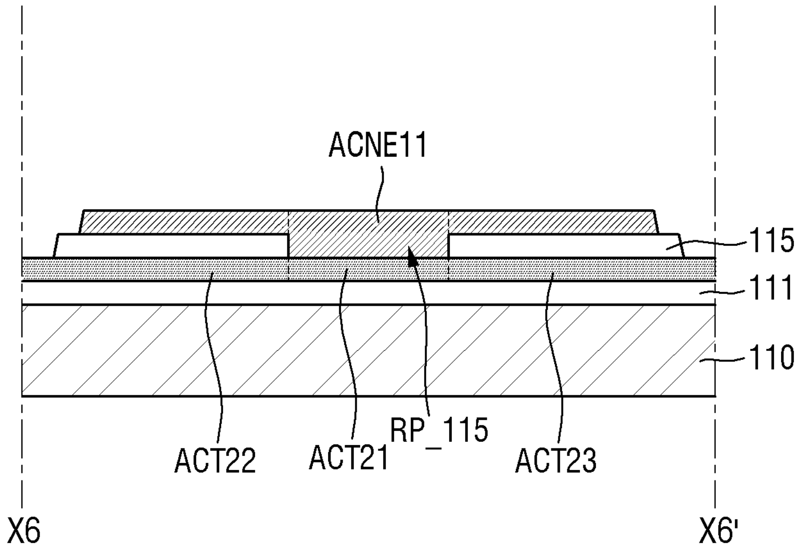
FIG. 24 is a schematic cross-sectional view taken along line X6-X6' of FIG. 17.
Figure 25:
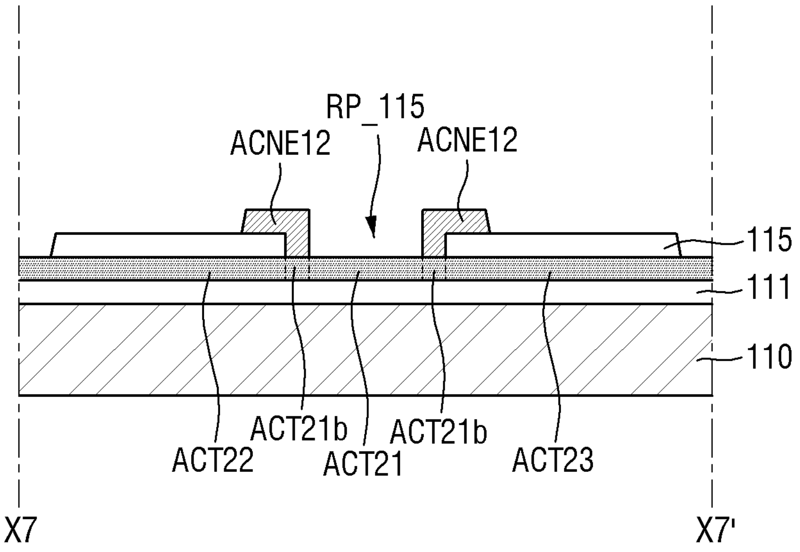
FIG. 25 is a schematic cross-sectional view taken along line X7-X7' of FIG. 17.

FIG. 17 is a plan view of a transistor of a pixel of the display device of FIG. 1. FIG. 18 is a plan view of a semiconductor layer of FIG. 17. FIG. 19 is a plan view of a gate insulating layer of FIG. 17. FIG. 20 is a plan view of a second conductive layer of FIG. 17. FIG. 21 is a schematic cross-sectional view taken along line X3-X3' of FIG. 17. FIG. 22 is a schematic cross-sectional view taken along line X4-X4' of FIG. 17. FIG. 23 is a schematic cross-sectional view taken along line X5-X5' of FIG. 17. FIG. 24 is a schematic cross-sectional view taken along line X6-X6' of FIG. 17. FIG. 25 is a schematic cross-sectional view taken along line X7-X7' of FIG. 17.

Referring to FIGS. 17 through 25, the first conducive layer, which includes the lower light-blocking layer BML and the data lines DTL, may be disposed on the first base part 110.

The buffer layer 111 may be disposed on the first conductive layer.

The semiconductor layer ACT may be disposed on the buffer layer 111.

The semiconductor layer ACT may include a first semiconductor part ACT1, a second semiconductor part ACT2, which is on a second side, in the first direction X, of the first semiconductor part ACT1, and a third semiconductor part ACT3, which is disposed on a first side, in the first direction X, of the first semiconductor part ACT1.

The second and third semiconductor parts ACT2 and ACT3 may include openings OP_ACT2 and OP_ACT3, respectively, which penetrate the second and third semiconductor parts ACT2 and ACT3, respectively, in the thickness direction. As illustrated in FIG. 17, the semiconductor openings OP_ACT2 and OP_ACT3 may have a rectangular shape in a plan view, but the disclosure is not limited thereto. In another embodiment, the semiconductor openings OP_ACT2 and OP_ACT3 may have a circular shape, an elliptical shape, or another polygonal shape.

The first semiconductor part ACT1 may include a (1-1)-th semiconductor part ACT11, which overlaps the semiconductor openings OP_ACT2 and OP_ACT3 in the first direction X, a (1-2)-th semiconductor part ACT12, which is on a first side, in the second direction Y, of the (1-1)-th semiconductor part ACT11, and a (1-3)-th semiconductor part ACT13, which is on a second side, in the second direction Y, of the (1-1)-th semiconductor part ACT11. The (1-2)-th and (1-3)-th semiconductor parts ACT12 and ACT13 may not overlap the semiconductor openings OP_ACT2 and OP_ACT3 in the first direction X. The first semiconductor part ACT1 may overlap a gate electrode GE, which extends in the second direction Y, and may overlap the gate insulating layer 115 in the thickness direction.

The second semiconductor part ACT2 may include a (2-1)-th semiconductor part ACT21, which includes the semiconductor opening OP_ACT2, a (2-2)-th semiconductor part ACT22, which is on a first side, in the second direction Y, of the (2-1)-th semiconductor part ACT21, and a (2-3)-th semiconductor part ACT23, which is on a second side, in the second direction Y, of the (2-1)-th semiconductor part ACT21. The (2-2)-th and (2-3)-th semiconductor parts ACT22 and ACT23 may not overlap the semiconductor opening OP_ACT2. The (2-1)-th semiconductor part ACT21 may include a (2-1-1)-th semiconductor part ACT21*a*, which is between the semiconductor opening OP_ACT2 and the first semiconductor part ACT1, a (2-1-2)-th semiconductor part ACT21*b*, which is disposed on a second side, in the first direction X, of the semiconductor opening OP_ACT2, and a (2-1-3)-th semiconductor part ACT21*c*, which is between the semiconductor opening OP_ACT2 and the (2-1-2)-th semiconductor part ACT21*b*. The (2-1-2)-th semiconductor part ACT21*b* may overlap a first connecting electrode ACNE1, and the (2-1-1)-th and (2-1-3)-th semiconductor parts ACT21*a* and ACT21*c* may not overlap the first connecting electrode ACNE1. The (2-2)-th semiconductor part ACT22 may overlap the gate insulating layer 115 and a (1-1)-th connecting electrode ACNE11 of the first connecting electrode ACNE1 on second sides thereof in the first and second directions X and Y. The (2-3)-th semiconductor part ACT23 may overlap the gate insulating layer 115 and the (1-1)-th connecting electrode ACNE11 on a second side thereof in the first direction X and a first side thereof in the second direction Y.

The third semiconductor part ACT3 may include a (3-1)-th semiconductor part ACT31, which includes the semiconductor opening OP_ACT3, a (3-2)-th semiconductor part ACT32, which is on a first side, in the second direction Y, of the (3-1)-th semiconductor part ACT31, and a (3-3)-th semiconductor part ACT33, which is on a second side, in the second direction Y, of the (3-1)-th semiconductor part ACT31. The (3-2)-th and (3-3)-th semiconductor parts ACT32 and ACT33 may not overlap the semiconductor opening OP_ACT3.

The (3-1)-th semiconductor part ACT31 may include a (3-1-1)-th semiconductor part ACT31*a*, which is between the semiconductor opening OP_ACT3 and the first semiconductor part ACT1, a (3-1-2)-th semiconductor part ACT31*b*, which is disposed on a first side, in the first direction X, of the semiconductor opening OP_ACT3, and a (3-1-3)-th semiconductor part ACT31*c*, which is between the semiconductor opening OP_ACT3 and the (3-1-2)-th semiconductor part ACT31*b*. The (3-1-2)-th semiconductor part ACT31*b* may overlap a second connecting electrode ACNE2, and the (3-1-1)-th and (3-1-3)-th semiconductor parts ACT31*a* and ACT31*c* may not overlap the second connecting electrode ACNE2. The (3-2)-th semiconductor part ACT32 may overlap the gate insulating layer 115 and a (2-1)-th connecting electrode ACNE21 of the second connecting electrode ACNE2 on first sides thereof in the first and second directions X and Y. The (3-3)-th semiconductor part ACT33 may overlap the gate insulating layer 115 and the (2-1)-th connecting electrode ACNE21 on first sides thereof in the first and second directions X and Y.

The shapes of the semiconductor opening OP_ACT2, the (2-1-2)-th semiconductor part ACT21*b*, and the (2-1-3)-th semiconductor part ACT21*c* of the second semiconductor part ACT2 may be related to the shape of the first connecting electrode ACNE1, and the shapes of the semiconductor opening OP_ACT3, the (3-1-2)-th semiconductor part ACT31*b*, and the (3-1-3)-th semiconductor part ACT31*c* of the third semiconductor part ACT3 may be related to the shape of the second connecting electrode ACNE2. This will hereinafter be described together with the shapes of the first and second connecting electrodes ACNE1 and ACNE2.

The gate insulating layer 115 may be disposed on the semiconductor layer ACT. The gate insulating layer 115 may overlap the first and second connecting electrodes ACNE1 and ACNE2 and the gate electrode GE. Parts of the gate insulating layer 115 overlapping the first and second connecting electrodes ACNE1 and ACNE2 may include insulating recesses RP_115 and contact holes CNT1 and CNT2. As illustrated in FIGS. 17 and 19, the insulating recesses RP_115 may be recessed from sides of the gate insulating layer 115 in a direction away from the semiconductor openings OP_ACT2 and OP_ACT3.

The parts of the gate insulating layer 115 overlapping the first and second connecting electrodes ACNE1 and ACNE2 may include longitudinal sides extending in the second direction Y and latitudinal sides extending in the first direction X. FIGS. 17 and 19 illustrate that the corners of the gate insulating layer 115 where the longitudinal sides and the latitudinal sides meet are right-angled, but the disclosure is not limited thereto. In another embodiment, the corners where the longitudinal sides and the latitudinal sides of the gate insulating layer 115 meet may be rounded. FIGS. 17 and 19 illustrate that the sides of the gate insulating layer 115 extend in the first or second direction X or Y, but the disclosure is not limited thereto. In another embodiment, the sides of the gate insulating layer 115 may extend in directions other than the first and second directions X and Y.

The contact holes CNT1 and CNT2 may be completely surrounded by the material of the gate insulating layer 115.

Part of the gate insulating layer 115 overlapping the gate electrode GE may substantially have a linear shape extending in the second direction Y.

The insulating recesses RP_115 may overlap the semiconductor openings OP_ACT2 and OP_ACT3 in the first direction X. A second side of an insulating recess RP_115 overlapping the first connecting electrode ACNE1 in the first direction X may substantially fall on a same line as a second side of the second semiconductor part ACT2 in the first direction X, and a first side of an insulating recess RP_115 overlapping the second connecting electrode ACNE2 in the first direction X may substantially fall on the same line as a first side of the third semiconductor part ACT3 in the first direction X. For example, as illustrated in FIG. 21, the part of the gate insulating layer 115 overlapping the first connecting electrode ACNE1 may be in contact with the (2-1)-th semiconductor part ACT21 of the second semiconductor part ACT2, and the part of the gate insulating layer 115 overlapping the second connecting electrode ACNE2 may be in contact with the (3-1)-th semiconductor part ACT31 of the third semiconductor part ACT3. However, the disclosure is not limited to this. In another embodiment, the second side of the second semiconductor part ACT2 in the first direction X may not be aligned with the second side of the insulating recess RP_115 overlapping the first connecting electrode ACNE1 in the first direction X, but the first side of the second semiconductor part ACT2 in the first direction X may overlap the insulating recess RP_115 or the part of the gate insulating layer 115 overlapping the first connecting electrode ACNE1, and the first side of the third semiconductor part ACT3 in the first direction X may not be aligned with the first side of the insulating recess RP_115 overlapping the second connecting electrode ACNE2 in the first direction X, but the second side of the third semiconductor part ACT3 in the first direction X may overlap the insulating recess RP_115 or the part of the gate insulating layer 115 overlapping the second connecting electrode ACNE2.

The second conductive layer may be disposed on the gate insulating layer 115.

The second conductive layer may include the first and second connecting electrodes ACNE1 and ACNE2 and the gate electrode GE. The gate electrode GE may extend in the second direction Y and may have a predetermined (or selectable) width. The gate electrode GE may overlap the first semiconductor part ACT1 in the third direction Z. The width, in the first direction X, of the part of the gate insulating layer 115 overlapping the gate electrode GE may be greater than the width, in the first direction X, of the gate electrode GE. For example, the gate insulating layer 115 may protrude beyond both sides, in the first direction X, of the gate electrode GE. The first semiconductor part ACT1, which overlaps the gate electrode GE, may form the channel region of a TFT. The second and third semiconductor parts ACT2 and ACT3 may form the drain and source regions of the TFT. The conductivity of the first semiconductor part ACT1 may be lower than the conductivity of the (2-2)-th and (2-3)-th semiconductor parts ACT22 and ACT23 of the second semiconductor part ACT2 and the conductivity of the (3-2)-th and (3-3)-th semiconductor parts ACT32 and ACT33 of the third semiconductor part ACT3.

The first connecting electrode ACNE1 may overlap the second semiconductor part ACT2 in the third direction Z. The first connecting electrode ACNE1 may include a (1-1)-th connecting electrode ACNE11 and (1-2)-th connecting electrodes ACNE12, which is connected to the (1-1)-th connecting electrode ACNE11 and protrudes toward the semiconductor opening OP_ACT2. The (1-1)-th connecting electrode ACNE11 may have a rectangular shape in a plan view. For example, the (1-1)-th connecting electrode ACNE11 may have latitudinal sides extending in the first direction X and longitudinal sides extending in the second direction Y. The corners where the latitudinal sides and the longitudinal sides of the (1-1)-th connecting electrode ACNE11 meet may be right-angled, but the disclosure is not limited thereto. In another embodiment, the corners where the latitudinal sides and the longitudinal sides of the (1-1)-th connecting electrode ACNE11 meet may be rounded. The shape of the (1-1)-th connecting electrode ACNE11 is not particularly limited. In another embodiment, the (1-1)-th connecting electrode ACNE11 may have a circular shape, an elliptical shape, or another polygonal shape.

The (1-2)-th connecting electrodes ACNE12 may protrude in the first direction X from a first longitudinal side of the (1-1)-th connecting electrode ACNE11 in the first direction X. The (1-2)-th connecting electrodes ACNE12 may have a rectangular shape in a plan view, but the disclosure is not limited thereto. In another embodiment, the (1-2)-th connecting electrodes ACNE12 may have a square shape, a circular shape, an elliptical shape, or a polygonal shape other than a rectangular or square shape in a plan view. In a case where the (1-2)-th connecting electrodes ACNE12 have a rectangular shape in a plan view, each of the (1-2)-th connecting electrodes ACNE12 may have longitudinal sides extending in the second direction Y and latitudinal sides extending in the first direction X. A length D1 (FIG. 17) by which the (1-2)-th connecting electrodes ACNE12 protrude in the first direction X from the first longitudinal side of the (1-1)-th connecting electrode ACNE11 in the first direction X may be about 0.01 to about 0.1 times the length of the latitudinal sides of the (1-1)-th connecting electrode ACNE11. For example, the length D1 by which the (1-2)-th connecting electrodes ACNE12 protrude in the first direction X from the first longitudinal side of the (1-1)-th connecting electrode ACNE11 in the first direction X may be in a range of about 0.1 μm to about 3 μm, but the disclosure is not limited thereto. A width W1, in the second direction Y, of the (1-1)-th connecting electrode ACNE11 may be greater than the width W2, in the second direction Y, of the (1-2)-th connecting electrodes ACNE12. The width W2 of the (1-2)-th connecting electrodes ACNE12 may be the same as the width, in the second direction Y, of the semiconductor opening OP_ACT2, but the disclosure is not limited thereto. The (1-2)-th connecting electrodes ACNE12 may be designed in consideration of the shape of the gate insulating layer 115. The length D1 by which the (1-2)-th connecting electrodes ACNE12 protrude in the first direction X from the first longitudinal side of the (1-1)-th connecting electrode ACNE11 in the first direction X may be designed such that the first longitudinal sides of the (1-2)-th connecting electrodes ACNE12 in the first direction X fall on the same line as, or protrude in the first direction X beyond, their respective longitudinal sides of the gate insulating layer 115. FIG. 17 illustrates that the first longitudinal sides of the (1-2)-th connecting electrodes ACNE12 in the first direction X fall on the same line as their respective longitudinal sides of the gate insulating layer 115.

In some embodiments, multiple (1-2)-th connecting electrodes ACNE12 may be provided. For example, each of the (1-2)-th connecting electrodes ACNE12 may overlap the (2-2)-th and (2-1-2)-th semiconductor parts ACT22 and ACT21*b* at the same time or with the (2-3)-th and (2-1-2)-th semiconductor parts ACT23 and ACT21*b* at the same time. One of the (1-2)-th connecting electrodes ACNE12 may be positioned at an upper part of the first longitudinal side of the (1-1)-th connecting electrode ACNE11 in the first direction X and may overlap the (2-2)-th and (2-1-2)-th semiconductor parts ACT22 and ACT21*b* at the same time, and other (1-2)-th connecting electrode ACNE12 may be positioned at a lower part of the first longitudinal side of the (1-1)-th connecting electrode ACNE11 in the first direction X and may overlap the (2-3)-th and (2-1-2)-th semiconductor parts ACT23 and ACT21*b* at the same time.

The part of the gate insulating layer 115 overlapping the first connecting electrode ACNE1 may generally be formed to protrude (or extend) outwardly beyond the sides of the (1-1)-th connecting electrode ACNE11. For example, the longitudinal sides of part of the gate insulating layer 115 overlapping the (1-1)-th connecting electrode ACNE11 may protrude (or extend) in the first direction X beyond their respective longitudinal sides of the (1-1)-th connecting electrode ACNE11 by a predetermined (or selectable) length, and the latitudinal sides of the part of the gate insulating layer 115 overlapping the (1-1)-th connecting electrode ACNE11 may protrude in the second direction Y beyond their respective latitudinal sides of the (1-1)-th connecting electrode ACNE11 by a predetermined (or selectable) length. In another embodiment, a first longitudinal side of the gate insulating layer 115 overlapping the (1-1)-th connecting electrode ACNE11 in the first direction X may be aligned with a first longitudinal side of the (1-1)-th connecting electrode ACNE11 in the first direction X or may be recessed from the first longitudinal side of the (1-1)-th connecting electrode ACNE11 in the first direction X by a predetermined (or selectable) length in the first direction X to form a (2-1-3)-th semiconductor part ACT21*c* directly connected to the (2-2)-th and (2-3)-th semiconductor parts ACT22 and ACT23. The (2-1-3)-th semiconductor part ACT21*c* may be a conductive semiconductor part. As the (2-2)-th and (2-3)-th semiconductor parts ACT22 and ACT23, which are directly connected to the (2-1-3)-th semiconductor part ACT21*c*, include conductive semiconductor parts, signals received through the first connecting electrode ACNE1 may be transmitted from the (2-1-3)-th semiconductor part ACT21*c* to the (2-2)-th and (2-3)-th semiconductor parts ACT22 and ACT23 through the conductive semiconductor parts of the (2-2)-th and (2-3)-th semiconductor parts ACT22 and ACT23, or signals received through the (2-2)-th and (2-3)-th semiconductor parts ACT22 and ACT23 may be transmitted to the first connecting electrode ACNE1 through the (2-1-3)-th semiconductor part ACT21*c*.

As already mentioned above, the shapes of the semiconductor opening OP_ACT2, the (2-1-2)-th semiconductor part ACT21*b*, and the (2-1-3)-th semiconductor part ACT21*c* of the second semiconductor part ACT2 may be related to the shape of the first connecting electrode ACNE1. The (2-1-2)-th semiconductor part ACT21*b* may correspond to the overlapping area of the second semiconductor part ACT2, the (1-1)-th and (1-2)-th connecting electrodes ACNE11 and ACNE12, and the (2-1-3)-th semiconductor part ACT21*c* may correspond to part of the second semiconductor part ACT2 protruding, by a predetermined (or selectable) length, from an outline formed by the outer profile of the first side, in the first direction X, of the (1-1)-th connecting electrode ACNE11. The outer profile of a second side, in the first direction X, of the semiconductor opening OP_ACT2 may be formed to correspond to the outline formed by the outer profiles of the first sides, in the first direction X, of the (1-1)-th and (1-2)-th connecting electrodes ACNE11 and ACNE12, particularly, to the entire second semiconductor part ACT2 except for the (2-1-1)-th, (2-1-2)-th and (2-1-3)-th semiconductor parts ACT21*a*, ACT21*b*, and ACT21*c*. As the first longitudinal side of the gate insulating layer 115 overlapping the first connecting electrode ACNE1 in the first direction X overlapping the first connecting electrode ACNE1 is aligned with, or recessed (in the first direction X) from the first longitudinal sides of the (1-2)-th connecting electrodes ACNE12 in the first direction X, an end portion of the (2-1-3)-th semiconductor part ACT21*c* on a first side, in the second direction Y may extend even to the (2-2)-th semiconductor part ACT22 and may thus be directly connected to the (2-2)-th semiconductor part ACT22, and an end portion of the (2-1-3)-th semiconductor part ACT21*c* on a second side, in the second direction Y may extend even to the (2-3)-th semiconductor part ACT23 and may thus be directly connected to the (2-3)-th semiconductor part ACT23. As a result, signals received through the first connecting electrode ACNE1 may be transmitted from the (2-1-3)-th semiconductor part ACT21*c* to the (2-2)-th and (2-3)-th semiconductor parts ACT22 and ACT23 through the conductive semiconductor parts of the (2-2)-th and (2-3)-th semiconductor parts ACT22 and ACT23, and signals received through the (2-2)-th and (2-3)-th semiconductor parts ACT22 and ACT23 may be transmitted even to the first connecting electrode ACNE1 through the (2-1-3)-th semiconductor part ACT21*c*.

The second connecting electrode ACNE2 may overlap the third semiconductor part ACT3 in the third direction Z. The second connecting electrode ACNE2 may include a (2-1)-th connecting electrode ACNE21 and (2-2)-th connecting electrodes ACNE22, which is connected to the (2-1)-th connecting electrode ACNE21 and protrudes toward the semiconductor opening OP_ACT3. The (2-1)-th connecting electrode ACNE21 may have a rectangular shape in a plan view. For example, the (2-1)-th connecting electrode ACNE21 may have latitudinal sides extending in the first direction X and longitudinal sides extending in the second direction Y. The corners where the latitudinal sides and the longitudinal sides of the (2-1)-th connecting electrode ACNE21 meet may be right-angled, but the disclosure is not limited thereto. In another embodiment, the corners where the latitudinal sides and the longitudinal sides of the (2-1)-th connecting electrode ACNE21 meet may be rounded. The shape of the (2-1)-th connecting electrode ACNE21 is not particularly limited. In another embodiment, the (2-1)-th connecting electrode ACNE21 may have a circular shape, an elliptical shape, or another polygonal shape.

The (2-2)-th connecting electrodes ACNE22 may protrude in the first direction X from a second longitudinal side of the (2-1)-th connecting electrode ACNE21 in the first direction X. The length by which the (2-2)-th connecting electrodes ACNE22 protrude in the first direction X from the second longitudinal side of the (2-1)-th connecting electrode ACNE21 in the first direction X may be about 0.01 to about 0.1 times the length of the latitudinal sides of the (2-1)-th connecting electrode ACNE21. For example, the length by which the (2-2)-th connecting electrodes ACNE22 protrude in the first direction X from the second longitudinal side of the (2-1)-th connecting electrode ACNE21 may be in a range of about 0.1 μm to about 3 μm, but the disclosure is not limited thereto. The width, in the second direction Y, of the (2-1)-th connecting electrode ACNE21 may be greater than the width, in the second direction Y, of the (2-2)-th connecting electrode ACNE2.

As already mentioned above with regard to the first connecting electrode ACNE1, the length by which the (2-2)-th connecting electrodes ACNE22 protrude in the first direction X from the second longitudinal side of the (2-1)-th connecting electrode ACNE21 may be designed in consideration of the shape of the gate insulating layer 115. For example, the length by which the (2-2)-th connecting electrodes ACNE22 protrude in the first direction X from second longitudinal side of the (2-1)-th connecting electrode ACNE21 may be designed such that the second longitudinal sides of the (2-2)-th connecting electrodes ACNE22 fall on the same line as, or protrude in the first direction X beyond, their respective longitudinal sides of the gate insulating layer 115.

In some embodiments, multiple (2-2)-th connecting electrodes ACNE22 may be provided. For example, each of the (2-2)-th connecting electrodes ACNE22 may overlap the (3-2)-th and (3-1-2)-th semiconductor parts ACT32 and ACT31*b* at the same time or with the (3-3)-th and (3-1-2)-th semiconductor parts ACT33 and ACT31*b* at the same time. One of the (2-2)-th connecting electrodes ACNE22 may be positioned at an upper part of the second longitudinal side of the (2-1)-th connecting electrode ACNE21 in the first direction X and may overlap the (3-2)-th and (3-1-2)-th semiconductor parts ACT32 and ACT31*b* at the same time, and other (2-2)-th connecting electrode ACNE22 may be positioned at a lower part of the second longitudinal side of the (2-1)-th connecting electrode ACNE21 in the first direction X and may overlap the (3-3)-th and (3-1-2)-th semiconductor parts ACT33 and ACT31*b* at the same time.

The part of the gate insulating layer 115 overlapping the second connecting electrode ACNE2 may generally be formed to protrude (or extend) outwardly beyond the sides of the (2-1)-th connecting electrode ACNE21. The relationship between the second connecting electrode ACNE2 and the gate insulating layer 115 is almost the same as the relationship between the first connecting electrode ACNE1 and the gate insulating layer 115, and thus, a detailed description thereof will be omitted.

The second longitudinal side of the gate insulating layer 115 overlapping the (2-1)-th connecting electrode ACNE21 in the first direction X may be aligned with the second longitudinal side of the (2-1)-th connecting electrode ACNE21 in the first direction X or may be recessed from the second longitudinal side of the (2-1)-th connecting electrode ACNE21 in the first direction X by a predetermined (or selectable) length in the first direction X to form a (3-1-3)-th semiconductor part ACT31*c* directly connected to the (3-2)-th and (3-3)-th semiconductor parts ACT32 and ACT33. The (3-1-3)-th semiconductor part ACT31*c* may be a conductive semiconductor part. As the (3-2)-th and (3-3)-th semiconductor parts ACT32 and ACT33, which are directly connected to the (3-1-3)-th semiconductor part ACT31*c*, include conductive semiconductor parts, signals received through the second connecting electrode ACNE2 may be transmitted from the (3-1-3)-th semiconductor part ACT31*c* to the (3-2)-th and (3-3)-th semiconductor parts ACT32 and ACT33 through the conductive semiconductor parts of the (3-2)-th and (3-3)-th semiconductor parts ACT32 and ACT33, or signals received through the (3-2)-th and (3-3)-th semiconductor parts ACT32 and ACT33 may be transmitted to the second connecting electrode ACNE2 through the (3-1-3)-th semiconductor part ACT31*c*.

As already mentioned above, the shapes of the semiconductor opening OP_ACT3, the (3-1-2)-th semiconductor part ACT31*b*, and the (3-1-3)-th semiconductor part ACT31*c* of the third semiconductor part ACT3 may be related to the shape of the second connecting electrode ACNE2. The (3-1-2)-th semiconductor part ACT31*b* may correspond to the overlapping area of the third semiconductor part ACT3 and the (2-1)-th and (2-2)-th connecting electrodes ACNE21 and ACNE22, and the (3-1-3)-th semiconductor part ACT31*c* may correspond to part of the third semiconductor part ACT3 protruding, by a predetermined (or selectable) length, from an outline formed by the outer profiles of the second sides, in the first direction X, of the (2-1)-th connecting electrode ACNE1 and the (2-2)-th second connecting electrodes ACNE22. The outer profile of a first side, in the first direction X, of the semiconductor opening OP_ACT3 may be formed to correspond to the outline formed by the outer profiles of the second sides, in the first direction X, of the (2-1)-th connecting electrode ACNE1 and the (2-2)-th second connecting electrodes ACNE22, particularly, to the entire third semiconductor part ACT3 except for the (3-1-1)-th, (3-1-2)-th and (3-1-3)-th semiconductor parts ACT31*a*, ACT31*b*, and ACT31*c*. As the first longitudinal side of the gate insulating layer 115 overlapping the second connecting electrode ACNE2 in the first direction X is aligned with, or recessed (in the first direction X) from the second longitudinal sides of the (2-2)-th connecting electrodes ACNE22 in the first direction X, an end portion of the (3-1-3)-th semiconductor part ACT21*c* on a first side, in the second direction Y may extend even to the (3-2)-th semiconductor part ACT32 and may thus be directly connected to the (3-2)-th semiconductor part ACT32, and an end portion of the (3-1-3)-th semiconductor part ACT31*c* on a second side, in the second direction Y may extend even to the (3-3)-th semiconductor part ACT33 and may thus be directly connected to the (3-3)-th semiconductor part ACT33. As a result, signals received through the second connecting electrode ACNE2 may be transmitted from the (3-1-3)-th semiconductor part ACT31*c* to the (3-2)-th and (3-3)-th semiconductor parts ACT32 and ACT33 through the conductive semiconductor parts of the (3-2)-th and (3-3)-th semiconductor parts ACT32 and ACT33, and signals received through the (3-2)-th and (3-3)-th semiconductor parts ACT32 and ACT33 may be transmitted even to the second connecting electrode ACNE2 through the (3-1-3)-th semiconductor part ACT31*c*.

The conductivities of the first, second, and third semiconductor parts ACT1, ACT2, and ACT3 may be determined by the fact whether the first, second, and third semiconductor parts ACT1, ACT2, and ACT3 overlap the second conductive layer and the gate insulating layer 115. For example, the conductivities of semiconductor parts not overlapping the second conductive layer and the gate insulating layer 115 may be higher than the conductivities of semiconductor parts overlapping the second conductive layer and the gate insulating layer 115.

Referring to FIGS. 17 and 19 through 22, the first semiconductor part ACT1 overlapping the gate electrode GE, the (2-1-2)-th semiconductor part ACT21*b*, a part of the (2-2)-th semiconductor part ACT22 (i.e., a part of the second side of the (2-2)-th semiconductor part ACT22 in the first and second directions X and Y), and a part of the (2-3)-th semiconductor part ACT23 (i.e., a part of the second side of the (2-3)-th semiconductor part ACT23 in the first direction X, and the first side in the second direction Y, of the (2-3)-th semiconductor part ACT23), which overlapping the first connecting electrode ACNE1, and the (3-1-2)-th semiconductor part ACT31*b*, a part of the (3-2)-th semiconductor part ACT32 (i.e., a part of the first side of the (3-2)-th semiconductor part ACT32 in the first direction X, and the second side, in the second direction Y, of the (3-2)-th semiconductor part ACT32), and a part of the (3-3)-th semiconductor part ACT33 (i.e., a part of the first side of the (3-3)-th semiconductor part ACT33 in the first and second directions X and Y), which overlapping the second connecting electrode ACNE2 may be semiconductor regions, and the (2-1-3)-th semiconductor part ACT21*c*, another part of the (2-2)-th semiconductor part ACT22, another part of the (2-3)-th semiconductor part ACT23, the (3-1-3)-th semiconductor part ACT31*c*, another part of the (3-2)-th semiconductor part ACT32, and another part of the (3-3)-th semiconductor part ACT33 may be conductive regions (or conductor regions). The conductivity of the conductor regions may be higher than the conductivity of the semiconductor regions.

Referring to FIGS. 24 and 25, latitudinal sides of the gate insulating layer 115 defining the insulating recesses RP_115 may be covered by the (1-2)-th connecting electrodes ACNE12 of the first connecting electrode ACNE1. For example, the (1-2)-th connecting electrodes ACNE12 may define the insulating recesses RP_115 and may protrude in the second direction Y beyond the latitudinal sides of the gate insulating layer 115 defining the insulating recesses RP_115.

Figure 26:
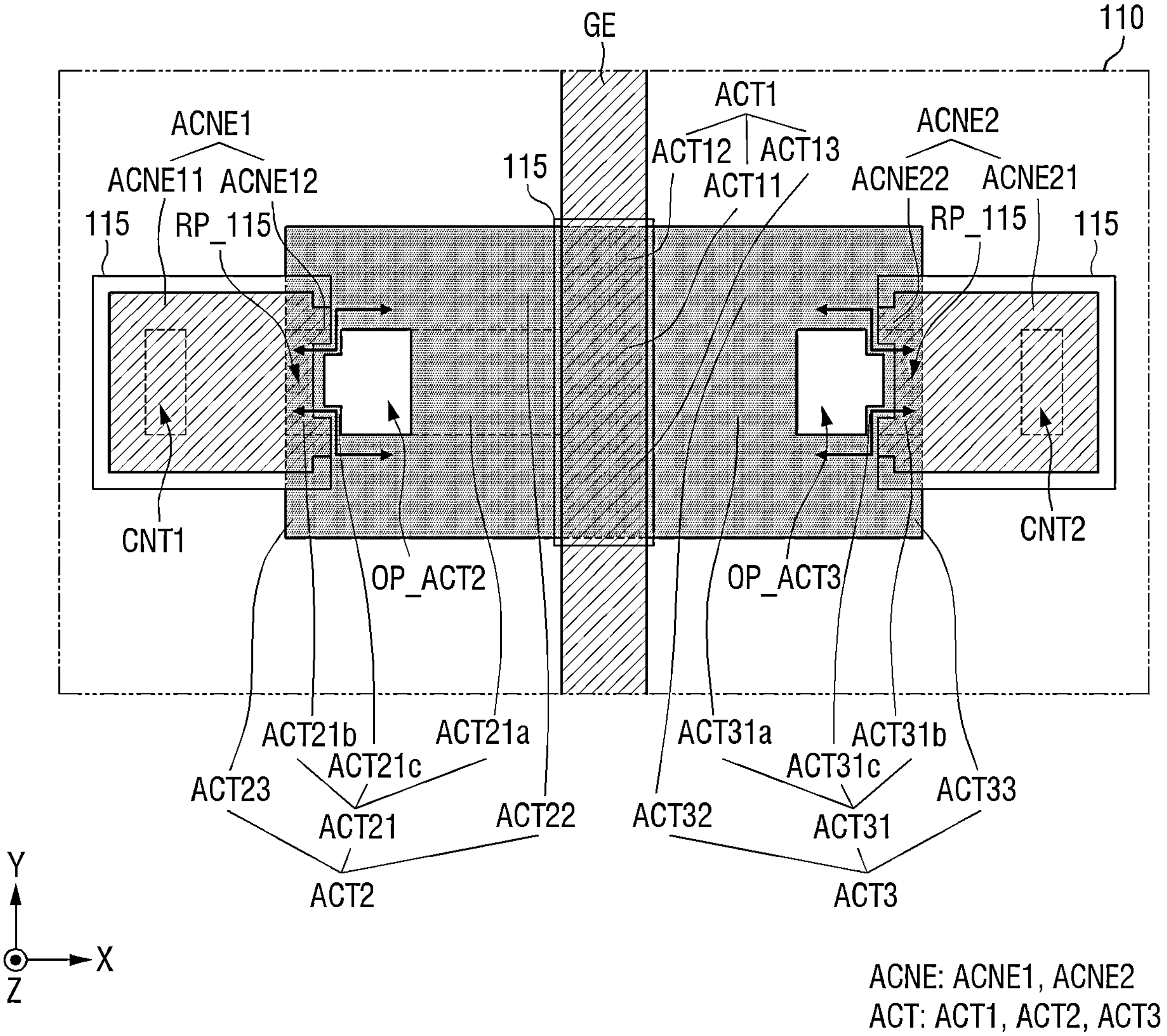
FIGS. 26 and 27 are a plan view and a schematic cross-sectional view illustrating how currents flow in a transistor of a pixel of the display device of FIG. 1.
Figure 27:
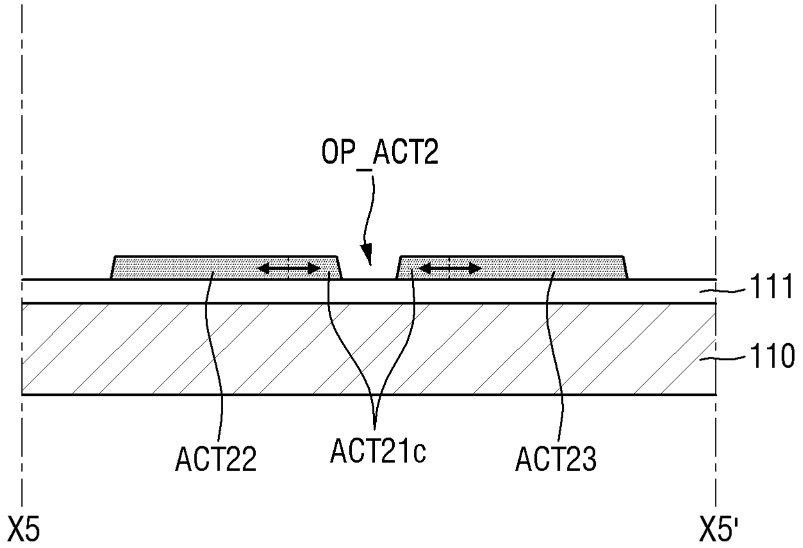

FIGS. 26 and 27 are a plan view and a schematic cross-sectional view illustrating how currents flow in a transistor of a pixel of the display device of FIG. 1.

Referring to FIGS. 26 and 27 and further to FIGS. 17 and 21 through 23, as the (2-1-3)-th semiconductor part ACT21*c* is a conductive semiconductor part (or a conductor region) and the (2-2)-th and (2-3)-th semiconductor parts ACT22 and ACT23, which are directly connected to the (2-1-3)-th semiconductor part ACT21*c*, include conductive semiconductor parts, signals received through the first connecting electrode ACNE1 may be transmitted to the (2-2)-th and (2-3)-th semiconductor parts ACT22 and ACT23 through the conductive semiconductor parts of the (2-2)-th and (2-3)-th semiconductor parts ACT22 and ACT23, or signals received through the (2-2)-th and (2-3)-th semiconductor parts ACT22 and ACT23 may be transmitted to the first connecting electrode ACNE1 through the (2-1-3)-th semiconductor part ACT21*c*.

As the (3-1-3)-th semiconductor part ACT31*c* is a conductive semiconductor part (or a conductor region) and the (3-2)-th and (3-3)-th semiconductor parts ACT32 and ACT33, which are directly connected to the (3-1-3)-th semiconductor part ACT31*c*, include conductive semiconductor parts, signals received through the second connecting electrode ACNE2 may be transmitted to the (3-2)-th and (3-3)-th semiconductor parts ACT32 and ACT33 through the conductive semiconductor parts of the (3-2)-th and (3-3)-th semiconductor parts ACT32 and ACT33, or signals received through the (3-2)-th and (3-3)-th semiconductor parts ACT32 and ACT33 may be transmitted to the second connecting electrode ACNE2 through the (3-1-3)-th semiconductor part ACT31*c*.

A method of manufacturing the display device 1 will hereinafter be described.

FIGS. 28, 30, 32, 34, 36, 43, and 53 are plan views illustrating a method of manufacturing a display device according to an embodiment of the disclosure. FIGS. 29, 31, 33, 35, 37 through 42, 44 through 52, and 54 through 56 are schematic cross-sectional views illustrating the method of manufacturing a display device according to an embodiment of the disclosure. The method of manufacturing a display device according to an embodiment of the disclosure will hereinafter be described with reference to FIGS. 28 through 56 and further to FIGS. 17 through 25. Descriptions of elements or features that have already been described above with reference to FIGS. 17 through 25 will be omitted.

Figure 28:
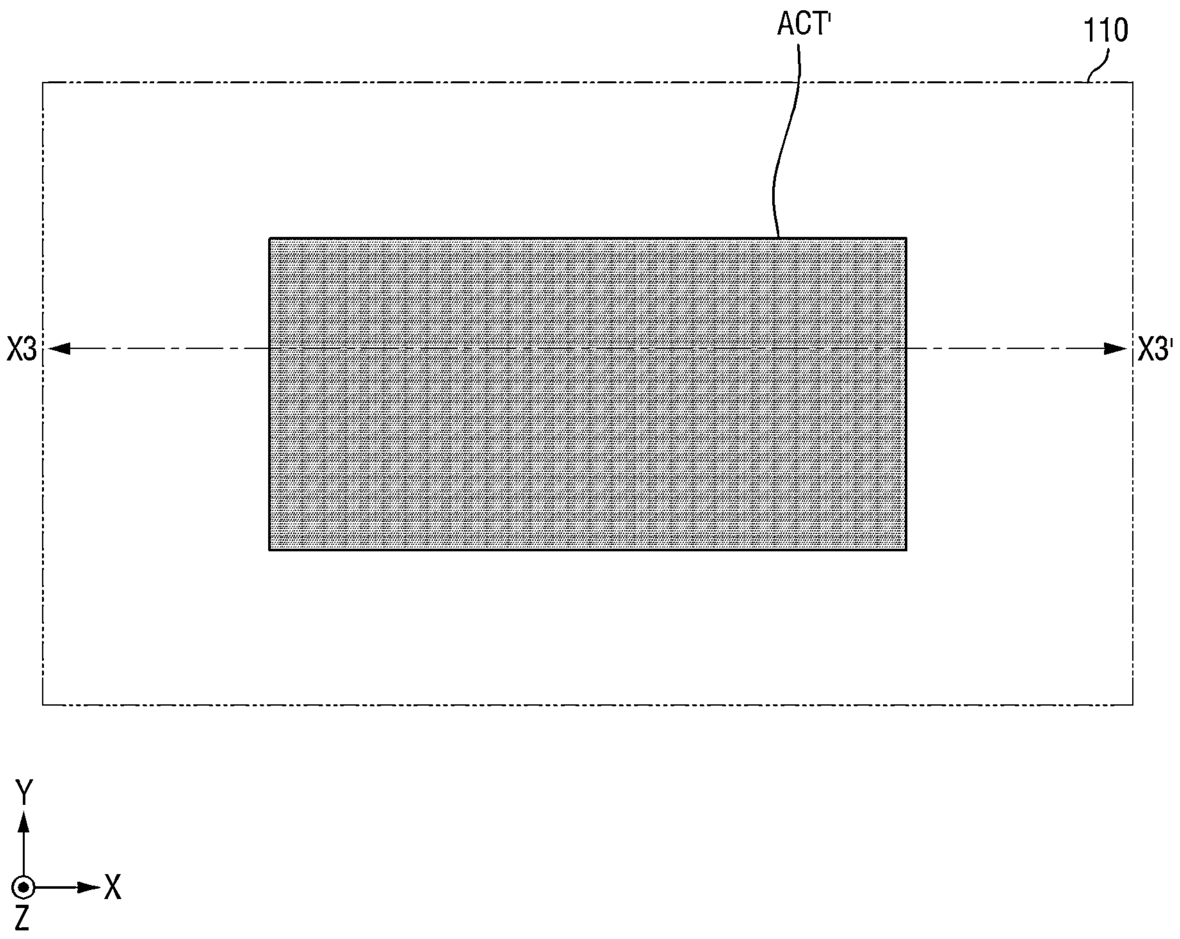
FIGS. 28, 30, 32, 34, 36, 43 and 53 are plan views illustrating a method of manufacturing a display device according to an embodiment of the disclosure.
Figure 29:
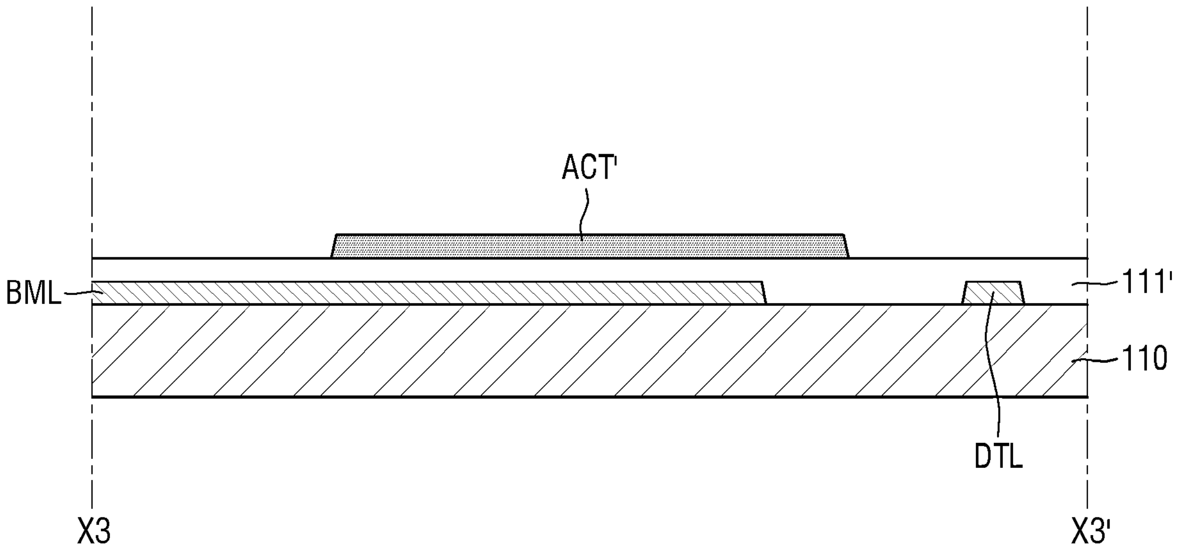
FIGS. 29, 31, 33, 35, 37 through 42, 44 through 52, and 54 through 56 are schematic cross-sectional views illustrating the method of manufacturing a display device according to an embodiment of the disclosure.

Referring to FIGS. 28 and 29, a first conductive layer including a lower light-blocking layer BML and a data line DTL may be formed on the first base part 110, a buffer layer 111' may be formed on the first conductive layer, and a semiconductor layer ACT' may be formed on the buffer layer 111'.

Figure 30:
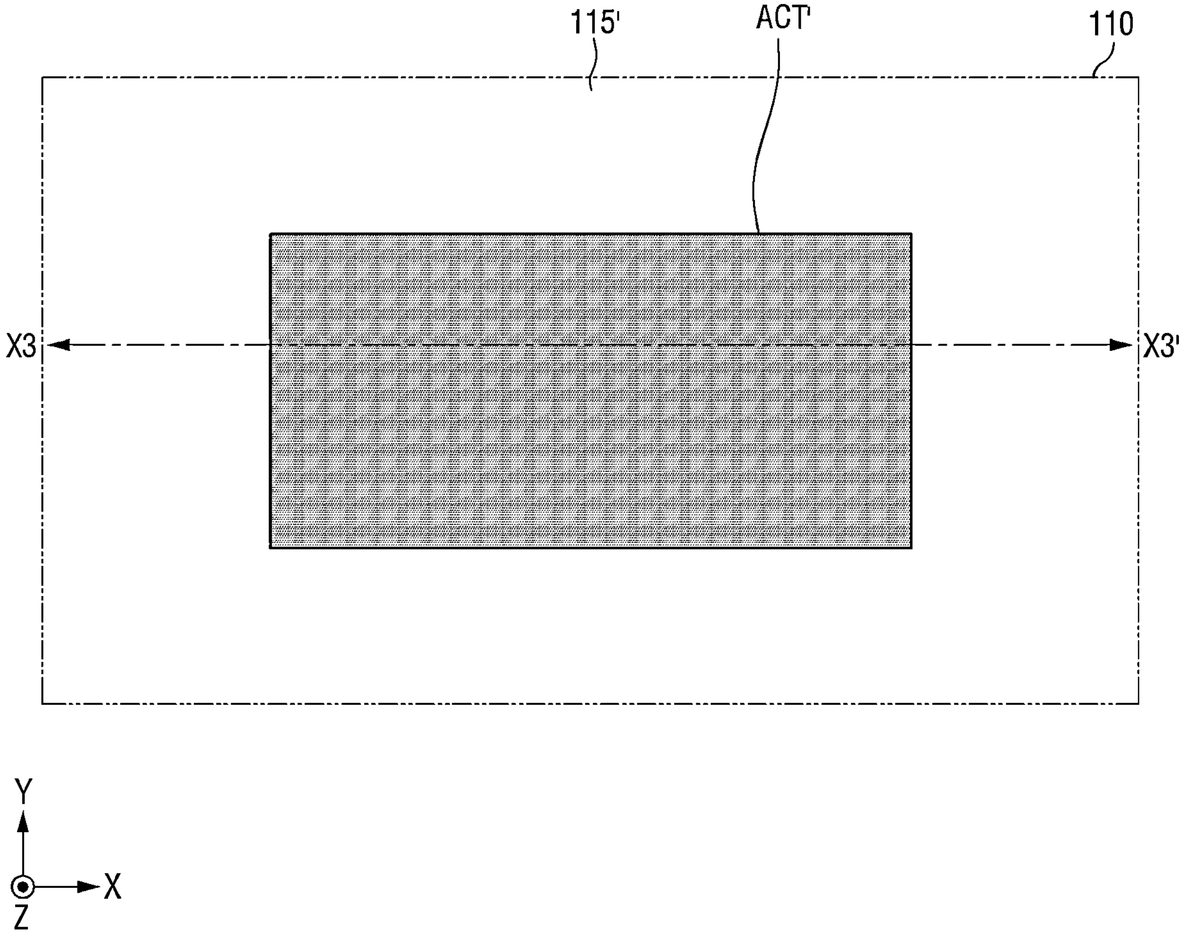
Figure 31:
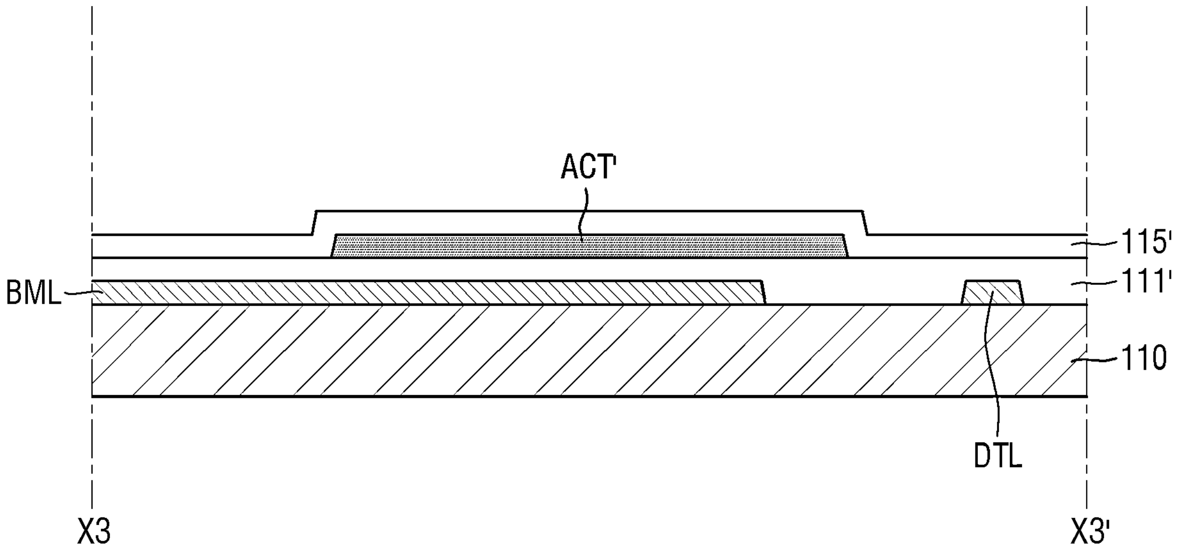

Referring to FIGS. 30 and 31, a gate insulating layer 115' may be formed on the entire surface of the semiconductor layer ACT'.

Figure 32:
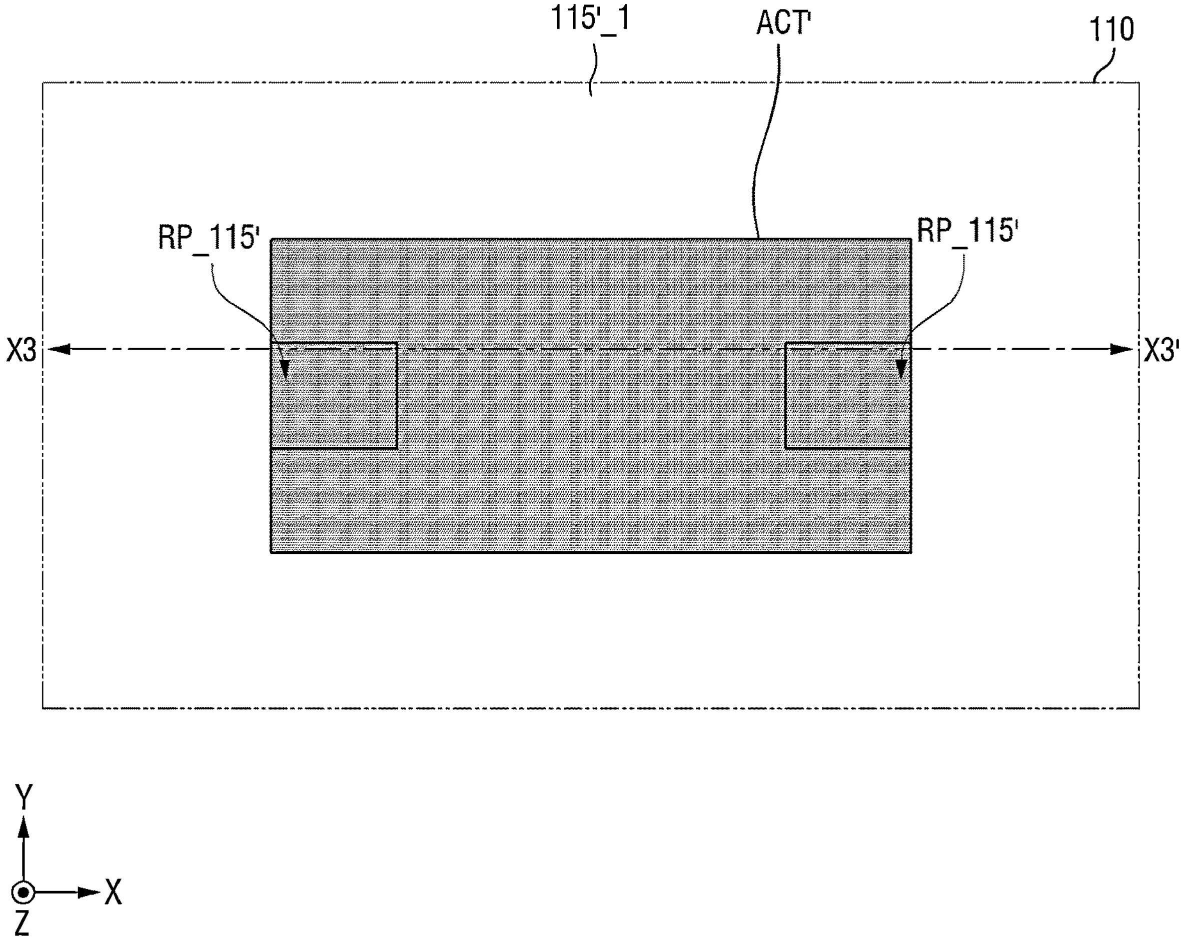
Figure 33:
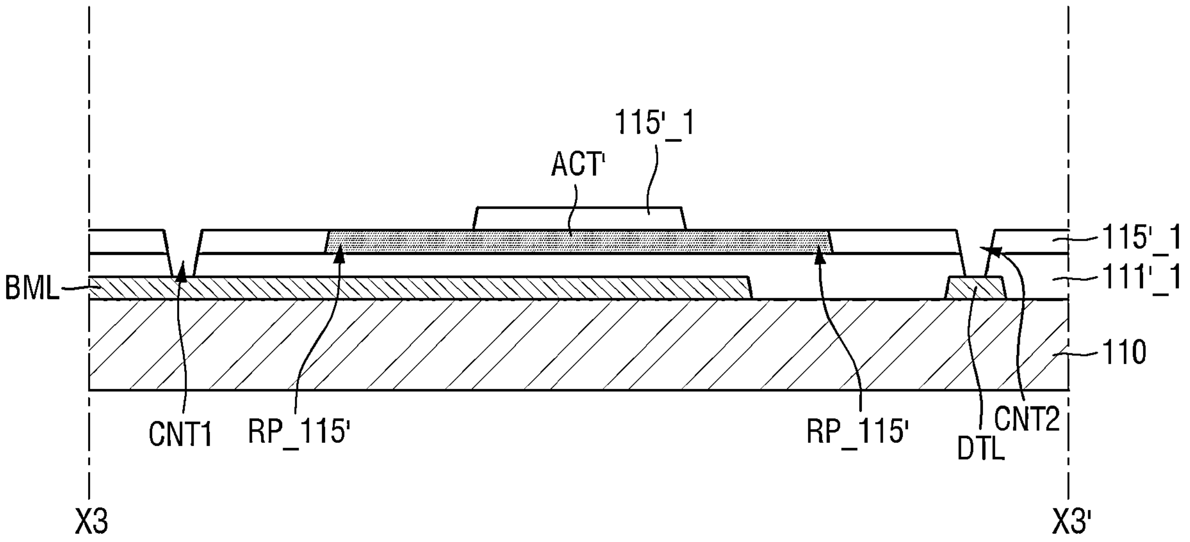

Referring to FIGS. 32 and 33, contact holes CNT1 and CNT2 and insulating recess RP_115' may be formed in the gate insulating layer 115'. The contact holes CNT1 and CNT2 may completely penetrate the gate insulating layer 115' and the buffer layer 111' in the thickness direction, and the insulating recess RP_115' may completely penetrate the gate insulating layer 115' in the thickness direction.

Figure 34:
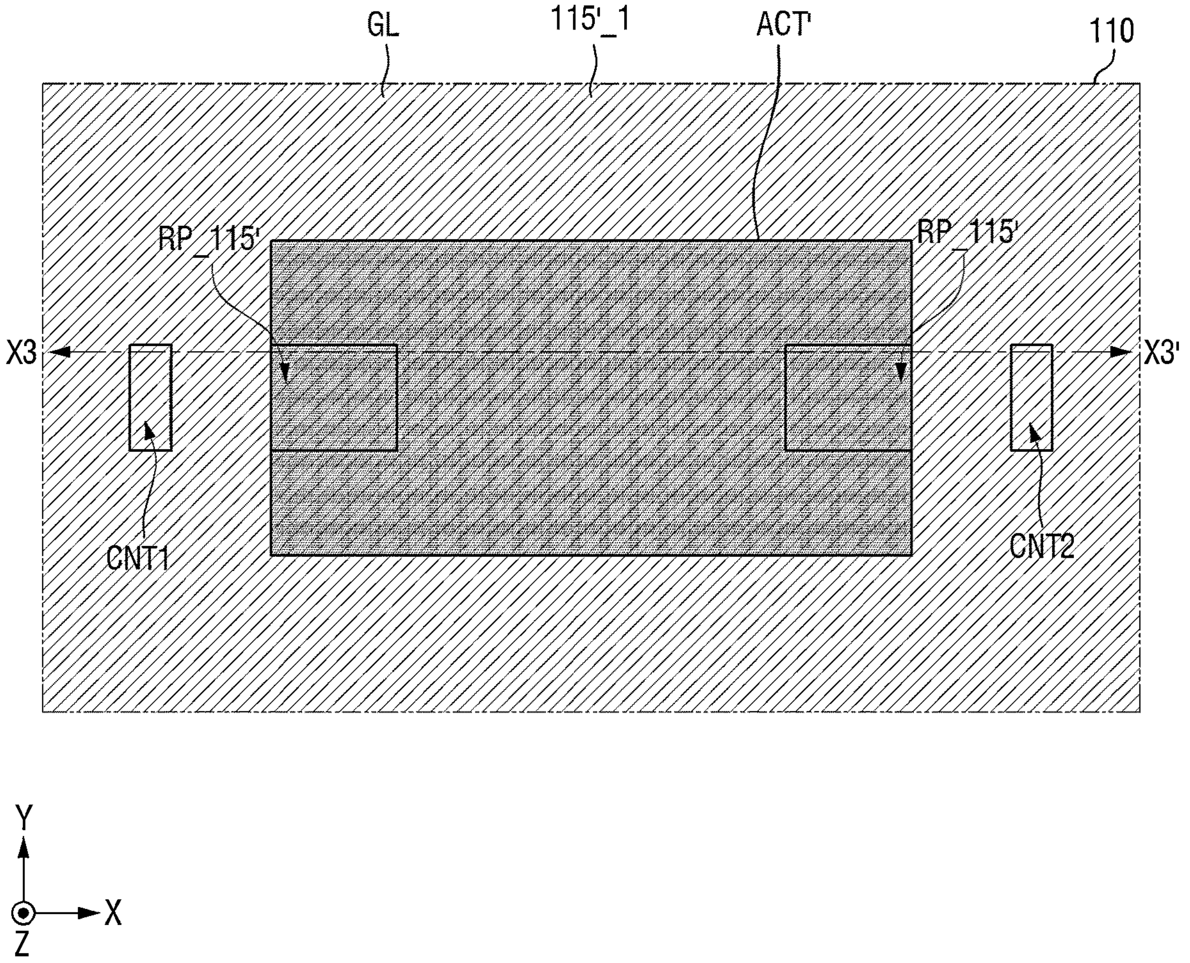
Figure 35:
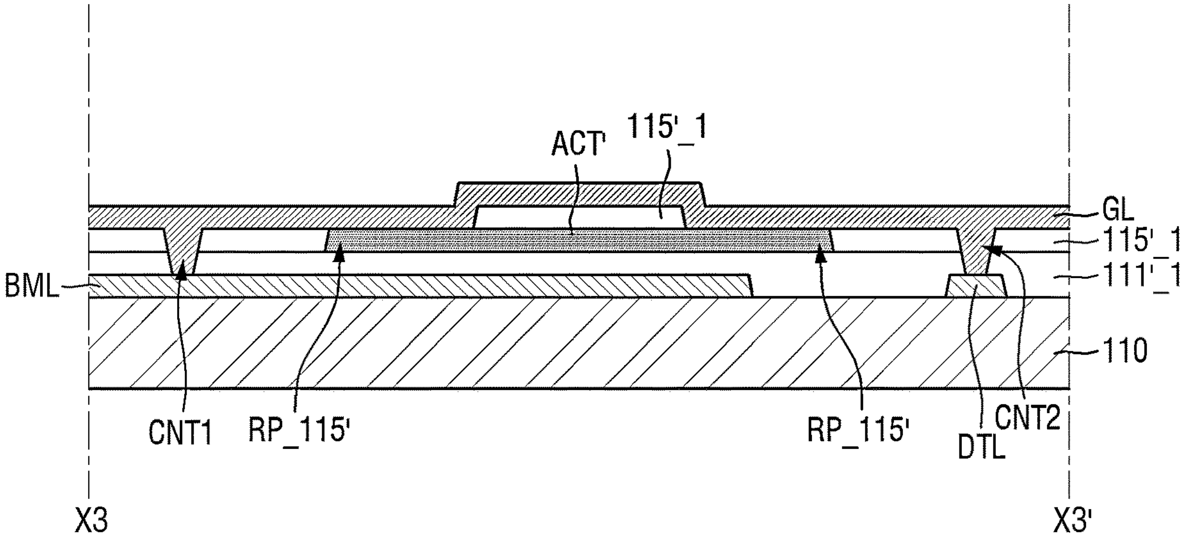
Figure 36:
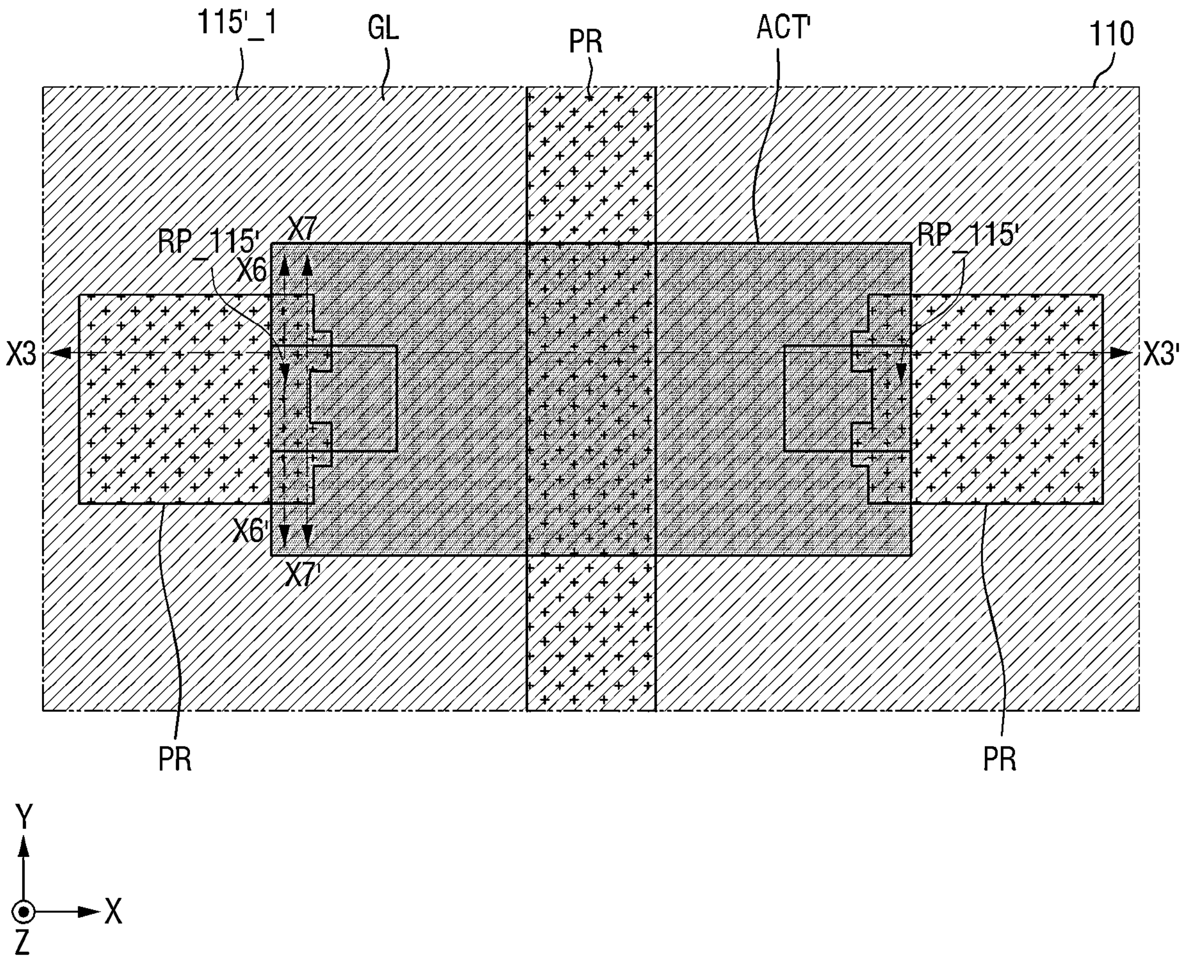
Figure 37:
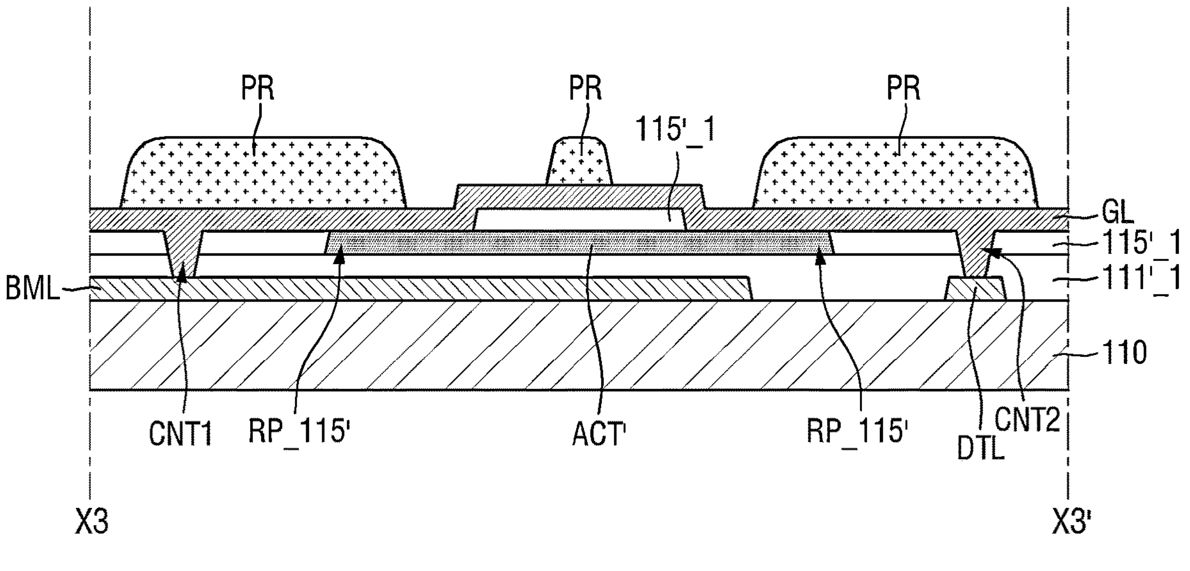
Figure 38:
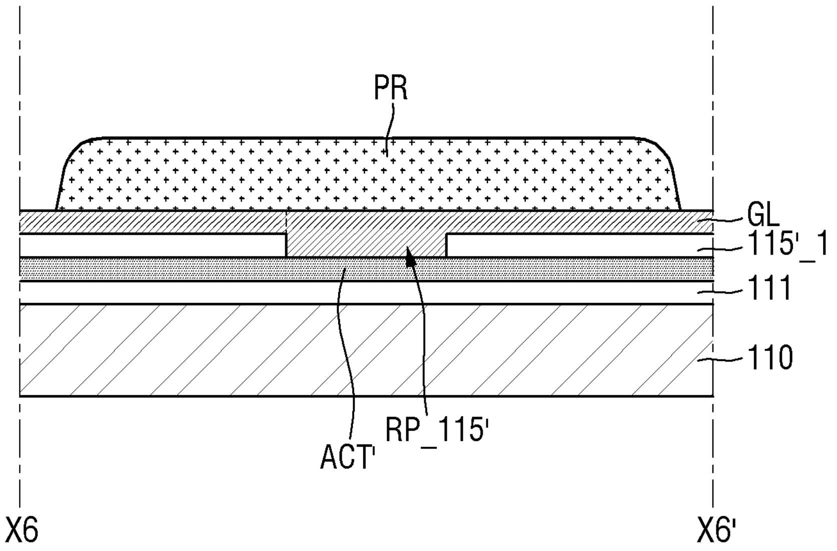
Figure 39:
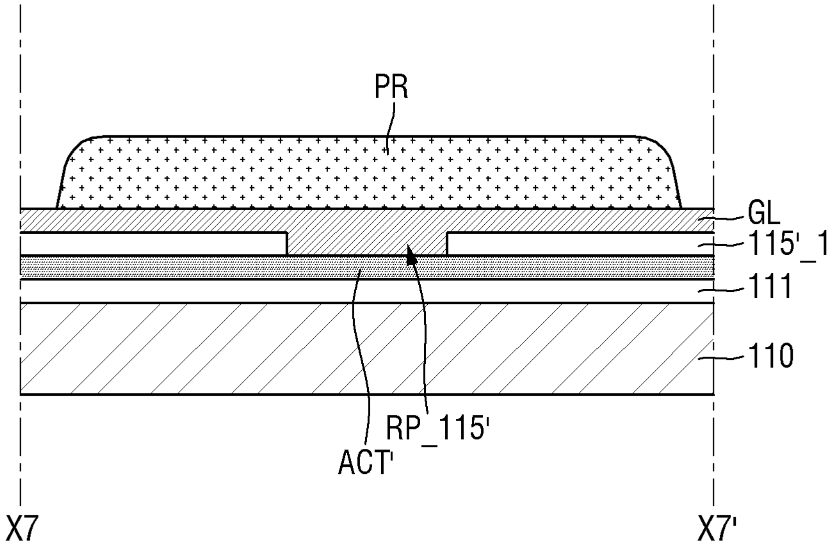

Referring to FIGS. 34 and 35, a second conductive layer GL may be deposited on the entire surfaces of the gate insulating layer 115' and the semiconductor layer ACT'.

Referring to FIGS. 36 through 39, a photoresist PR may be formed on the second conductive layer GL. First and second connecting electrodes ACNE1 and ACNE2 and a gate electrode GE of FIGS. 44 through 46 may be formed from the second conductive layer GL via the photoresist PR. For example, the photoresist PR may be disposed in regions corresponding to (or overlapping) the first and second connecting electrodes ACNE1 and ACNE2 and the gate electrode GE of FIGS. 37 and 38. In another embodiment different from what is illustrated in FIGS. 36 through 39, the photoresist PR may be disposed on a larger area (or size) than the first and second connecting electrodes ACNE1 and ACNE2 and the gate electrode GE of FIGS. 37 and 38. For example, the photoresist PR may extend outwardly beyond the sides of each of the first and second connecting electrodes ACNE1 and ACNE2 and beyond the sides of the gate electrode GE.

Figure 40:
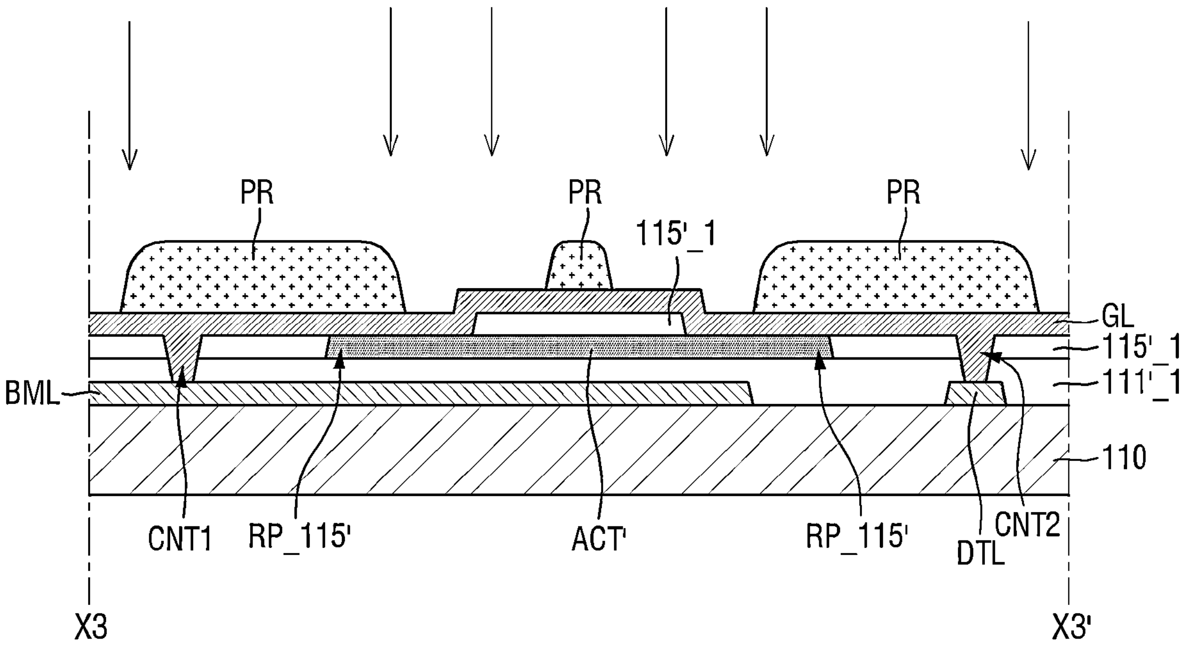
Figure 41:
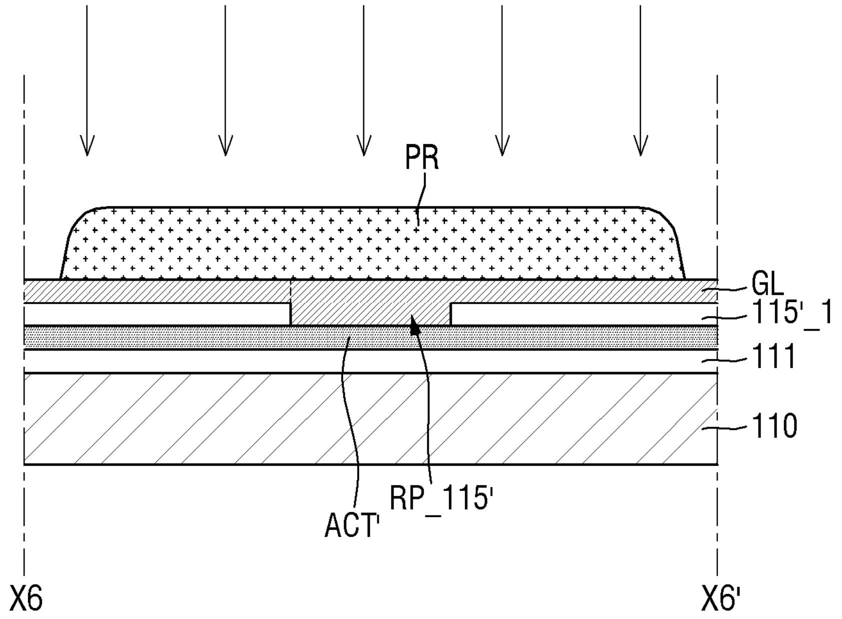
Figure 42:
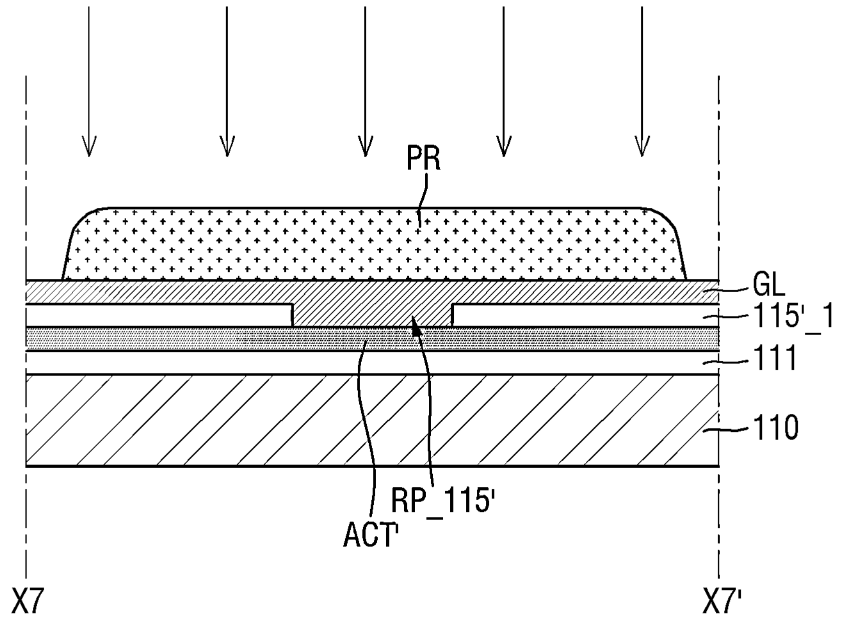
Figure 43:
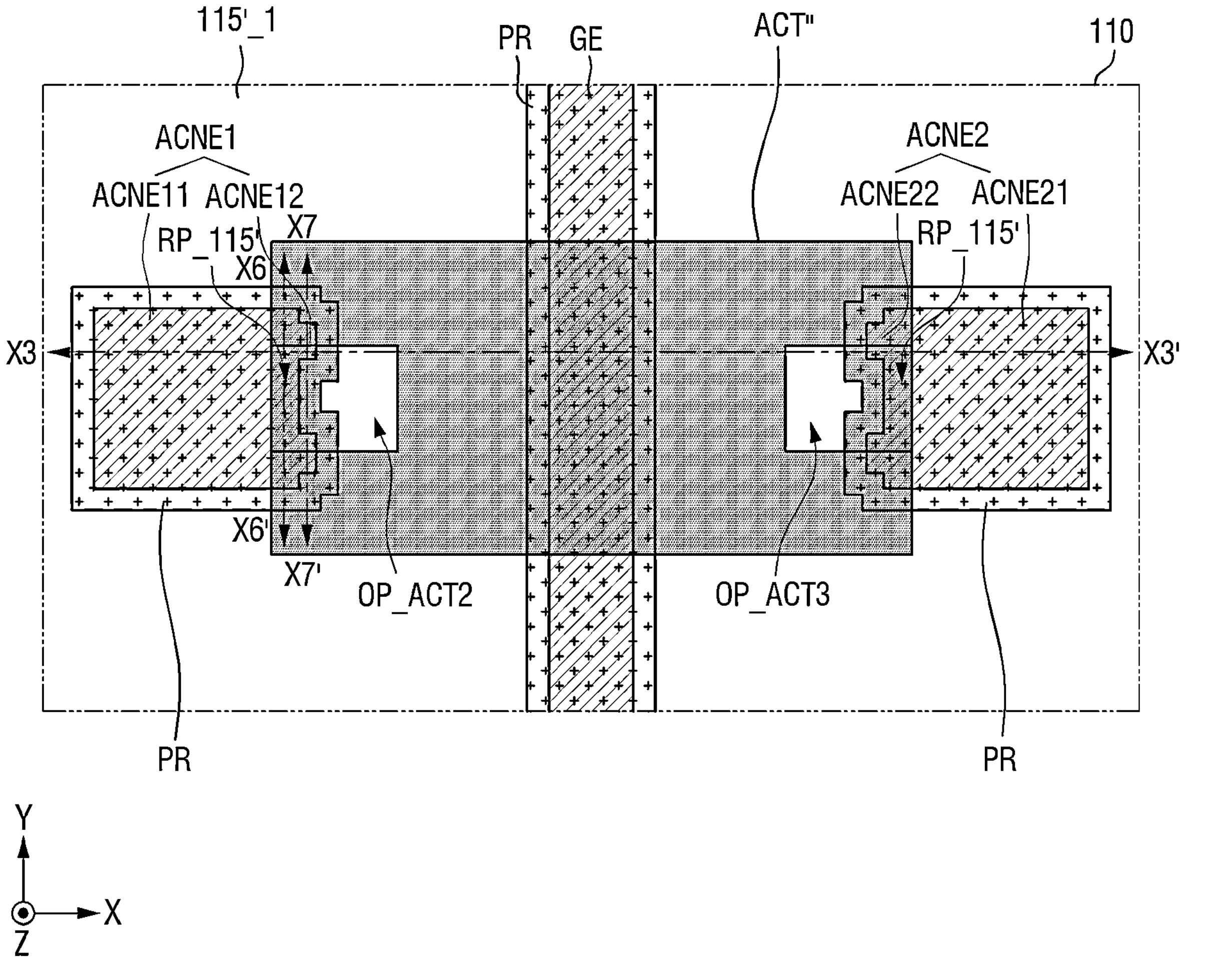
Figure 44:
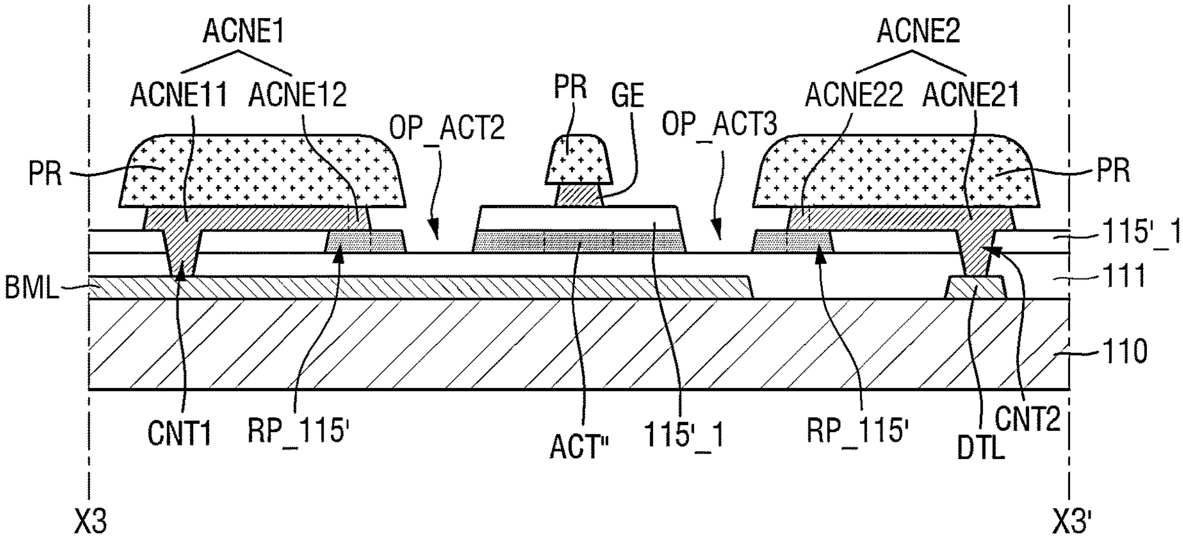
Figure 45:
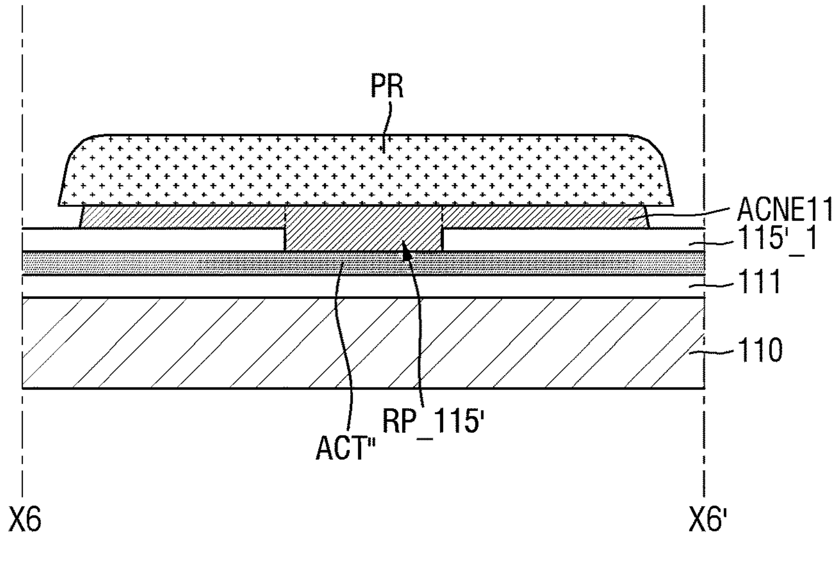
Figure 46:
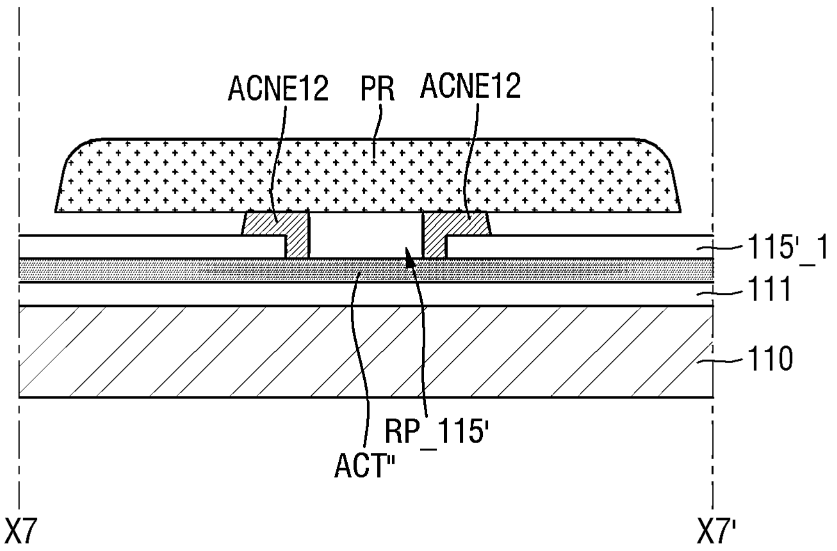

Referring to FIGS. 40 through 42, the second conductive layer GL may be etched using the photoresist PR on the second conductive layer GL. The second conductive layer GL may be etched by wet etching. For example, as illustrated in FIGS. 40 through 42, the second conductive layer GL may be etched using an etchant on the photoresist PR. As a result, the first and second connecting electrodes ACNE1 and ACNE2 and the gate electrode GE of FIGS. 43 through 46 may be formed.

Referring to FIGS. 43 through 46, during the etching of the second conductive layer GL, the semiconductor layer ACT' may also be etched so that semiconductor openings OP_ACT2 and OP_ACT3 may be formed.

Figure 47:
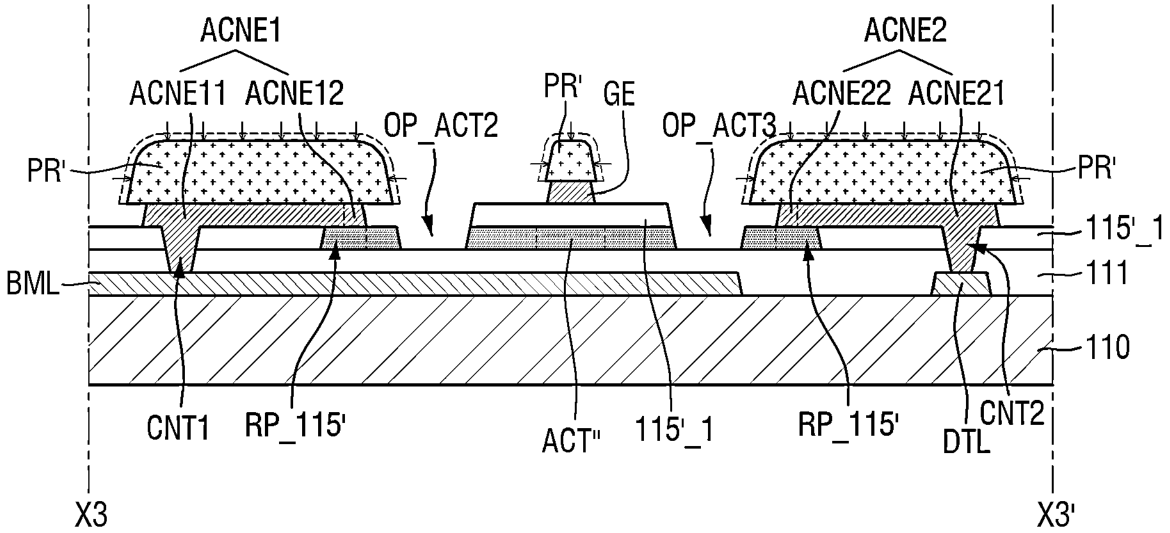
Figure 48:
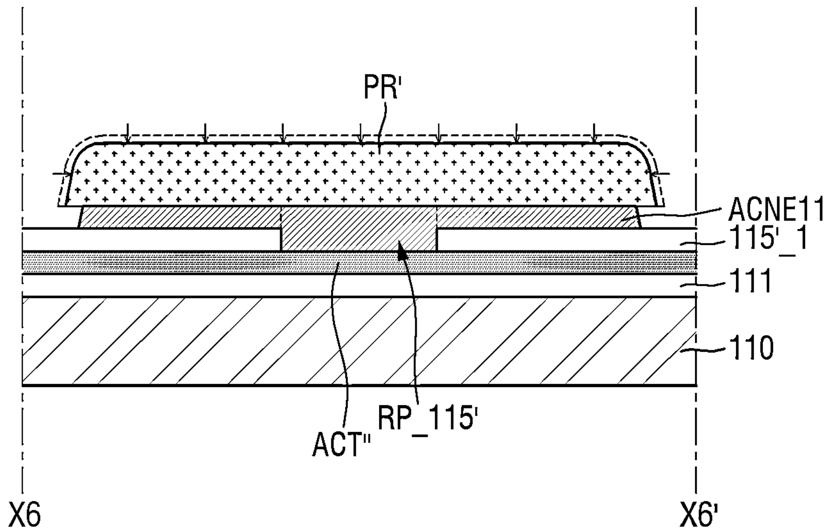
Figure 49:
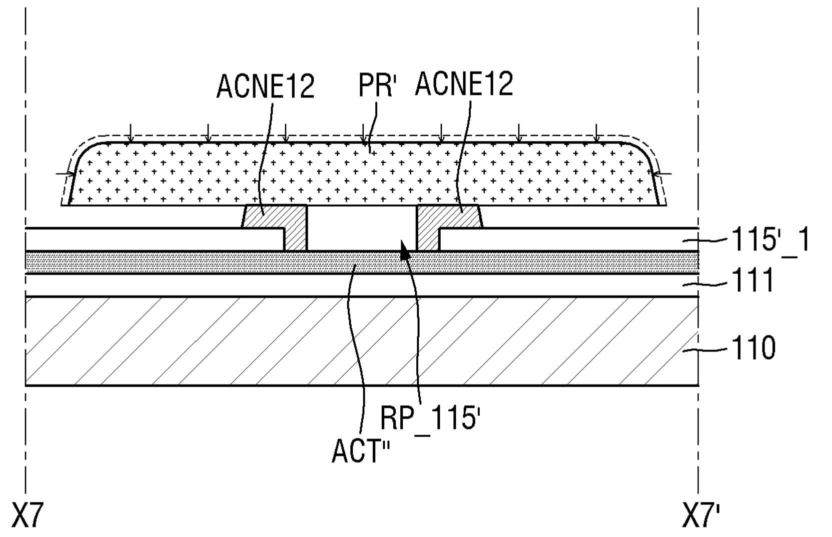

Referring to FIGS. 47 through 49, a photoresist PR' may be obtained by etching the photoresist PR. The photoresist PR may be partially etched by plasma etching, but the disclosure is not limited thereto. In an embodiment, the photoresist PR may be partially etched by isotropic plasma etching. As a result of the etching of the photoresist PR, a photoresist PR' having a reduced thickness and width from those of the photoresist PR may be obtained. For example, the ends of the photoresist PR' may be aligned with the ends of a gate insulating layer 115, which is obtained by etching the gate insulating layer 115'_1.

Figure 50:
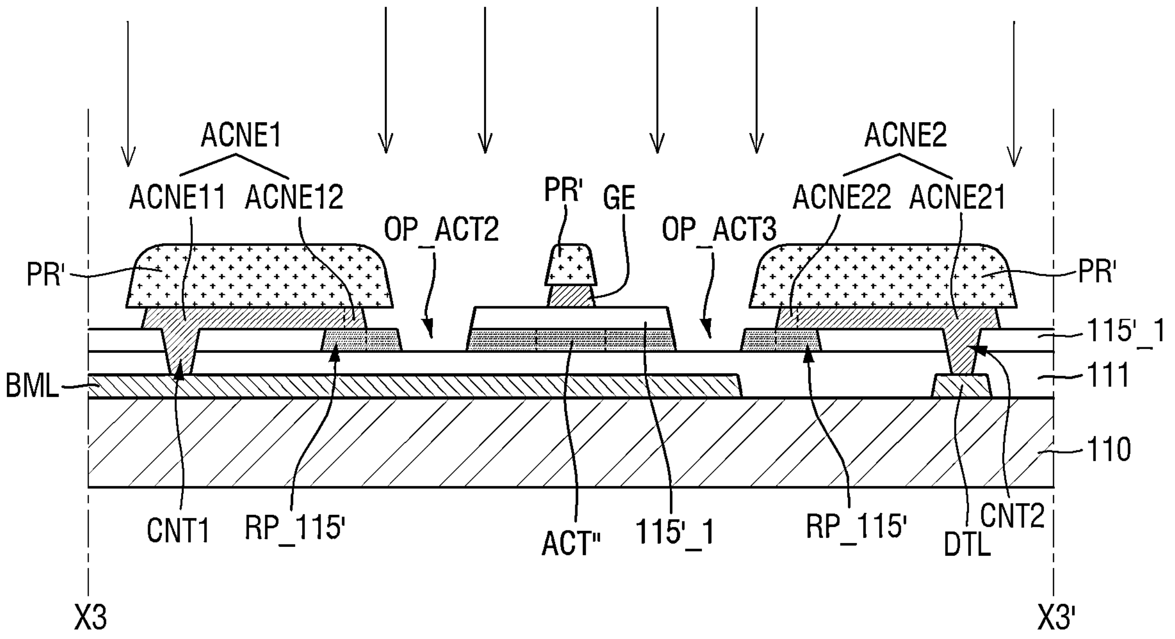
Figure 51:
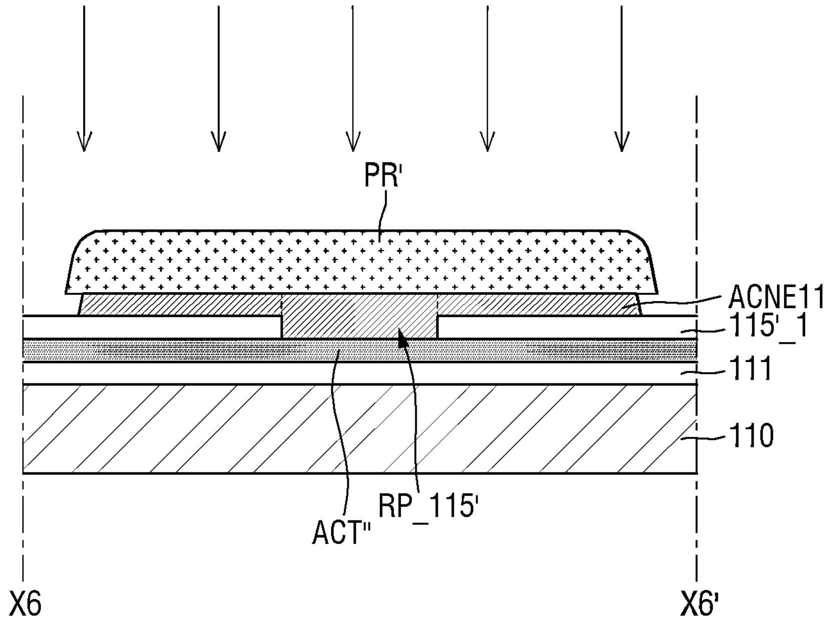
Figure 52:
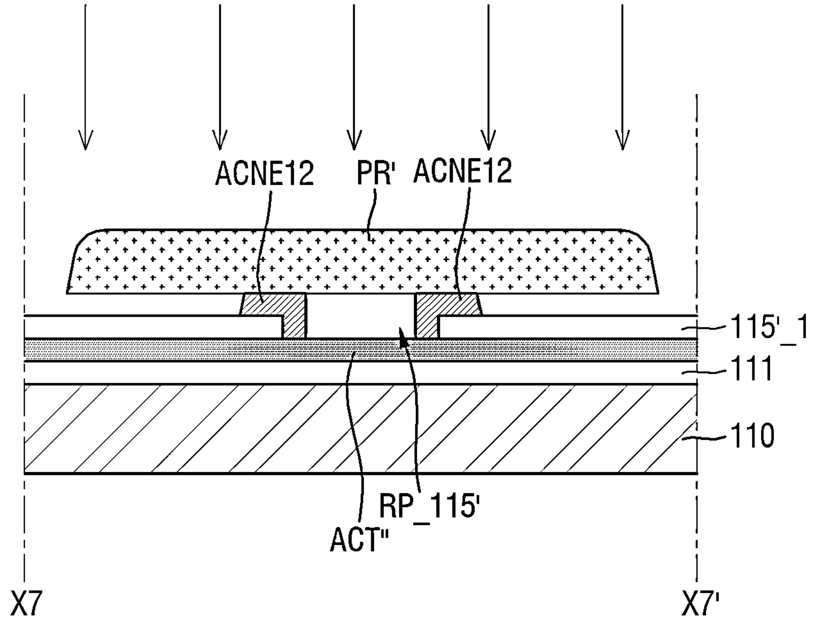
Figure 53:
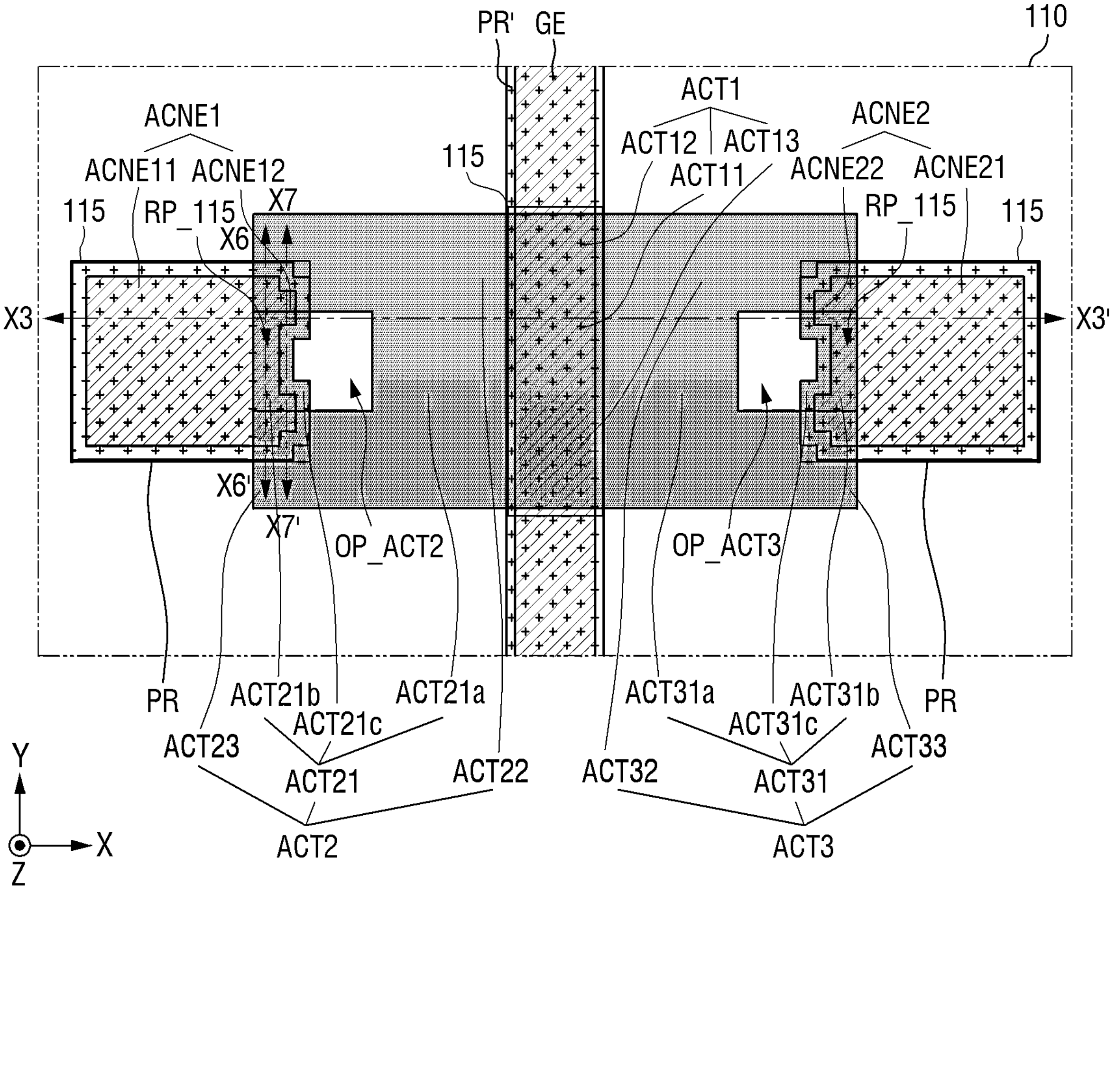
Figure 54:
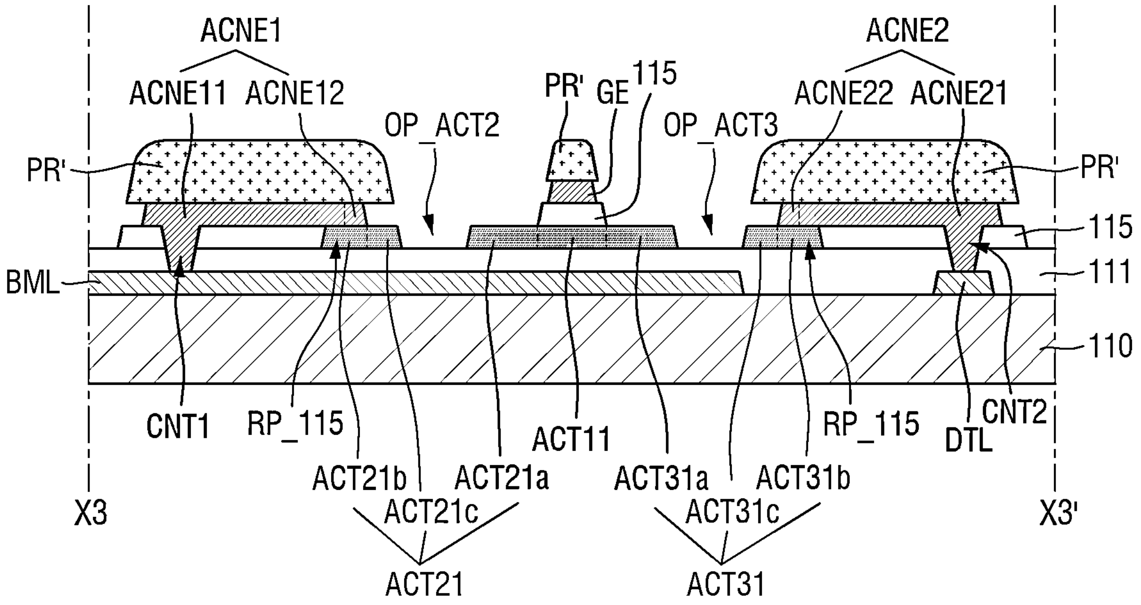
Figure 55:
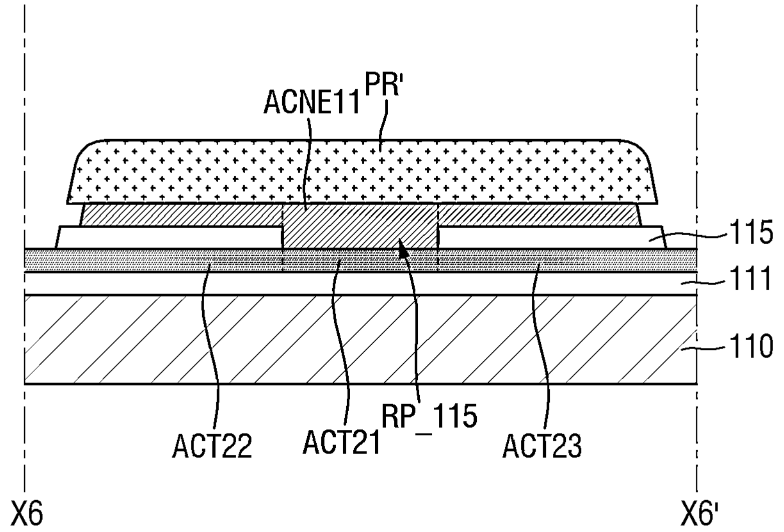
Figure 56:
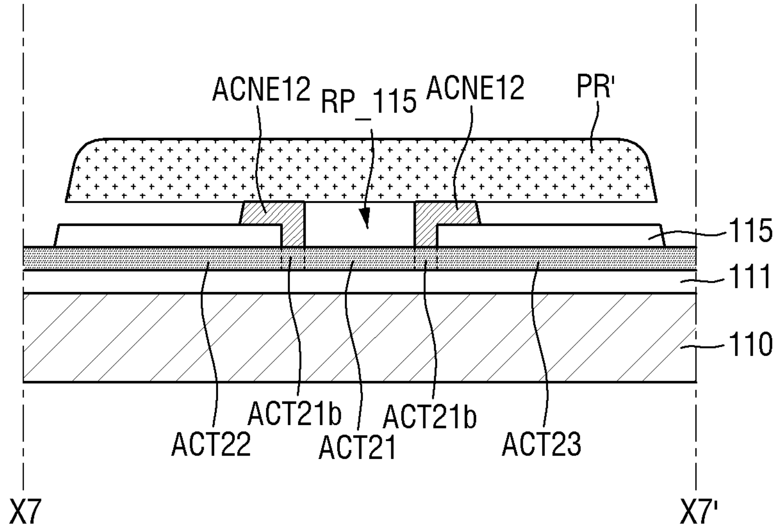

Referring to FIGS. 50 through 52, the gate insulating layer 115'_1 may be etched using the photoresist PR'. The gate insulating layer 115'_1 may be etched by dry etching, but the disclosure is not limited thereto. As a result of the etching of the gate insulating layer 115'_1, a gate insulating layer 115 of FIGS. 53 through 56 may be obtained. During the etching of the gate insulating layer 115'_1, the semiconductor layer ACT" may become conductive. For example, parts of the semiconductor layer ACT" of FIGS. 50 through 52, exposed by the gate insulating layer 115, the first and second connecting electrodes ACNE1 and ACNE2, and the gate electrode GE, may become conductive.

Display devices according to other embodiments of the disclosure will hereinafter be described.

Figure 57:
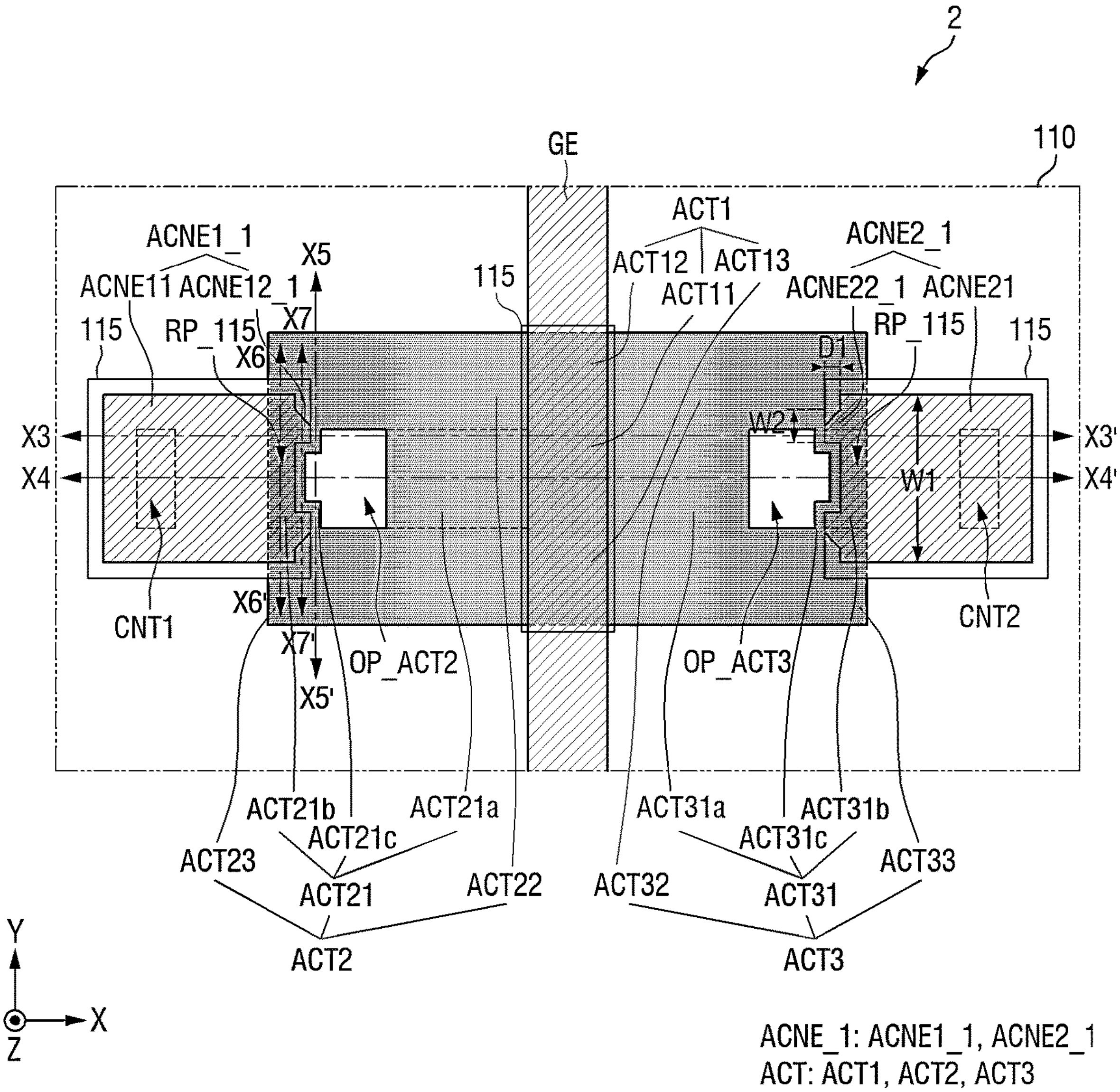
FIG. 57 is a plan view of a transistor of a pixel of a display device according to another embodiment of the disclosure.

FIG. 57 is a plan view of a transistor of a pixel of a display device according to another embodiment of the disclosure.

Referring to FIG. 57, connecting electrodes ACNE_1 of a display device 2 may have a different shape from the connecting electrodes ACNE of FIG. 17 in a plan view. For example, each of the connecting electrodes ACNE_1 may have longitudinal sides extending in a second direction Y, latitudinal sides extending in a first direction X, and sides extending in a different direction from the first or second direction X or Y to connect the longitudinal sides and the latitudinal sides. For example, the (1-2_1)-th and (2-2_1)-th connecting electrodes ACNE12_1 and ACNE 22_1 may have a trapezoidal shape in a plan view. A width W2, in the second direction Y, of the connecting electrodes ACNE_1 may vary along the first direction X, in a plan view. The width W2, in the second direction Y, of the connecting electrodes ACNE_1 may gradually decrease toward semiconductor openings OP_ACT2 and OP_ACT3. Other features or elements of the display device 2 may be same as described above with reference to FIGS. 17 through 23, and thus, detailed descriptions thereof will be omitted.

Figure 58:
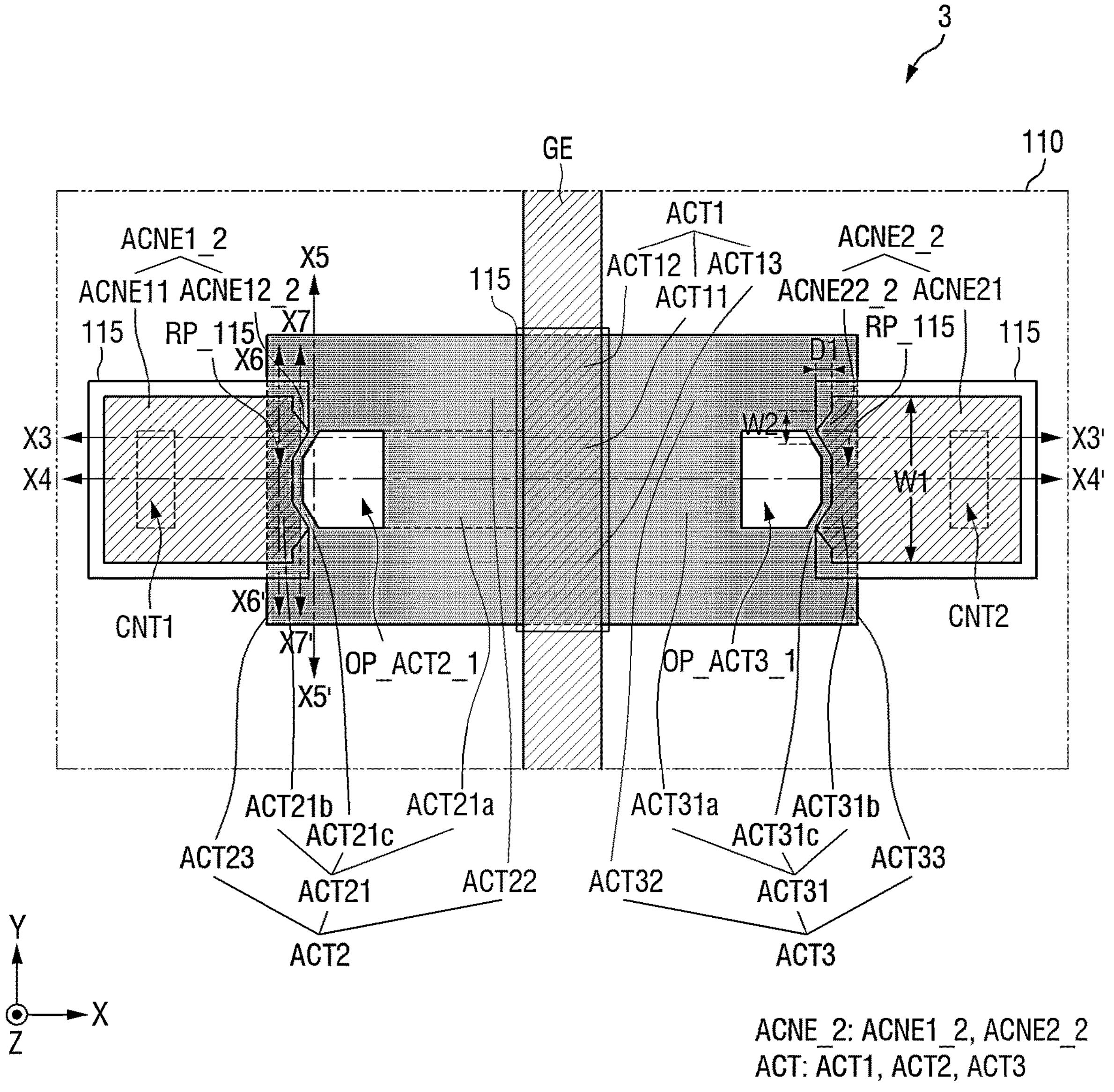
FIG. 58 is a plan view of a transistor of a pixel of a display device according to another embodiment of the disclosure.

FIG. 58 is a plan view of a transistor of a pixel of a display device according to another embodiment of the disclosure.

Referring to FIG. 58, connecting electrodes ACNE_2 of a display device 3 may have a different shape from the connecting electrodes ACNE of FIG. 17 in a plan view. For example, the (1-2_2)-th and (2-2_2) connecting electrodes ACNE12_2 and ACNE22_2 may have a triangular shape in a plan view. A width W2, in a second direction Y, of the connecting electrodes ACNE_2 may gradually decrease toward semiconductor openings OP_ACT2 and OP_ACT3, along a first direction X.

As already mentioned above, the shape of an insulating recess RP_115 overlapping a first connecting electrode ACNE1_2 and the shapes of a semiconductor opening OP_ACT2_1, a (2-1-2)-th semiconductor part ACT21*b*, and a (2-1-3)-th semiconductor part ACT21*c* of a second semiconductor part ACT2 may be related to the shape of the first connecting electrode ACNE1_2, and the shape of an insulating recess RP_115 overlapping a second connecting electrode ACNE2_2 and the shapes of a semiconductor opening OP_ACT3_1, a (3-1-2)-th semiconductor part ACT31*b*, and a (3-1-3)-th semiconductor part ACT31*c* of a third semiconductor part ACT3 may be related to the shape of the second connecting electrode ACNE2_2. For example, as the connecting electrodes ACNE_2 include a portion having a triangular shape in a plan view, the shapes of the semiconductor opening OP_ACT2_1, the (2-1-2)-th semiconductor part ACT21*b*, and the (2-1-3)-th semiconductor part ACT21*c* of the second semiconductor part ACT2 and the shapes of the semiconductor opening OP_ACT3_1, the (3-1-2)-th semiconductor part ACT31*b*, and the (3-1-3)-th semiconductor part ACT31*c* of the third semiconductor part ACT3 may be changed accordingly.

For example, in a plan view, the shape of the semiconductor opening OP_ACT2_1 of the second semiconductor part ACT2 may conform to the shape of the first connecting electrode ACNE1_2. For example, opposing sides of the first connecting electrode ACNE1_2 and the semiconductor opening OP_ACT2_1 of the semiconductor part ACT2 may be arranged in parallel to each other.

Also, in a plan view, the shape of the semiconductor opening OP_ACT2_1 of the second semiconductor part ACT2 may conform to the shape of an insulating recess RP_115 overlapping the first connecting electrode ACNE1_2. For example, opposing sides of the semiconductor opening OP_ACT2_1 of the semiconductor part ACT2 and the insulating recess RP_115 overlapping the first connecting electrode ACNE1_2 may be arranged in parallel to each other.

Other features or elements of the display device 3 may be same as described above with reference to FIGS. 17 through 23, and thus, detailed descriptions thereof will be omitted.

Figure 59:
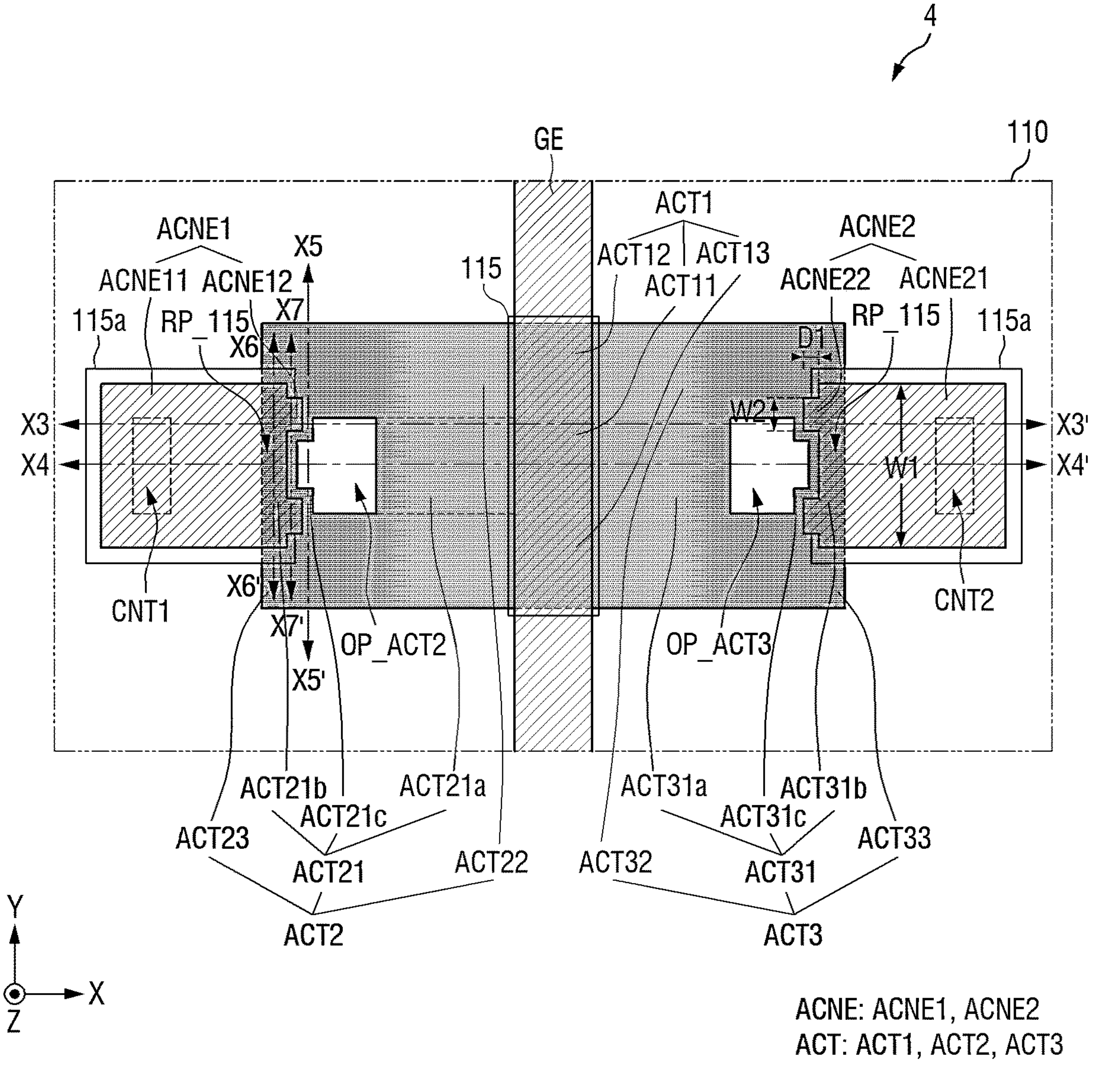
FIG. 59 is a plan view of a transistor of a pixel of a display device according to another embodiment of the disclosure.

FIG. 59 is a plan view of a transistor of a pixel of a display device according to another embodiment of the disclosure.

Referring to FIG. 59, a display device 4 may differ from the display device 1 of FIG. 17 in that a first side of a gate insulating layer 115*a* is positioned between first sides of (1-1)-th and (1-2)-th connecting electrodes ACNE11 and ACNE12.

Other features or elements of the display device 4 may be same as described above with reference to FIGS. 17 through 26, and thus, detailed descriptions thereof will be omitted.

Figure 60:
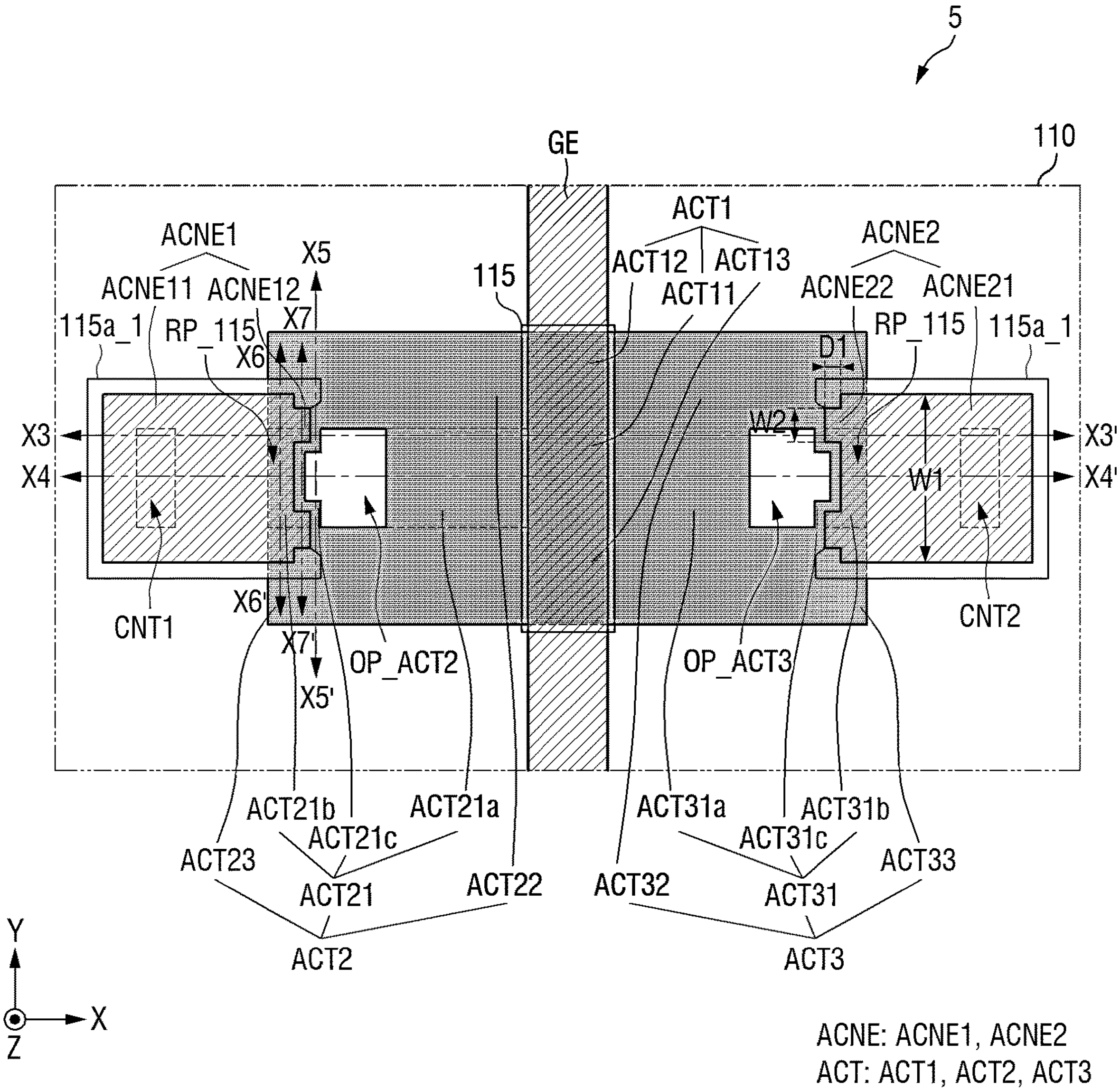
FIG. 60 is a plan view of a transistor of a pixel of a display device according to another embodiment of the disclosure.

FIG. 60 is a plan view of a transistor of a pixel of a display device according to another embodiment of the disclosure.

Referring to FIG. 60, a display device 5 may differ from the display device 1 of FIG. 17 in that first sides of a gate insulating layer 115*a* protrude toward a gate electrode GE, beyond a first side of (1-2)-th connecting electrode ACNE12, in a plan view.

For example, the first sides of the gate insulating layer 115*a* may protrude toward the gate electrode GE, beyond the a first side of the (1-2)-th connecting electrode ACNE12, in a plan view, and may extend to the first side of the (1-2)-th connecting electrode ACNE12 in a diagonal direction (e.g., a direction between first and second directions X and Y). The sides of the gate insulating layer 115*a* extend to the (1-2)-th connecting electrodes ACNE12 may overlap a point where a first side of the (1-2)-th connecting electrodes ACNE12 in the second direction Y (or a latitudinal side of the (1-2)-th connecting electrode ACNE12) and a first of the (1-2)-th connecting electrode ACNE12 in the first direction X (or a longitudinal side of the (1-2)-th connecting electrode ACNE12) meet. Also, the end portions of the gate insulating layer 115*a* adjacent to the (1-2)-th connecting electrodes 12 may be in contact with an end portion of the other (1-2)-th connecting electrodes ACNE12 on a second side, in the second direction Y, of the other (1-2)-th connecting electrode ACNE12 (or a latitudinal side of the other (1-2)-th connecting electrode ACNE12 on the second side, in the second direction Y, of the other (1-2)-th connecting electrode ACNE12) and an end portion of the other (1-2)-th connecting electrode ACNE12 on a first side, in the first direction X, of the other (1-2)-th connecting electrode ACNE12 (or a longitudinal side of the other (1-2)-th connecting electrode ACNE12 on the first side, in the first direction X, of the other (1-2)-th connecting electrode ACNE12).

Other features or elements of the display device 5 are almost as described above with reference to FIGS. 17 through 26, and thus, detailed descriptions thereof will be omitted.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:

a first conductive layer disposed on a base part and including a first wiring and a second wiring spaced apart from each other;

a semiconductor layer disposed on the first conductive layer and including:

a first semiconductor part;

a second semiconductor part disposed on a first side of the first semiconductor part in a first direction; and a third semiconductor part disposed on a second side of the first semiconductor part in the first direction;

a gate insulating layer disposed on the semiconductor layer; and a second conductive layer disposed on the gate insulating layer and including:

a gate electrode overlapping the first semiconductor part in a thickness direction of the base part;

a first connecting electrode overlapping the second semiconductor part in the thickness direction; and a second connecting electrode overlapping the third semiconductor part in the thickness direction, wherein the first connecting electrode is directly connected to the second semiconductor part, the second connecting electrode is directly connected to the third semiconductor part, the second semiconductor part includes a semiconductor opening extending through the second semiconductor part in the thickness direction, the third semiconductor part includes a semiconductor opening extending through the third semiconductor part in the thickness direction, the first connecting electrode includes a (1-1)-th connecting electrode and (1-2)-th connecting electrodes electrically connected to each other, a width of the (1-2)-th connecting electrodes in a second direction intersecting the first direction is less than a width of the (1-1)-th connecting electrode in the second direction, the (1-2)-th connecting electrodes protrude from a side of the (1-1)-th connecting electrode toward the semiconductor openings, wherein the (1-2)-th connecting electrodes include:

a first region contacting the gate insulating layer; and a second region contacting the semiconductor layer, and wherein the first region and the second region are integrally formed, and the first region and the second region are positioned side by side in the second direction.

2. The display device of claim 1, wherein the second semiconductor part includes a (2-1)-th semiconductor part, which extends in the first direction, and the (2-1)-th semiconductor part includes:

the semiconductor opening of the second semiconductor part;

a first-side semiconductor part disposed on a first side of the semiconductor opening of the second semiconductor part in the first direction; and a (2-1-1)-th semiconductor part disposed on a second side of the semiconductor opening of the second semiconductor part in the first direction.

3. The display device of claim 2, wherein the (2-1-1)-th semiconductor part is directly connected to the first semiconductor part.

4. The display device of claim 3, wherein the first-side semiconductor part includes:

a (2-1-2)-th semiconductor part, which overlaps the first connecting electrode in the thickness direction; and a (2-1-3)-th semiconductor part, which protrudes from the (2-1-2)-th semiconductor part toward the semiconductor opening of the second semiconductor part, beyond the first connecting electrode, in a plan view.

5. The display device of claim 4, wherein a conductivity of the (2-1-1)-th semiconductor part is greater than a conductivity of the first semiconductor part.

6. The display device of claim 5, wherein a conductivity of the (2-1-3)-th semiconductor part is greater than a conductivity of the (2-1-2)-th semiconductor part.

7. The display device of claim 4, wherein the second semiconductor part further includes:

a (2-2)-th semiconductor part disposed on a first side of the (2-1)-th semiconductor part in the second direction; and a (2-3)-th semiconductor part disposed on a second side of the (2-1)-th semiconductor part in the second direction, and each of the (2-2)-th and (2-3)-th semiconductor part is directly connected to the (2-1-3)-th semiconductor part.

8. The display device of claim 7, wherein a conductivity of each of the (2-2)-th and (2-3)-th semiconductor parts is greater than a conductivity of the (2-1-2)-th semiconductor part.

9. The display device of claim 8, wherein the (2-1-3)-th semiconductor part protrudes in a direction from the (1-2)-th connecting electrodes toward the semiconductor openings, in a plan view.

10. The display device of claim 9, wherein the gate insulating layer overlaps the gate electrode and the first connecting electrode in the thickness direction.

11. The display device of claim 10, wherein the gate insulating layer includes an insulating recess, which is recessed from a side of the gate insulating layer in the first direction in a plan view.

12. The display device of claim 11, wherein the side of the gate insulating layer overlapping the first connecting electrode is positioned between the side of the (1-1)-th connecting electrode and a side of each of the (1-2)-th connecting electrodes in a plan view.

13. The display device of claim 11, wherein sides of the gate insulating layer that extend in the first direction, defining the insulating recess, are covered by the (1-2)-th connecting electrodes.

14. The display device of claim 11, wherein the (1-2)-th connecting electrodes define the insulating recess and protrude, in the second direction, beyond the side of the gate insulating layer.

15. The display device of claim 11, wherein the side of the gate insulating layer is positioned between the side of the (1-1)-th connecting electrode and a side of each of the (1-2)-th connecting electrodes in a plan view.

16. The display device of claim 11, wherein the side of the gate insulating layer protrudes in a direction from sides of the (1-2)-th connecting electrodes toward the gate electrode in a plan view.

17. The display device of claim 8, wherein the (1-2)-th connecting electrodes overlap the (2-2)-th semiconductor part in the thickness direction.

18. The display device of claim 1, wherein the first connecting electrode is directly connected to the first wiring, and the second connecting electrode is directly connected to the second wiring.

19. The display device of claim 1, wherein the (1-2)-th connecting electrodes have a rectangular shape, a trapezoidal shape, or a triangular shape in a plan view.

20. The display device of claim 1, wherein the width of the (1-2)-th connecting electrodes in the second direction decreases toward the semiconductor openings, along the first direction.

21. A display device comprising:

a first conductive layer disposed on a base part and including a first wiring and a second wiring spaced apart from each other;

a semiconductor layer disposed on the first conductive layer and including a first semiconductor part and a second semiconductor part disposed on a first side of the first semiconductor part in a first direction;

a gate insulating layer disposed on the semiconductor layer; and a gate conductive layer disposed on the gate insulating layer and including a gate electrode overlapping the first semiconductor part in a thickness direction of the base part, and a first connecting electrode overlapping the second semiconductor part in the thickness direction, wherein the second semiconductor part includes a semiconductor opening, which extends through the second semiconductor part, the first connecting electrode is directly connected to the second semiconductor part, the first connecting electrode includes a (1-1)-th connecting electrode and a (1-2)-th connecting electrode electrically connected to each other, the (1-2)-th connecting electrode protrudes from a side of the (1-1)-th connecting electrode toward the semiconductor opening, wherein the (1-2)-th connecting electrode includes:

a first region contacting the gate insulating layer; and a second region contacting the semiconductor layer, and wherein the first region and the second region are integrally formed, and the first region and the second region are positioned side by side in the second direction.

22. The display device of claim 21, wherein a width of the (1-2)-th connecting electrode in a second direction intersecting the first direction is less than a width of the (1-1)-th connecting electrode in the second direction.

23. The display device of claim 21, wherein the gate insulating layer overlaps the gate electrode and the first connecting electrode in the thickness direction.

24. The display device of claim 23, wherein the gate insulating layer includes an insulating recess, which is recessed from a side of the gate insulating layer in the first direction in a plan view.

25. The display device of claim 24, wherein the side of the gate insulating layer is positioned between a side of the (1-2)-th connecting electrode and the side of the (1-1)-th connecting electrode in a plan view.

* * * * *